(12) United States Patent
Hiroki et al.

(10) Patent No.: US 6,355,963 B1
(45) Date of Patent: *Mar. 12, 2002

(54) MOS TYPE SEMICONDUCTOR DEVICE HAVING AN IMPURITY DIFFUSION LAYER

(75) Inventors: Akira Hiroki, Osaka; Shinji Odanaka, Hirakata, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/514,924

(22) Filed: Feb. 28, 2000

Related U.S. Application Data

(63) Continuation of application No. 08/836,903, filed as application No. PCT/JP95/02329 on Nov. 15, 1995.

(30) Foreign Application Priority Data

Nov. 16, 1994 (JP) .............................. 6-281956
Sep. 5, 1995 (JP) .............................. 7-227692

(51) Int. Cl.$^7$ ........................ H02L 29/94; H01L 31/113
(52) U.S. Cl. ........................ 257/404; 257/408; 257/345; 438/217
(58) Field of Search ................................ 257/404, 408, 257/345; 438/289, 291, 217

(56) References Cited

U.S. PATENT DOCUMENTS 4,233,616 A    11/1980   Kyomasu et al.

(List continued on next page.)

FOREIGN PATENT DOCUMENTS

| DE | 2460967 | 7/1976 | |
|---|---|---|---|
| EP | 0183204 | 6/1986 | |
| EP | 0186058 | 7/1986 | |
| EP | 0 637 846 A2 * | 2/1995 | ............ 29/6 |
| GB | 2277406 | 10/1994 | |
| JP | 59-82766 | 5/1984 | |
| JP | 62-155565 | 7/1987 | |
| JP | 62-195176 | 8/1987 | |
| JP | 2-30185 | 1/1990 | |
| JP | 4-127537 | 4/1992 | |
| JP | 4-144237 | 5/1992 | |
| JP | 4-186732 | 7/1992 | |
| JP | 5-90486 A | 4/1993 | |
| JP | 5-175493 | 7/1993 | |
| JP | 6-291309 | 10/1994 | |
| JP | 9-121002 A | 5/1997 | |

OTHER PUBLICATIONS

Matsuki et al. "Laterally–Doped Channel(LDC) Structure for Sub–Quarter Micron MOSFETs" pp. 113–114, 1991 Symposium on VLSI Technology.*

(List continued on next page.)

Primary Examiner—Steven Loke
Assistant Examiner—Douglas W. Owens
(74) Attorney, Agent, or Firm—Ratner & Prestia

(57) ABSTRACT

A semiconductor device of the invention is formed so that the impurity concentration of a semiconductor substrate (1) under a source diffusion layer (2) is lower than the impurity concentration on a source side of a p-type impurity diffusion layer (6). Therefore, in the semiconductor device of the invention, the junction capacitance of the p-n junction between the source and the substrate is smaller as compared with a conventional LDC structure. In general, the speed of a device is proportional to the product obtained by multiplying together a load capacitance and an inverse of a current value of the device. Accordingly, in the case of applying the present invention to a circuit such as a NAND type CMOS circuit in which a voltage is applied to a region between the source and the substrate, the speed of the device is not decreased. On the other hand, the power consumption of a device is proportional to the product obtained by multiplying together a load capacitance and the square of an applied voltage. Consequently, according to the present invention, a semiconductor device which can be operated at a low power consumption is realized.

6 Claims, 27 Drawing Sheets

U.S. PATENT DOCUMENTS

| | | | |
|---|---|---|---|
| 5,019,520 A | | 5/1991 | Komori et al. |
| 5,241,211 A | | 8/1993 | Tashiro ........................ 257/506 |
| 5,320,974 A | | 6/1994 | Hori et al. |
| 5,323,020 A | * | 6/1994 | Mohammad et al. .......... 257/19 |
| 5,371,394 A | | 12/1994 | Ma et al. ..................... 257/404 |
| 5,422,510 A | | 6/1995 | Scharf et al. ................ 257/404 |
| 5,451,807 A | | 9/1995 | Fujita ........................... 257/404 |
| 5,605,855 A | * | 2/1997 | Chang et al. .................. 437/45 |
| 5,753,958 A | | 5/1998 | Burr et al. ................... 257/404 |
| 5,767,930 A | | 6/1998 | Kobayashi et al. .......... 257/408 |
| 5,780,912 A | | 7/1998 | Burr et al. ................... 257/408 |
| 5,793,088 A | | 8/1998 | Choi et al. ................... 257/408 |
| 6,031,272 A | * | 2/2000 | Hiroki et al. ................ 257/404 |

OTHER PUBLICATIONS

T. Matsuki et al., "Laterally–Doped Channel (LDC) Structure for Sub–Quarter Micron MOSFET", Symposium on VLSI Technology, pp. 113–114, 1991.

G. A. Sai–Halasz et al., "Design and Experimental Technology for 0.1–$\mu$m Gate–Length Low–Temperature Operation FET"s", IEEE Electron Device Letters, vol. EDL–8, No. 10, pp. 463–466, 1987.

Y. Mii et al., "High Performance 0.1 $\mu$m nMOSFET's with 10 ps/stage Delay (85 K) at 1.5 V Power Supply", 1993 Symposium on VLSI Technology—Digest of Technical Papers. pp. 91–92, May 17–19, 1993.

* cited by examiner

MOS TYPE SEMICONDUCTOR DEVICE HAVING AN IMPURITY DIFFUSION LAYER

TITLE OF INVENTION

This application is a continuation of U.S. patent application No. 08/836,903 filed on Jul. 16, 1997 which is a U.S. National Phase Application of PCT International Application PCT/JP95/02329 filed in Nov. 15, 1995.

TECHNICAL FIELD

The present invention relates to a highly reliable high-speed semiconductor integrated circuit which can be operated with low power consumption for realizing a fine metal-oxide-semiconductor (MOS) type semiconductor device.

BACKGROUND ART

In order to realize a very large-scale integrated circuit (VLSI) having even higher integration, the size of a MOS type semiconductor device usable for such a VLSI has been reduced more and more in recent years. As a result, currently available devices are formed with a minimum size in a half-micron region or in a sub-half micron region. However, if a device having such a fine size is formed, the electric characteristics of such a device are likely to be degraded because of a short-channel effect or a hot-carrier effect, thereby seriously influencing the reliability of the device.

On the other hand, in order to develop VLSI technologies satisfactorily applicable in the expanding multi-media society, a semiconductor device must realize not only high-speed operation but also low power consumption.

In order to improve the resistance of a device to the degradation caused by a hot-carrier effect or a short-channel effect and to improve the drivability thereof, a MOS type semiconductor device having an asymmetric impurity profile in the channel has been suggested. Such a MOS semiconductor device is described, for example, by T. Matsui et al. in 1991 Symposium on VLSI Technology, pp. 113–114, in which a laterally-doped channel (LDC) structure is disclosed.

FIG. 14 is a cross-sectional view showing a MOS type semiconductor device having an LCD structure.

The semiconductor device includes: an n-type high-concentration source diffusion layer 2 and an n-type high-concentration drain diffusion layer 3 which are formed in a semiconductor substrate 1; a gate oxide film 4 formed on the semiconductor substrate 1; a gate electrode 5 formed on the gate oxide film 4; and a p-type high-concentration diffusion layer 6 provided in a channel region between the source diffusion layer 2 and the drain diffusion layer 3 and under the source diffusion layer 2 in the semiconductor substrate 1. The p-type diffusion layer 6 is characterized in that the impurity concentration thereof monotonically decreases from the source side to the-drain side. In this structure, by setting the impurity concentration on the source side of the p-type diffusion layer 6 to be high, it is possible to improve the resistance of the device to the short-channel effect. In addition, by setting the impurity concentration on the drain side of the p-type diffusion layer 6 to be low, it is possible to reduce a high electric field generated in the vicinity of the drain, thereby suppressing the generation of hot carriers. Therefore, a conventional lightly-doped drain (LDD) structure is not required for this semiconductor device, thereby realizing high drivability.

However, this structure is not suitable for a MOS type semiconductor device to be formed in a region having a size on the order of a quarter micron or less. This is because, the MOS type semiconductor device having the LDC structure shown in FIG. 14 has the following problems.

(1) A p-type high-concentration diffusion layer is provided under a source diffusion layer and the impurity concentration in the p-type diffusion layer is as high as $1 \times 10^{18}$ cm$^{-3}$ or more in order to suppress the short-channel effect. As a result, the parasitic capacitance of the p-n junction between the source and the substrate is adversely increased as compared with a conventional structure. In general, the speed of a MOS type semiconductor device is proportional to the product obtained by multiplying together an inverse of a saturated current value and a load capacitance. Therefore, if such a semiconductor device having a large parasitic capacitance in the p-n junction between the source and the substrate, as in the case of a semiconductor device having a LDC structure, is applied to a circuit such as a NAND type CMOS circuit in which a voltage is applied to a region between the source and the substrate, the speed of the device is adversely decreased. On the other hand, the power consumed by a MOS type semiconductor device is proportional to the product obtained by multiplying together the load capacitance and the square of the applied voltage. Therefore, the power consumption of the circuit is adversely increased.

(2) The p-type diffusion layer for controlling the threshold voltage and suppressing the short-channel effect reaches the surface of the substrate and the impurity concentration on the source side of the channel region is as high as $1 \times 10^{18}$ cm$^{-3}$ in the vicinity of the surface of the substrate. As a result, the mobility of the carriers is considerably decreased on the source side because of the scattering of the impurity. Since the current value of a MOS type semiconductor device is determined by the behavior of the carriers on the source side, the saturated current value is decreased.

(3) When a device having a size on the order of a quarter micron or less is formed, the threshold voltage is decreased and the device becomes seriously affected by the short-channel effect. The short-channel effect depends upon an effective channel length and a junction depth between the source diffusion layer and the drain diffusion layer. Since a LDC structure has a deep junction depth between the source diffusion layer and the drain diffusion layer, the decrease in the threshold voltage cannot be suppressed in a region having a size on the order of a quarter micron or less.

(4) In fabricating a semiconductor device having a LDC structure, an additional process step of masking the drain electrode is necessary when a p-type diffusion layer is formed on the source side.

Because of the above-described reasons, a highly reliable high-speed semiconductor device cannot be formed in a region having a size on the order of a quarter micron or less according to the conventional technologies for forming a MOS type semiconductor device.

DISCLOSURE OF INVENTION

The MOS type semiconductor device of the invention includes: a semiconductor substrate of a first conductivity type; a first source diffusion layer of a second conductivity type formed in a principal surface region of the semiconductor substrate; a first drain diffusion layer of the second conductivity type formed in the principal surface region of the semiconductor substrate so as to be distant from the first source diffusion layer; a channel region formed in the semiconductor substrate so as to be located between the first source diffusion layer and the first drain diffusion layer; a gate insulating film provided on the channel region.; a gate electrode provided on the gate insulating film; and an impurity diffusion layer of the first conductivity type which is formed in the channel region, and has a nonuniform impurity concentration profile along a channel length direction, an impurity concentration in a region of the impurity diffusion layer which is adjacent to the first source diffusion layer being higher than an impurity concentration in a region of the impurity diffusion layer which is closer to the first drain diffusion layer. In the semiconductor device, an impurity concentration of the semiconductor substrate just under the first source diffusion layer is lower than an impurity concentration on a source side of the impurity diffusion layer of the first conductivity type.

In one embodiment, the impurity diffusion layer of the first conductivity type includes a surface diffusion layer of the first conductivity type provided in a surface region of the channel region.

In another embodiment, the MOS type semiconductor device further includes a pair of second source/drain diffusion layers of the second conductivity type which are formed in both end portions of the channel region. In the semiconductor device, the pair of second source/drain diffusion layers of the second conductivity type have an impurity concentration of $1 \times 10^{19}$ cm$^{-3}$ or more and have a junction depth shallower than a junction depth of the first source/drain diffusion layers.

In still another embodiment, the MOS type semiconductor device further includes a pair of second source/drain diffusion layers of the second conductivity type which are formed in both end portions of the channel region. In the semiconductor device, the pair of second source/drain diffusion layers of the second conductivity type have an impurity concentration of $1 \times 10^{19}$ cm$^{-3}$ or more and have a junction depth shallower than a junction depth of the first source/drain diffusion layers.

In still another embodiment, the first source/drain diffusion layers extend to regions under both end portions of the gate electrode, respectively.

In still another embodiment, the MOS type semiconductor device further includes a pair of impurity diffusion layers of the first conductivity type which are formed under the second source/drain diffusion layers so as to be in contact with a side portion of the first source diffusion layer and a side portion of the first drain diffusion layer, respectively.

According to another aspect of the present invention, a method for fabricating a MOS type semiconductor device is provided. The method includes the steps of: sequentially depositing a first insulating film and a conductive film to be used as a gate electrode on a semiconductor substrate of a first conductivity type, thereby forming a multi-layered film; selectively etching a predetermined portion of the multi-layered film until the first insulating film is exposed, thereby forming the gate electrode; and implanting ion seeds of the first conductivity type by using the gate electrode as a mask, thereby forming a diffusion layer for controlling a threshold potential.

In one embodiment, the ion seeds are implanted into the semiconductor substrate during the ion implantation step in a direction which is parallel to a plane including a line vertical to a principal surface of the semiconductor substrate and a line extending along a channel length direction, and is inclined by seven degrees or more with respect to the line vertical to the principal surface of the semiconductor substrate.

In another embodiment, the ion seeds are implanted into the semiconductor substrate during the ion implantation step in a direction which is parallel to a plane including a line vertical to a principal surface of the semiconductor substrate and a line extending along a channel length direction, and is inclined by seven degrees or more with respect to the line vertical to the principal surface of the semiconductor substrate, thereby making nonuniform along the channel length direction an impurity concentration of the diffusion layer for controlling a threshold potential.

In still another embodiment, the method for fabricating a MOS type semiconductor device includes the steps of: implanting ion seeds of a second conductivity type by using the gate electrode as a mask, thereby forming second source/drain diffusion layers of the second conductivity type; depositing a second insulating film on the semiconductor substrate and the gate electrode; anisotropicly etching the second insulating film so as to leave the second insulating film on sides of the gate electrode; and implanting ion seeds of the second conductivity type by using the gate electrode and the second insulating film as a mask, thereby forming first source/drain diffusion layers of the second conductivity type.

In still another embodiment, the method for fabricating a MOS type semiconductor device includes the steps of: implanting ion seeds of the first conductivity type into the semiconductor substrate by using the gate electrode as a mask in a plane which is vertical to a principal surface of the semiconductor substrate and is parallel to a channel length direction, and is inclined by seven degrees or more with respect to a line vertical to the principal surface of the semiconductor substrate, thereby forming an asymmetric diffusion layer of the first conductivity type for controlling a threshold potential; implanting ion seeds of the second conductivity type into the semiconductor substrate in a plane which is vertical to the principal surface of the semiconductor substrate and is parallel to the channel length direction, and is inclined by seven degrees or more with respect to the line vertical to the principal surface of the semiconductor substrate, thereby forming second source/drain diffusion layers of the second conductivity type; depositing a second insulating film on the semiconductor substrate and the gate electrode; anisotropicly etching the second insulating film so as to leave the second insulating film on sides of the gate electrode; and implanting ion seeds of the second conductivity type by using the gate electrode and the second insulating film as a mask, thereby forming first source/drain diffusion layers of the second conductivity type having a junction depth deeper than a junction depth of the second source/drain diffusion layers. In this method, the ion implantation step of forming the second source/drain diffusion layers is performed so that an implant dose from the source side is larger than an implant dose from the drain side and that the second source/drain diffusion layers have an asymmetric concentration profile.

The MOS type semiconductor device according to still another aspect of the present invention includes: a semiconductor substrate of a first conductivity type; a first source diffusion layer of a second conductivity type formed in a principal surface region of the semiconductor substrate; a first drain diffusion layer of the second conductivity type formed in the principal surface region of the semiconductor substrate so as to be distant from the first source diffusion layer; a channel region formed in the semiconductor substrate so as to be located between the first source diffusion layer and the first drain diffusion layer; a gate insulating film provided on the channel region; a gate electrode provided on the gate insulating film; a second source diffusion layer of the second conductivity type which is formed between the first source diffusion layer and the first drain diffusion layer, is in contact with the first source diffusion layer and the principal surface of the semiconductor substrate, and has a junction depth shallower than a junction depth of the first source diffusion layer; and a second drain diffusion layer of the second conductivity type which is formed between the first source diffusion layer and the first drain diffusion layer, is in contact with the first drain diffusion layer and the principal surface of the semiconductor substrate, and has a junction depth shallower than a junction depth of the first drain diffusion layer. In the semiconductor device, a length of the second source diffusion layer of the second conductivity type along a channel length direction is shorter than a length of the second drain diffusion layer of the second conductivity type along the channel length direction.

In one embodiment, an impurity concentration of the second source diffusion layer and the second drain diffusion layer of the second conductivity type is $1\times10^{19}$ cm$^{-3}$ or more.

In another embodiment, the MOS type semiconductor device further includes an impurity diffusion layer of the first conductivity type which is formed in the channel region, and has a nonuniform impurity concentration profile along a channel length direction, an impurity concentration in a portion of the impurity diffusion layer which is adjacent to the first source diffusion layer being higher than an impurity concentration in a portion of the impurity diffusion layer which is closer to the first drain diffusion layer. In the semiconductor device, an impurity concentration of the semiconductor substrate just under the first source diffusion layer is lower than an impurity concentration on a source side of the diffusion layer of the first conductivity type.

According to still another aspect of the present invention, a method for fabricating a MOS type semiconductor device is provided. The method includes the steps of: sequentially depositing a first insulating film and conductive film to be used as a gate electrode on a semiconductor substrate of a first conductivity type, thereby forming a multi-layered film; selectively etching a predetermined portion of the multi-layered film until the first insulating film is exposed, thereby forming the gate electrode; implanting ion seeds of a second conductivity type by using the gate electrode as a mask, thereby forming first source/drain diffusion layers of the second conductivity type; forming side wall spacers on sides of the gate electrode; implanting ion seeds of the second conductivity type from a source side into the semiconductor substrate by using the gate electrode and the side wall spacers as a mask in a plane including a line vertical to a principal surface of the semiconductor substrate and a line extending along a channel length direction, and is inclined by seven degrees or more with respect to the line vertical to the principal surface of the semiconductor substrate, thereby forming second source/drain diffusion layers of the second conductivity type having a junction depth deeper than a junction depth of the first source/drain diffusion layers and making a length of the second source diffusion layer of the second conductivity type along the channel length direction shorter than a length of the second drain diffusion layer of the second conductivity type along the channel length direction.

In one embodiment, the method for fabricating a MOS type semiconductor device further includes a step of implanting ion seeds of the second conductivity type from drain side into the semiconductor substrate by using the gate electrode and the side wall spacers as a mask in a plane including a line vertical to the principal surface of the semiconductor substrate and a line extending along a channel length direction, and is inclined by seven degrees or more with respect to the line vertical to the principal surface of the semiconductor substrate. In this method, an implant dose from the source side is larger than an implant dose from the drain side.

In another embodiment, a diffusion layer in which an impurity concentration is nonuniform along the channel length direction is formed by implanting ion seeds of the second conductivity type from a source side into the semiconductor substrate by using the gate electrode as a mask in a plane including a line vertical to the principal surface of the semiconductor substrate and a line extending along the channel length direction, and is inclined by seven degrees or more with respect to the line vertical to the principal surface of the semiconductor substrate after performing the step of forming the gate electrode and before performing the step of forming the side wall spacers.

In still another embodiment, ion seeds of the first conductivity type are implanted by using the gate electrode as a mask after performing the step of forming the gate electrode and before performing the step of forming the side wall spacers, thereby forming a diffusion layer of the first conductivity type under the first source/drain diffusion layers having a shallow junction depth.

In still another embodiment, after performing the step of etching the first insulating film by photolithography and anisotropic etching until the first insulating film is exposed for forming the gate electrode, a step of implanting ion seeds of the first conductivity type from a source side into the semiconductor substrate by using the gate electrode as a mask in a plane which is vertical to the principal surface of the semiconductor substrate and is parallel to the channel length direction, and is inclined by seven degrees or more with respect to the line vertical to the principal surface of the semiconductor substrate is performed, and a diffusion layer for controlling a threshold potential, the impurity concentration of the diffusion layer being asymmetric along the channel length direction, and diffusion layers of the second conductivity type under the first source/drain diffusion layers having a shallow junction depth are simultaneously formed.

The MOS type semiconductor device according to still another aspect of the present invention includes: a semiconductor layer of a first conductivity type; a substrate for supporting the semiconductor layer; a source diffusion layer of a second conductivity type formed in a principal surface region of the semiconductor layer; a drain diffusion layer of the second conductivity type formed in the principal surface region of the semiconductor layer so as to be distant from the source diffusion layer; a channel region formed in the semiconductor layer so as to be located between the source diffusion layer and the drain diffusion layer; a gate insulating film provided on the channel region; a gate electrode provided on the gate insulating film; and an impurity diffusion layer of the first conductivity type which is formed in the channel region, and has a nonuniform impurity concentration profile along a channel length direction, an impurity concentration in a portion of the impurity diffusion layer which is adjacent to the source diffusion layer being higher than an impurity concentration in a portion of the impurity diffusion layer which is adjacent to the drain diffusion layer. In the semiconductor device, an impurity concentration of the semiconductor layer just under the source diffusion layer is lower than an impurity concentration on a source side of the impurity diffusion layer of the first conductivity type.

In one embodiment, the substrate is a substrate having an insulating surface.

In another embodiment, the substrate is a semiconductor substrate having an insulating film on a surface thereof, and the semiconductor layer is formed of an epitaxial layer formed on the insulating film on the surface of the semiconductor substrate.

Thus, the invention described herein makes possible the advantage of providing a highly reliable high-speed semiconductor device having large resistance to the short-channel effect, and a method for fabricating the same.

BRIEF DESCRIPTION OF DRAWINGS

This invention may be better understood and its numerous objects and advantages will become apparent to those skilled in the art by reference to the accompanying drawings as follows.

BEST MODE FOR CARRYING OUT THE INVENTION

In this specification, the portion of a channel region of a semiconductor device ranging from a position adjacent to a source diffusion layer to the center of the channel region will be referred to as a "source side portion of a channel region". On the other hand, the portion of the channel region ranging from the position adjacent to a drain diffusion layer to the center of the channel region will be referred to as a "drain side portion of a channel region".

In a semiconductor device in accordance with the invention, the impurity concentration in the channel region is varied along the channel length direction because of the presence of an impurity diffusion layer formed in the channel region. More specifically, the impurity is distributed in the channel region so that the concentration thereof decreases from the source diffusion layer to the drain diffusion layer. Therefore, if a voltage is applied to a region between the source diffusion layer and the drain diffusion layer, the electric field formed on the source side of the channel region becomes higher as compared with a case where the impurity concentration in the channel region is uniform along the channel length direction. This point will be described in detail later with reference to FIG. 19.

By setting the electric field on the source side of the channel region to be higher in such a manner, the carriers cause a speed overshoot on the source side portion of the channel region. A "speed overshoot" refers to the state of the carriers where the carriers obtain a non-equilibrium high energy from the electric field and are transferred at a speed higher than the saturation speed (or the speed in an equilibrium state) before some loss is caused in the speed of the carriers because of the scattering of the impurity and the like. A saturated current value is determined by the product obtained by multiplying together the speed of the carriers on the source side portion of the channel region and the density of the carriers. According to the present invention, by causing a speed overshoot on the source side portion of the channel region, a saturated current value can be set higher as compared with that obtained in a conventional semiconductor device. Since such a speed overshoot is caused only on the drain side portion of the channel region in a conventional semiconductor device, the speed overshoot does not contribute to the increase in the saturated current.

Hereinafter, preferred embodiments of a semiconductor device and a method for fabricating the same according to the present invention will be described with reference to the accompanying drawings.

EXAMPLE 1

Figure 1:
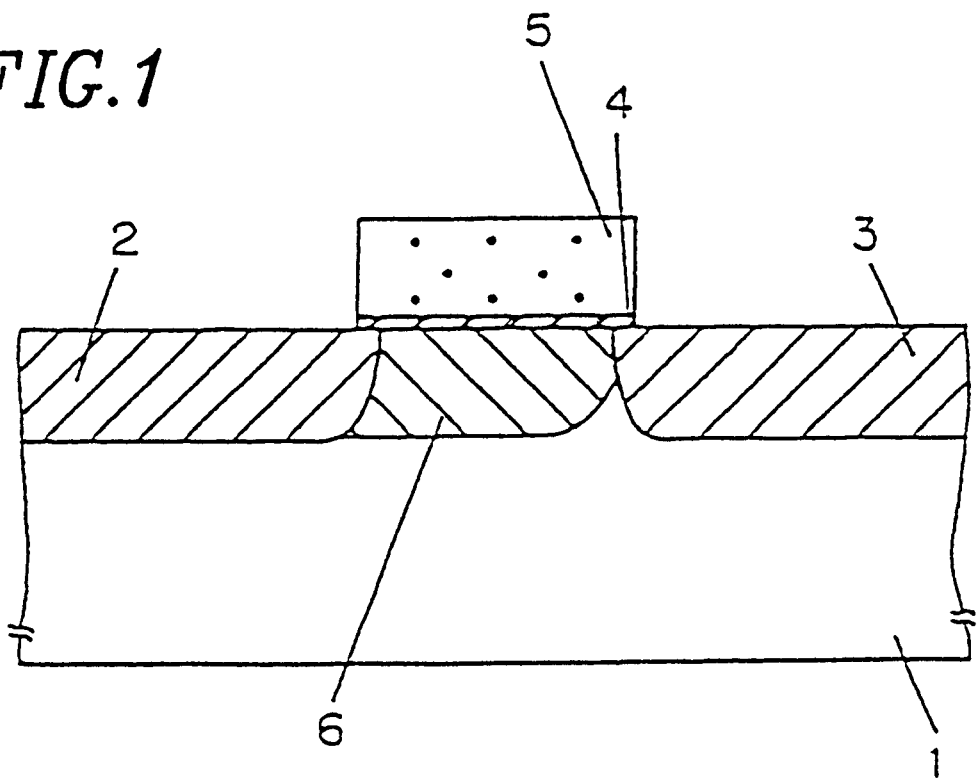
FIG. 1 is a cross-sectional view showing a semiconductor device according to a first example of the present invention.

FIG. 1 is a cross-sectional view showing a semiconductor device according to a first example of the present invention. As shown in FIG. 1, the semiconductor device includes: a p-type semiconductor substrate 1; an n-type high-concentration source diffusion layer 2 and an n-type high-concentration drain diffusion layer 3 which are formed in respective regions under the principal surface of the semiconductor substrate 1; and a channel region formed in the semiconductor substrate 1 so as to be located between the source diffusion layer 2 and the drain diffusion layer 3. A gate insulating film 4 is provided on the channel region, and a gate electrode 5 is provided on the gate insulating film 4.

In addition, a p-type impurity diffusion layer 6 is formed in the channel region. In the p-type impurity diffusion layer 6, the impurity concentration is nonuniform along the channel length direction. In this example, the impurity concentration in the channel region is set so that the impurity concentration (about $4 \times 10^{17}$ cm$^{-3}$) in the region adjacent to the source diffusion layer 2 is higher than the impurity concentration (about $1 \times 10^{16}$ cm$^{-3}$) in the region closer to the drain diffusion layer 3. In this structure, the source diffusion layer 2 and the drain diffusion layer 3 are located so as to be symmetrical with respect to a plane vertical to the principal surface of the semiconductor substrate 1, while the impurity profile in the channel region is asymmetric with respect to the plane. This asymmetric profile is formed by the p-type impurity diffusion layer 6.

In this example, the impurity concentration in the region of the semiconductor substrate 1 just under the source diffusion layer 2 is approximately $1 \times 10^{17}$ cm$^{-3}$, which is maintained to be lower than the impurity concentration on the source side of the p-type impurity diffusion layer 6. The impurity concentration in the region of the semiconductor substrate 1 just under the source diffusion layer 2 is lower than the impurity concentration ($1 \times 10^{18}$ cm$^{-3}$ or more) in the region of the semiconductor substrate just under the source diffusion layer in a conventional LDC structure. Therefore, the capacitance of the p-n junction between the source and the substrate in the semiconductor device shown in FIG. 1 is smaller than that of a conventional semiconductor device having a LDC structure. In general, the speed of a semiconductor device is proportional to the product obtained by multiplying together an inverse of a current value and a load capacitance. Therefore, in the case where the semiconductor device of this example is applied to a NAND type CMOS circuit in which a voltage is applied to a region between the source and the substrate, the speed of the device is not decreased. On the other hand, the power consumed by a semiconductor device is proportional to the product obtained by multiplying together the load capacitance and the square of the applied voltage. Therefore, the semiconductor device of this example can be operated with low power consumption.

Moreover, the impurity concentration on the source side of the channel region is set to be higher than the impurity concentration on the drain side. As a result, the number of the components of the electric field generated in the channel region along the channel length direction are increased on the source side, but are decreased on the drain side as compared with the case where the impurity is uniformly distributed in the channel region. Since the saturated current of a MOS type semiconductor device is determined by the electric field on the source side, it is possible to increase the saturated current and realize a high-speed semiconductor device having high drivability according to the present invention. Also, since the generation rate of the hot carriers is determined by the electric field on the drain side, it is possible to reduce the generation rate of the hot carriers and realize a highly reliable semiconductor device according to the present invention.

EXAMPLE 2

Figure 2:
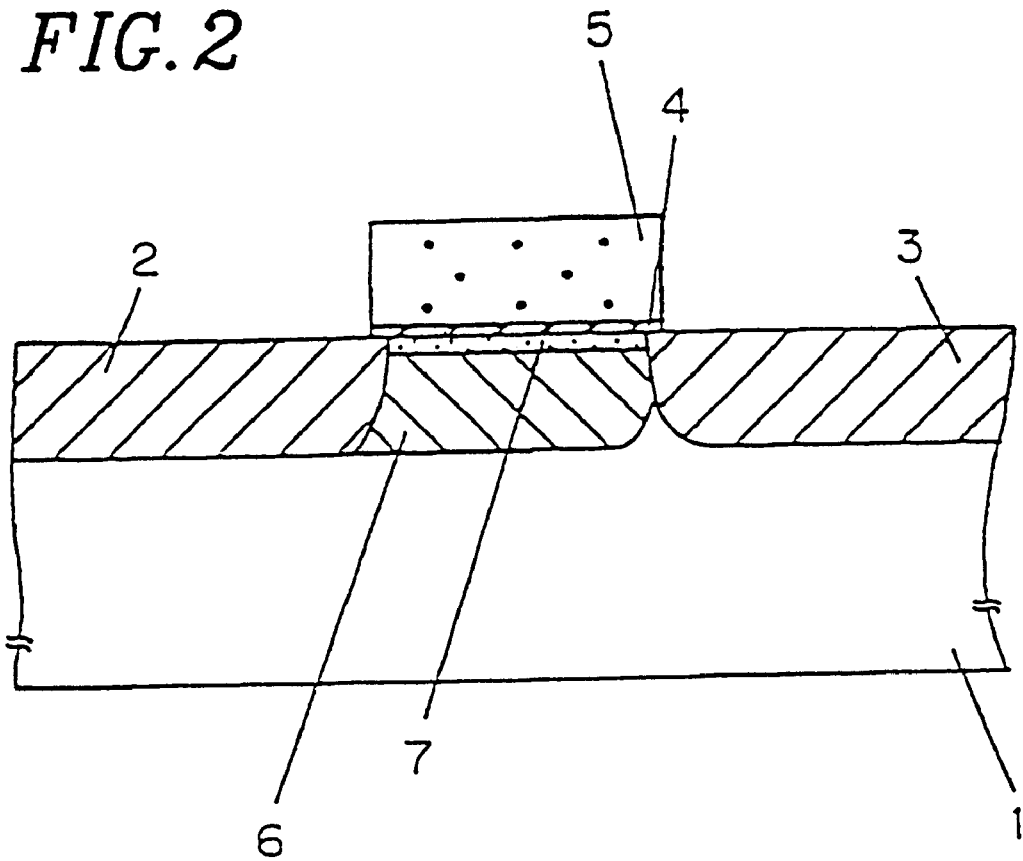
FIG. 2 is a cross-sectional view showing a semiconductor device according to a second example of the present invention.

FIG. 2 is a cross-sectional view showing a MOS type semiconductor device according to a second example of the present invention. In FIG. 2, the reference numerals denote as follows: 1 is a p-type (a first conductivity type) semiconductor substrate; 2 is an n-type source diffusion layer; 3 is an n-type drain diffusion layer; 4 is a gate oxide film; 5 is a gate electrode; 6 is a p-type impurity diffusion layer; and 7 is a p-type low-concentration diffusion layer. Hereinafter, similar components corresponding to those of the semiconductor device shown in FIG. 1 will be identified by the same reference numerals throughout the following Examples 2 to 22.

In this example, the p-type impurity diffusion layer 6 also has a nonuniform impurity concentration profile along the channel length direction so that the impurity concentration on the source side is higher than the impurity concentration on the drain side, in the same manner as in the first example. The semiconductor device of the second example is different from the semiconductor device shown in FIG. 1 in that a p-type low concentration ($1 \times 10^{16}$ cm$^{-3}$) diffusion layer 7 having a nonuniform impurity profile is formed in the channel region in the vicinity of the surface of the substrate. The impurity concentration of the p-type low-concentration diffusion layer 7 is preferably in an approximate range of $1 \times 10^{15}$ to $1 \times 10^{16}$ cm$^{-3}$ in the vicinity of the surface of the substrate.

In a conventional LDC structure, the impurity concentration of the p-type impurity diffusion layer for controlling the threshold voltage reaches a value as high as $1\times10^{18}$ cm$^{-3}$ in the vicinity of the surface of the substrate for suppressing the short-channel effect. Therefore the mobility of the carriers is considerably decreased on the source side because of the scattering of the impurity. Since the current value of a MOS type semiconductor device is determined by the behavior of the carriers on the source side, the current value is decreased and it is difficult to realize a high-speed semiconductor device having high drivability in a conventional LDC structure. However, in the semiconductor device of this example, the impurity concentration on the source side portion in the channel region in the vicinity of the surface of the substrate is set to be relatively low (about $1\times10^{16}$ cm$^{-3}$ or less), so that the mobility of the carriers is not decreased and it is possible to realize a high-speed semiconductor device having high drivability.

Furthermore, the p-type impurity diffusion layer 6 has a nonuniform impurity concentration profile along the channel length direction so that the impurity concentration on the source side is higher than the impurity concentration on the drain side. Therefore, in the semiconductor device of this example, the generation of hot carriers can be suppressed in the same way as in the first example.

EXAMPLE 3

Figure 3:
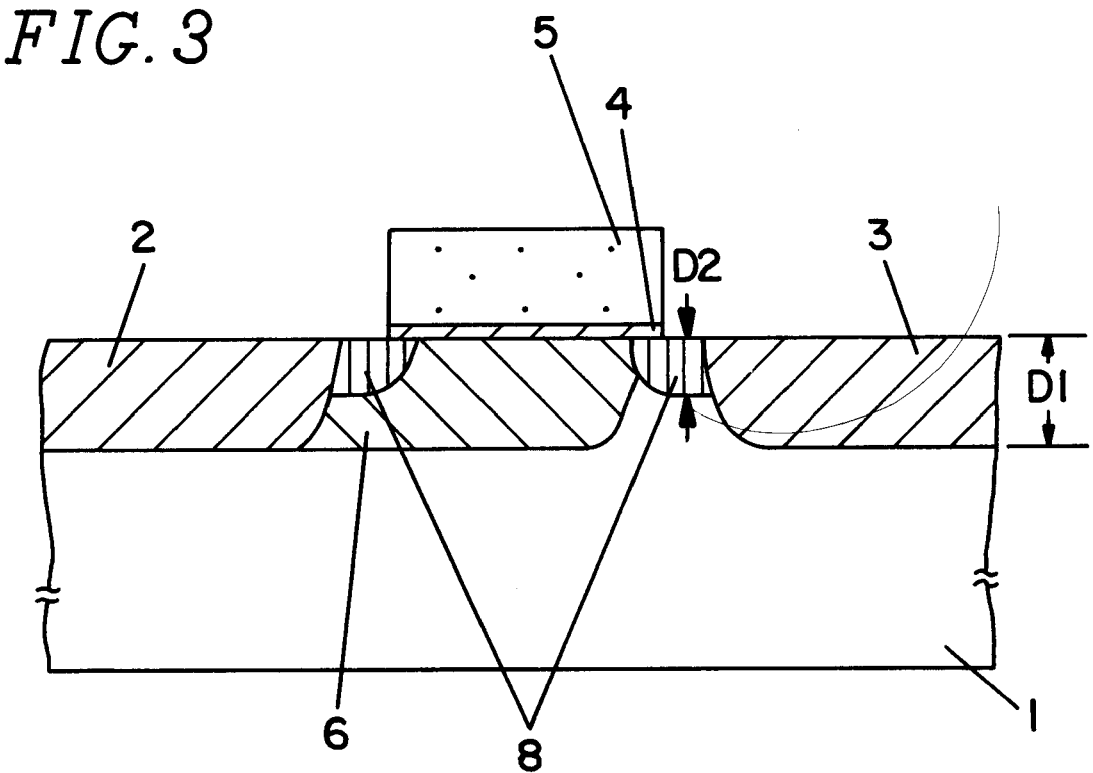
FIG. 3 is a cross-sectional view showing a semiconductor device according to a third example of the present invention.

FIG. 3 is a cross-sectional view showing a MOS type semiconductor device according to a third example of the present invention. In FIG. 3, the reference numerals denote as follows: 1 is a p-type (a first conductivity type) semiconductor substrate; 2 is a first n-type source diffusion layer; 3 is a first n-type drain diffusion layer; 4 is a gate oxide film; 5 is a gate electrode; 6 is a p-type impurity diffusion layer; and 8 is second n-type source/drain diffusion layers.

As shown in FIG. 3, the p-type impurity diffusion layer 6 has a nonuniform impurity concentration profile along the channel length direction so that the impurity concentration on the source side is higher than the impurity concentration on the drain side. In addition, the impurity concentration of the semiconductor substrate 1 under the source diffusion layer 2 is set to be lower than the impurity concentration on the source side of the p-type impurity diffusion layer 6.

The device shown in FIG. 3 is characterized in that the impurity concentration in the second n-type source/drain diffusion layers 8 is $1\times10^{19}$ cm$^{-3}$ or more and that the thickness (junction depth D2) of these diffusion layers 8 is smaller than the thickness (junction depth D1) of the first n-type source diffusion layer 2 and the first n-type drain diffusion layer 3. As a result, the extension of the potential curve from the source/drain diffusion layers in the channel length direction can be effectively suppressed and the degradation in the threshold potential in the initial stage, which is adversely caused in a region having a size on the order of a quarter micron or less, can be suppressed. Furthermore, since the second n-type source/drain diffusion layers 8 have an impurity concentration of $1\times10^{19}$ cm$^{-3}$ or more, a semiconductor device which has high drivability and is highly resistant to the short-channel effect can be obtained without causing a degradation in the drivability by the parasitic resistance. In addition, the p-type impurity diffusion layer 6 has a nonuniform impurity concentration profile along the channel length direction so that the impurity concentration on the source side is higher than the impurity concentration on the drain side. Therefore, just as the semiconductor device of the first example, the semiconductor device of the third example is also highly reliable. Moreover, the impurity concentration of the semiconductor substrate 1 under the source diffusion layer 2 is set to be lower than the impurity concentration on the source side of the p-type impurity diffusion layer 6. Therefore, the semiconductor device of this example can also be operated with low power consumption.

Figure 15:
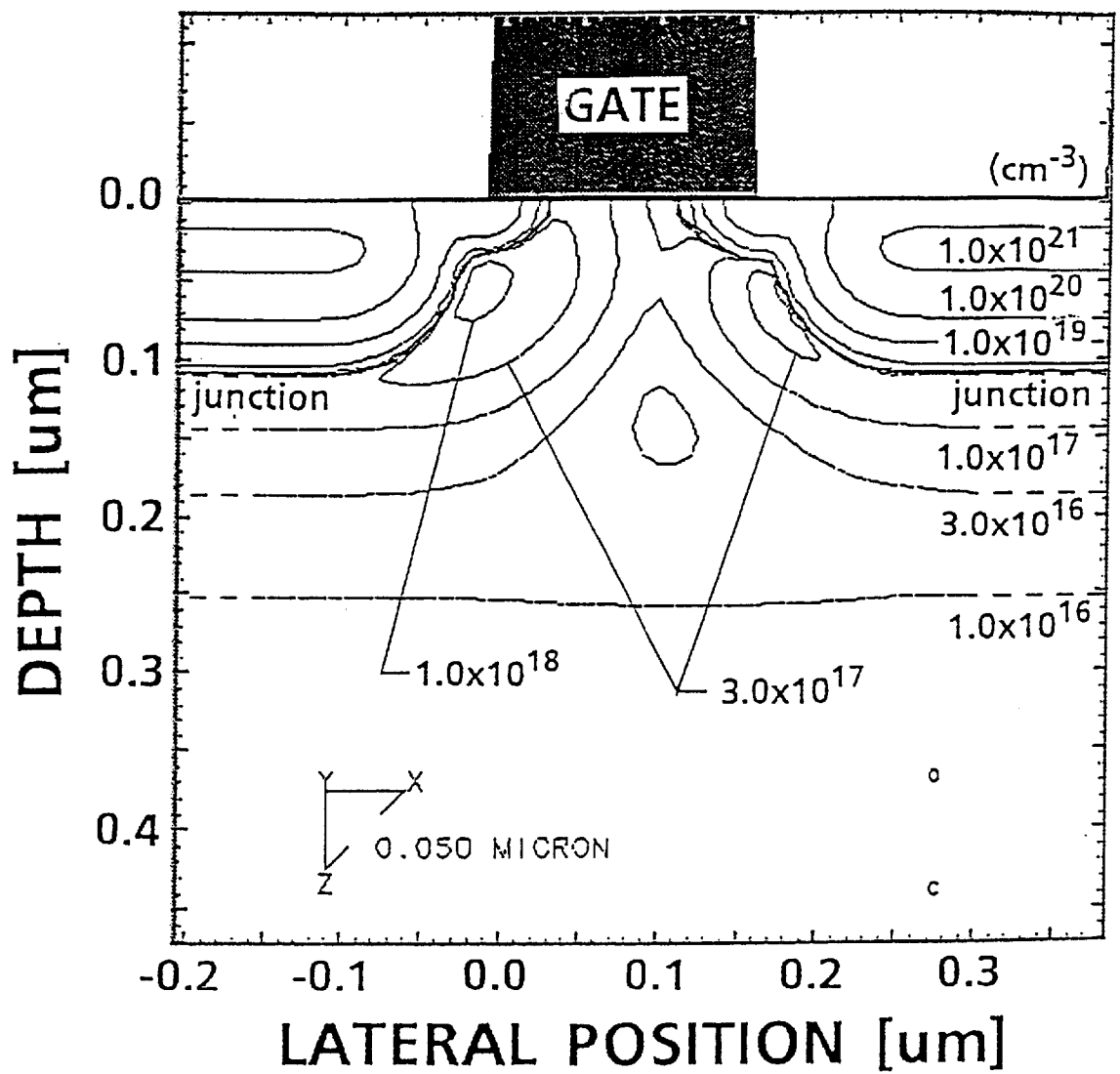
FIG. 15 is a two-dimensional cross-sectional view showing the simulation results of an impurity profile according to the third example of the present invention.

FIG. 15 is a two-dimensional cross-sectional view showing the results obtained by analyzing the impurity concentration profile in the semiconductor device of this example using a process simulator. In this simulation, an n-channel type MOSFET is used as the sample semiconductor device, in which the length of the gate electrode is 0.15 μm and the film thickness of the gate oxide film is 4 nm. The respective fabrication conditions used for the simulation are as follows.

A diffusion layer for controlling the threshold potential is formed by implanting $BF_2$ ions at an angle of 7 degrees into the semiconductor substrate using a gate electrode as a mask, and applying an acceleration energy of 80 KeV and setting the implant dose at $1.0\times10^{13}$ cm$^{-2}$. Shallow source/drain diffusion layers are formed by implanting arsenic ions into the semiconductor substrate while applying an acceleration energy of 10 KeV and setting the implant dose at $1.0\times10^{14}$ cm$^{-2}$. Thereafter, gate side walls are formed so as to be 80 nm thick. Then, source/drain diffusion layers are formed by implanting arsenic ions into the semiconductor substrate using the gate electrode and the gate side walls as a mask, applying an acceleration energy of 40 KeV and setting the implant dose at $6.0\times10^{15}$ cm$^{-2}$, and then a heat treatment is performed at a temperature of 1050° C. for 10 seconds.

From this cross-sectional view, the following features are recognized. The first feature lies in that the impurity concentration of the p-type impurity diffusion layer under the source/drain diffusion layers is $3.0\times10^{17}$ cm$^{-3}$ or less. The second feature lies in that the impurity concentration of the p-type impurity diffusion layer in the surface region of the channel has a nonuniform profile along the channel length direction, and the impurity concentration on the source side is higher than the impurity concentration on the drain side. And the third feature lies in that a p-type impurity diffusion layer having a high concentration of $3.0\times10^{17}$ cm$^{-3}$ or more is formed under the shallow source/drain diffusion layers.

First, the effects resulting from the first feature that the impurity concentration of the p-type impurity diffusion layer under the source/drain diffusion layers is $3.0\times10^{17}$ cm$^{-3}$ or less will be described. In a conventional LDC structure, the impurity concentration of the p-type impurity diffusion layer under the source diffusion layer is relatively high, i.e., $2.0\times10^{18}$ cm$^{-3}$ or more. The junction capacitance of the p-n junction is proportional to the square root of the impurity concentration. Therefore, in this example, the parasitic capacitance of the p-n Junction between the source and the substrate is 40% or less of that in a conventional LDC structure. In general, the speed of a MOS type semiconductor device is proportional to the product obtained by multiplying together an inverse of a current value and a load capacitance. Therefore, in the case where the semiconductor device of this example is applied to a NAND type CMOS circuit in which a voltage is applied to a region between the source and the substrate, the speed of the device is not reduced unlike a device having a LDC structure.

Next, the effects resulting from the second feature that the impurity concentration of the p-type impurity diffusion layer in the surface region of the channel has a nonuniform profile along the channel length direction and the impurity concentration on the source side is higher than the impurity concentration on the drain side will be described. In order to analyze the impurity concentration of the p-type impurity diffusion layer in the surface region of the channel in more detail, the simulation results of the impurity profile in the surface region of the channel are shown one-dimensionally in FIG. 16. The impurity (boron) concentration of the p-type impurity diffusion layer in the surface region of the channel is $3.0 \times 10^{17}$ cm$^{-3}$ on the source side. However, on the drain side, the concentration is reduced to the order of $1.0 \times 10^{14}$ cm$^{-3}$. Therefore, the impurity concentration profile of the p-type impurity diffusion layer in the surface region of the channel is asymmetric in the lateral direction. An effective channel length is 0.09 μm.

Figure 17:
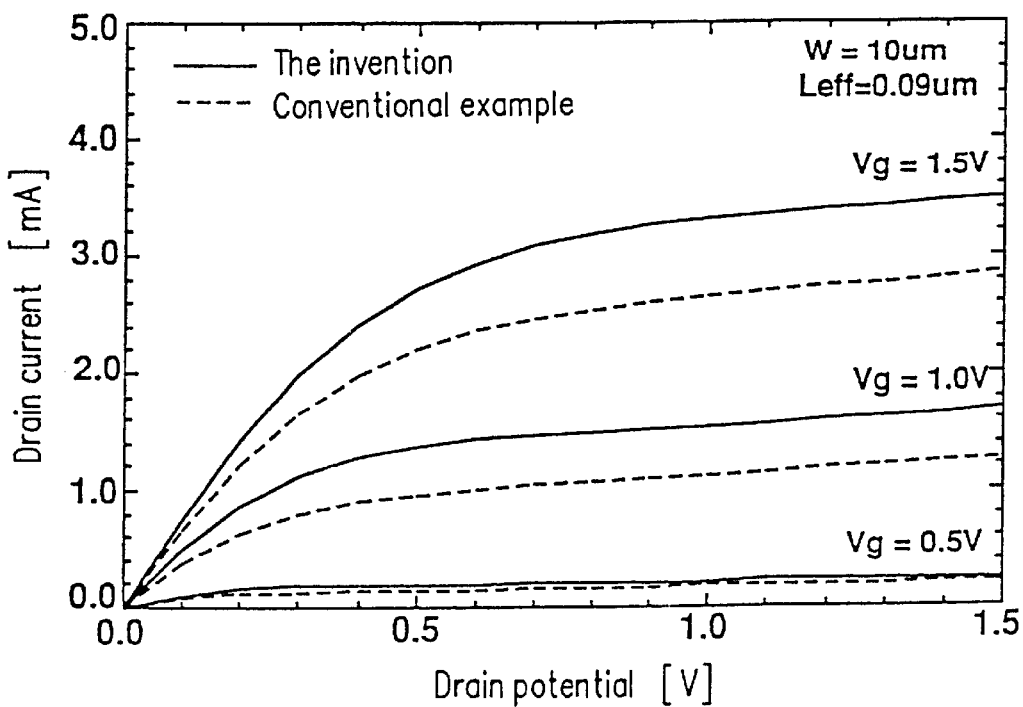
FIG. 17 is a graph showing the actual measured I–V characteristics of the semiconductor device according to the third example of the present invention.

FIG. 17 is a graph showing the actual measured electric characteristics of the semiconductor device of the third example. In FIG. 17, the drain voltage dependence of the drain current is plotted using a gate voltage as a parameter. In order to analyze the effects resulting from such an asymmetric impurity concentration profile of the p-type impurity diffusion layer in the surface region of the channel, a MOSFET in which the p-type impurity diffusion layer has a symmetric impurity concentration profile along the channel length direction in the surface region of the channel is also fabricated as a sample. In FIG. 17, the current value of the asymmetric MOSFET of the invention is indicated by the solid line and the current value of the symmetric MOSFET is indicated by the broken line. Both MOSFETs have an equal threshold voltage of about 0.2 V. It is obvious that the current value of the asymmetric MOSFET of the invention is larger than the current value of the ordinary MOSFET. When the drain voltage is 1.5 V and the gate voltage is 1.0 V, the saturated current value of the asymmetric MOSFET of the invention is increased from the saturated current value of the symmetric MOSFET by 34%.

The measurement results showing that the current value of the MOSFET of the invention is increased from the current value of the symmetric MOSFET are analyzed by a Monte Carlo device simulation method.

Figure 18:
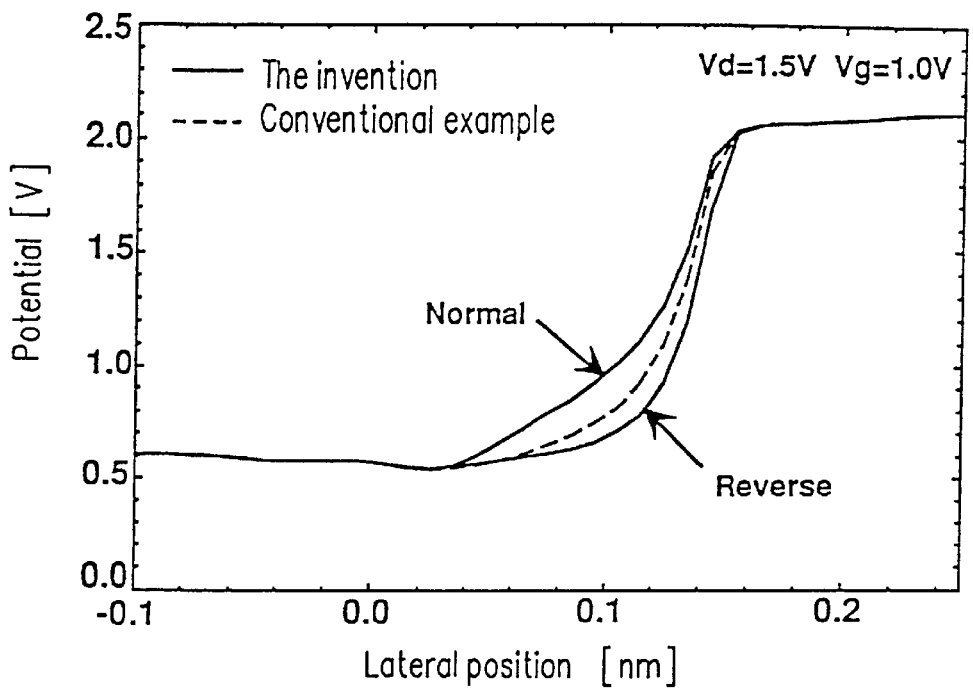
FIG. 18 is a graph showing the simulation results of the potential distribution in the surface region of the channel of the semiconductor device according to the third example of the present invention.

FIG. 18 is a graph showing the potential distribution in the surface region of the channel obtained by the device simulation method. A drain voltage of 1.5 V and a gate voltage of 1.0 V are applied. In FIG. 18, the potential distribution in the MOSFET of the invention is indicated by the solid line and the potential distribution in the symmetric MOSFET is indicated by the broken line. A potential distribution in the MOSFET of the invention when the source electrode and the drain electrode are exchanged and a voltage of 1.5 V is applied to the source electrode is also plotted by the solid line identified as "reverse". In the MOSFET of the invention, the potential is increased on the source side as compared with the potential distribution in the symmetric MOSFET. This is because the impurity concentration of the p-type impurity diffusion layer in the surface region of the channel in the MOSFET of the invention is asymmetric, that is to say, the concentration is higher on the source side and lower on the drain side as compared with the impurity concentration of the p-type impurity diffusion layer in the surface region of the channel in the symmetric MOSFET, and therefore, the potential variation on the source side in the MOSFET of the invention is larger as compared with the symmetric MOSFET. This is also supported by the result showing that the potential distribution in the MOSFET of the invention is lower than the potential distribution in the symmetric MOSFET in the reverse mode in which a voltage of 1.5 V is applied to the source electrode.

Figure 19:
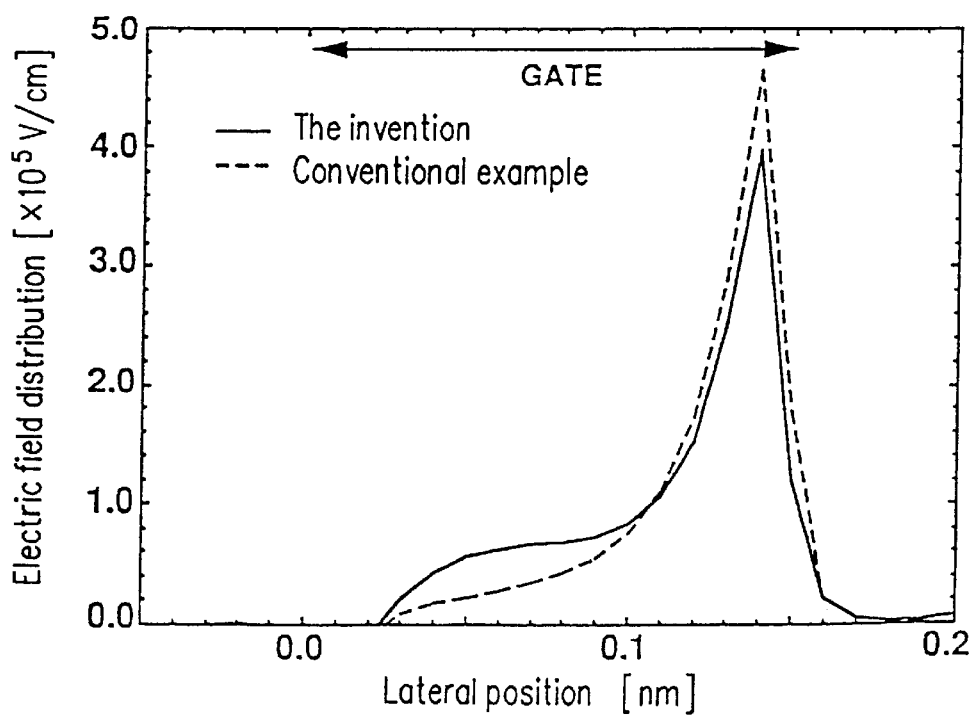
FIG. 19 is a graph showing the simulation results of the electric field distribution in the surface region of the channel of the semiconductor device according to the third example of the present invention.

FIG. 19 shows the simulation results of the electric field distribution in the surface region of the channel. In the MOSFET of the invention, the electric field is higher on the source side and lower on the drain side as compared with the electric field in the symmetric MOSFET. This is because the variation of the potential distribution in the MOSFET of the invention becomes larger on the source side as shown in FIG. 18. The level of the electric field on the source side reaches $6.0 \times 10^4$ V/cm. This difference in the electric field distribution affects the speed of the electrons in the channel.

Figure 20:
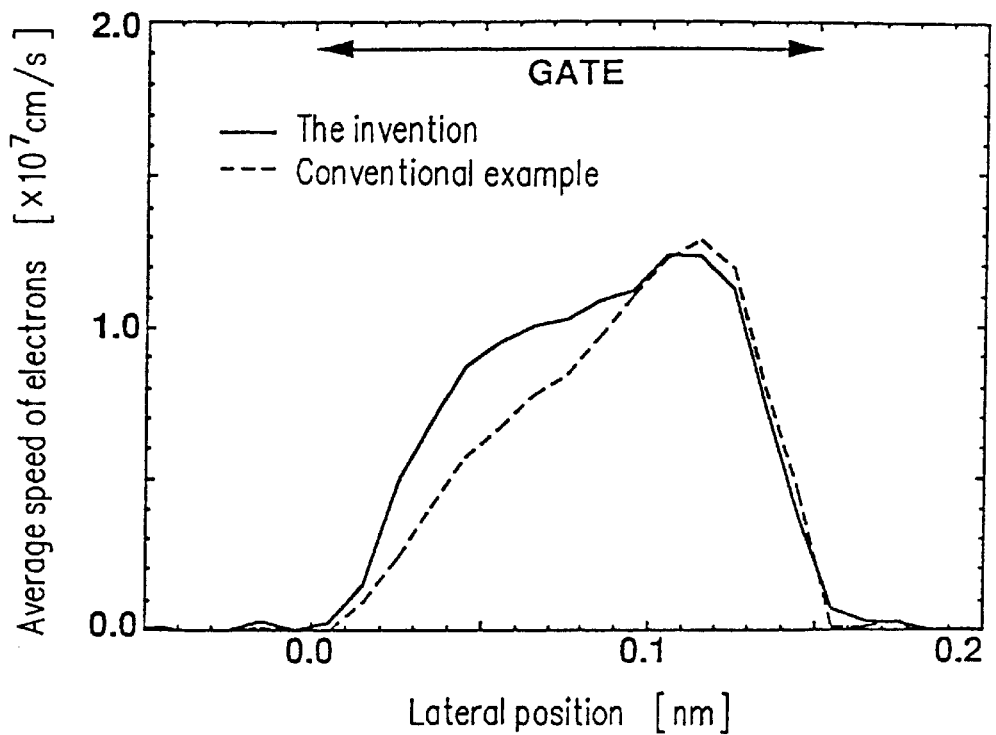
FIG. 20 is a graph showing the simulation results of the speed of the electrons in the channel of the semiconductor device according to the third example of the present invention.

FIG. 20 shows the simulation results of the average speed of the electrons in the channel. The average speed of the electrons in the channel of the MOSFET of the invention becomes higher on the source side as compared with the average speed of the electrons in the channel of the symmetric MOSFET. At a position distant from the end of the gate electrode by 64 nm, the average speed reaches $1.0 \times 10^7$ cm/s. The average speed on the drain side is substantially equal in both MOSFETs, i.e., higher than $1.2 \times 10^7$ cm/s.

Figure 21:
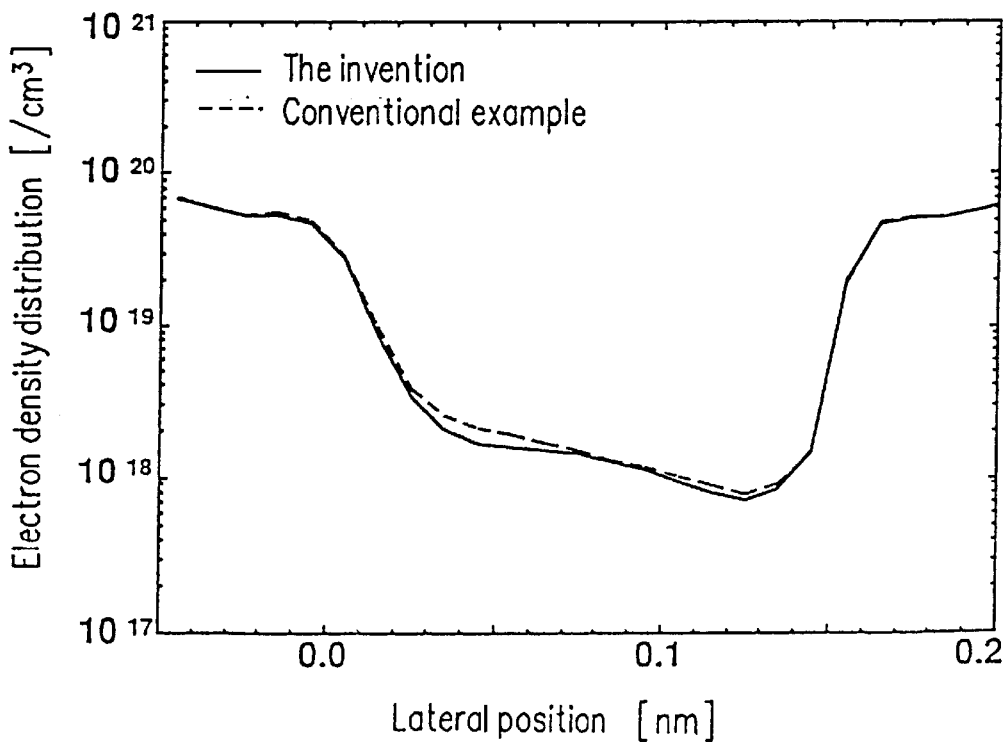
FIG. 21 is a graph showing the simulation results of the density distribution of the electrons in the surface region of the channel of the semiconductor device according to the third example of the present invention.

On the other hand, the density of the electrons in the surface region of the channel is substantially the same in both of the MOSFET of the invention and the symmetric MOSFET, as shown in FIG. 21. Since the current value of a MOSFET is represented as a product obtained by multiplying together the average speed of the electrons in the channel and the charge, the measurement results showing that the current value of the MOSFET of the invention is larger than the current value of the symmetric MOSFET can be understood well, in view of the above-described analysis results.

Figure 22:
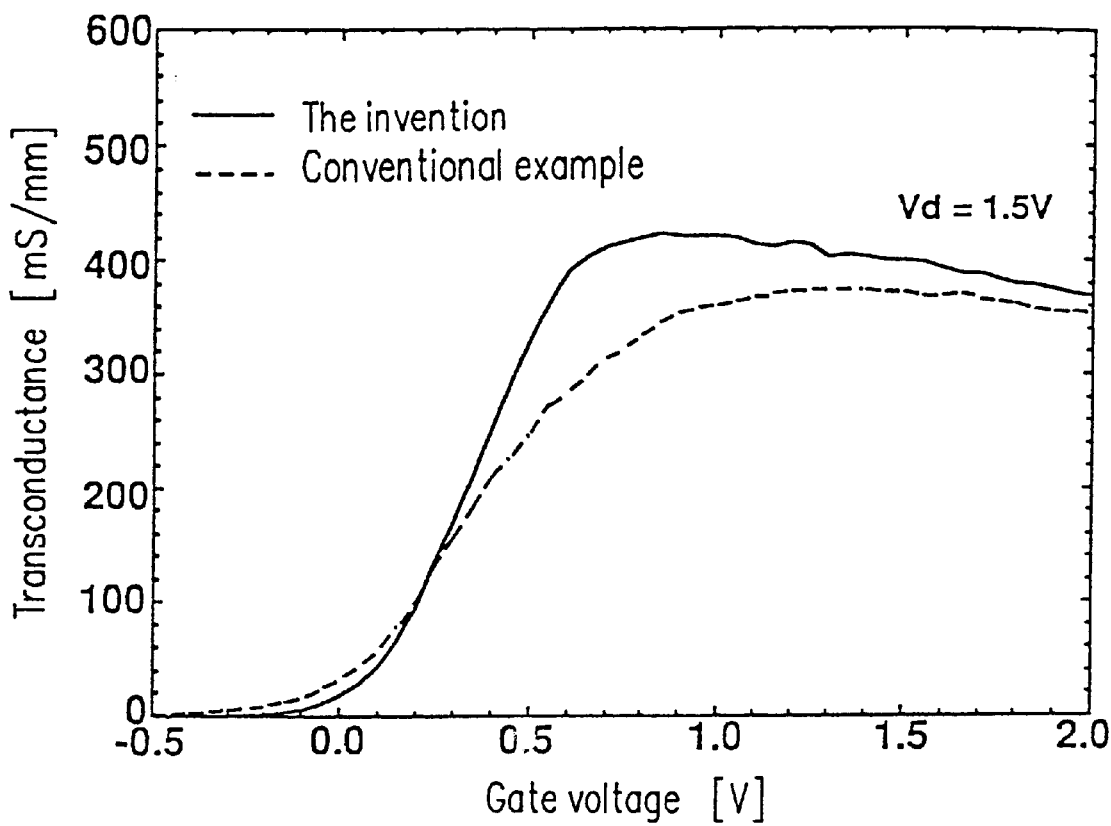
FIG. 22 is a graph showing the actual measured results of the transconductance of the semiconductor device according to the third example of the present invention.

In addition, in order to analyze the drivability of the semiconductor device of the invention, the transconductance of the MOSFET having a gate electrode with a length of 0.1 μm is measured. FIG. 22 shows the actual measured values of the transconductance when a drain voltage of 1.5 V is applied. The transconductance of the asymmetric MOSFET of the invention reaches a maximum value of 423 mS/mm when a gate potential is 0.85 V. When a gate voltage of the same value is applied, the transconductance of the symmetric MOSFET is 345 mS/mm.

As is apparent from these measurement and simulation results, in a MOSFET in which the impurity concentration of the p-type impurity diffusion layer in the surface region of the channel has a nonuniform profile along the channel length direction so that the impurity concentration on the source side is higher than the impurity concentration on the drain side, the drain current value is large and the MOSFET of the invention has excellent characteristics including high drivability.

As shown in the electric field distributions in FIG. 19, the electric field on the drain side of the asymmetric MOSFET of the invention is smaller than the electric field of the symmetric MOSFET, so that the generation of hot carriers can be suppressed and the MOSFET of the invention is highly resistant to the hot carrier effect.

EXAMPLE 4

Figure 4:
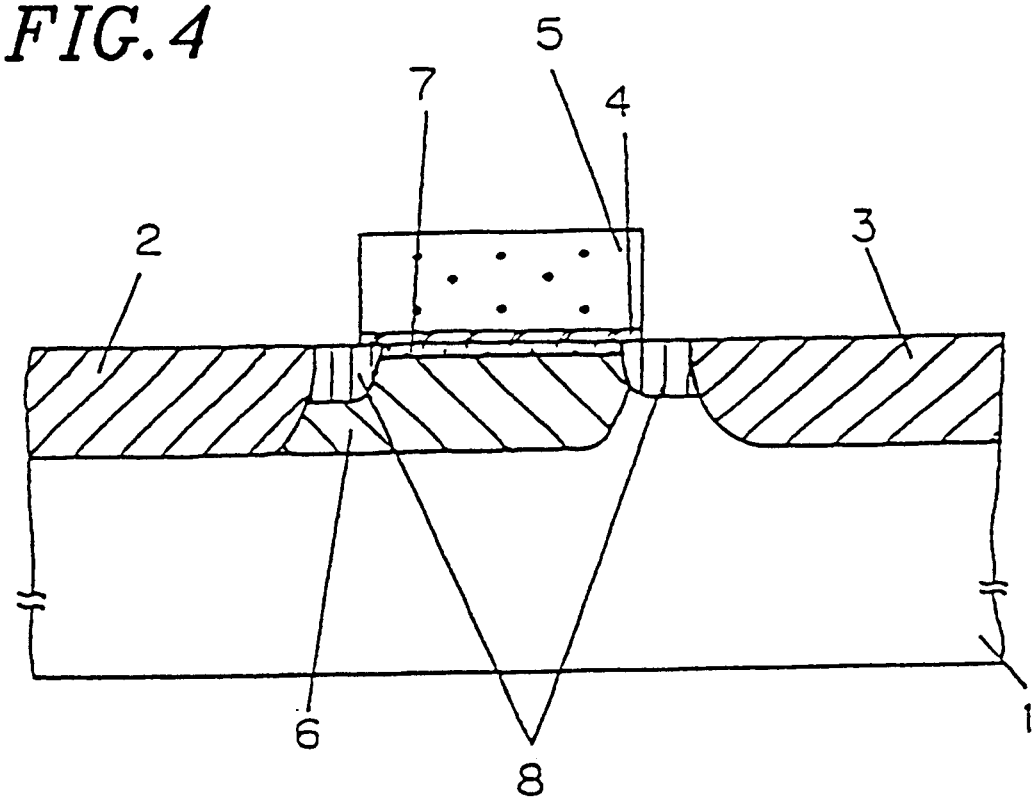
FIG. 4 is a cross-sectional view showing a semiconductor device according to a fourth example of the present invention.

FIG. 4 is a cross-sectional view showing a MOS type semiconductor device according to a fourth example of the present invention. In FIG. 4, the reference numerals denote as follows: 1 is a p-type (a first conductivity type) semiconductor substrate; 2 is a first n-type source diffusion layer; 3 is a first n-type drain diffusion layer; 4 is a gate oxide film; 5 is a gate electrode; 6 is a p-type impurity diffusion layer; 7 is a p-type low-concentration impurity diffusion layer; and 8 is second n-type source/drain diffusion layers.

As shown in FIG. 4, the p-type impurity diffusion layer 6 has a nonuniform impurity concentration profile along the channel length direction so that the impurity concentration on the source side is higher than the impurity concentration on the drain side. In addition, the impurity concentration of the second n-type source/drain diffusion layers 8 is set to be $1.0\times10^{19}$ cm$^{-3}$ or more and the thickness (junction depth D2) of these diffusion layers 8 is smaller than the thickness (junction depth D1) of the first n-type source diffusion layer 2 and the first n-type drain diffusion layer 3.

The device shown in FIG. 4 is characterized in that a p-type low-concentration impurity diffusion layer 7 having a nonuniform impurity profile is formed in the channel region in the vicinity of the surface of the substrate. In a conventional LDC structure, the impurity concentration on the source side of the p-type impurity diffusion layer for controlling the threshold voltage is set at a high value, i.e., $1.0\times10^{18}$ cm$^{-3}$ or more, in the vicinity of the surface of the substrate for suppressing the short-channel effect. Therefore, the mobility of the carriers is considerably decreased on the source side because of the scattering of the impurity. Since the current value of a MOS type semiconductor device is determined by the behavior of the carriers on the source side, the current value is decreased in a conventional structure, and therefore a high-speed semiconductor device having high drivability cannot be obtained. However, according to the present invention, the impurity concentration in the region in the vicinity of the surface of the substrate is set to be lower, e.g., about $1.0\times10^{17}$ cm$^{-3}$, so that the mobility of the carriers is not decreased and therefore a high-speed semiconductor device having high drivability can be obtained. In addition, the thickness (junction depth D2) of the second n-type source/drain diffusion layers 8 is set to be smaller than the thickness (junction depth D1) of the first n-type source diffusion layer 2 and the first n-type drain diffusion layer 3. Therefore, the extension of the potential curve from the source/drain diffusion layers in the channel direction can be effectively suppressed and the degradation in the threshold potential in the initial stage, which is adversely caused in a region having a size on the order of a quarter micron or less, can be suppressed. Furthermore, since the second n-type source/drain diffusion layers 8 have an impurity concentration of $1.0\times10^{18}$ cm$^{-3}$ or more, a semiconductor device which has high drivability and is highly resistant to the short-channel effect can be obtained without causing a degradation in the drivability by the parasitic resistance. In addition, the p-type impurity diffusion layer 6 has a nonuniform impurity concentration profile along the channel length direction so that the impurity concentration on the source side is higher than the impurity concentration on the drain side. Therefore, the semiconductor device of this example is highly reliable just like the semiconductor device of the first example.

EXAMPLE 5

Figure 5:
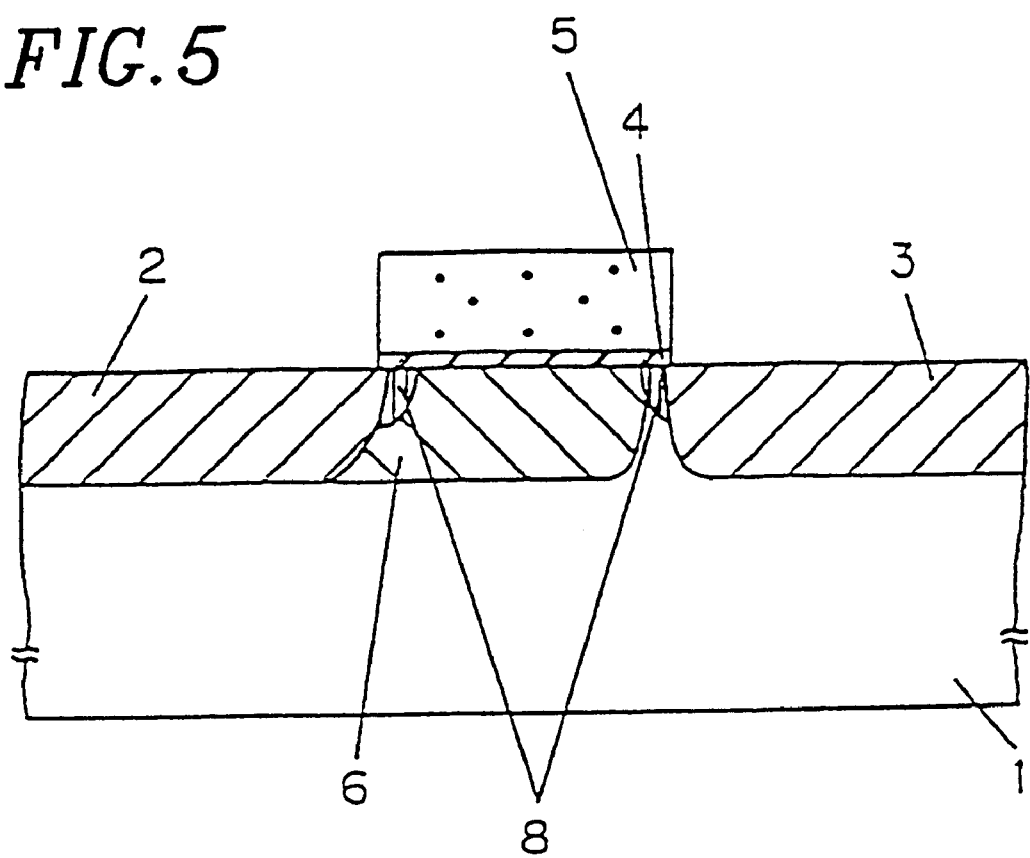
FIG. 5 is a cross-sectional view showing a semiconductor device according to a fifth example of the present invention.

FIG. 5 is a cross-sectional view showing a MOS type semiconductor device according to a fifth example of the present invention. In FIG. 5, the reference numerals denote as follows: 1 is a p-type (a first conductivity type) semiconductor substrate; 2 is a first n-type source diffusion layer; 3 is a first n-type drain diffusion layer; 4 is a gate oxide film; 5 is a gate electrode; 6 is a p-type impurity diffusion layer; and B is second n-type source/drain diffusion layers.

As shown in FIG. 5, the p-type impurity diffusion layer 6 has a nonuniform impurity concentration profile along the channel length direction so that the impurity concentration on the source side is higher than the impurity concentration on the drain side. In addition, the impurity concentration of the second n-type source/drain diffusion layers 8 is set to be $1.0\times10^{19}$ cm$^{-3}$ or more and the thickness (junction depth D2) of these diffusion layers 8 is set to be smaller than the thickness (Junction depth D1) of the first n-type source diffusion layer 2 and the first n-type drain diffusion layer 3. Furthermore, the impurity concentration of the semiconductor substrate 1 under the source diffusion layer 2 is set to be lower than the impurity concentration on the source side of the p-type impurity diffusion layer 6.

The semiconductor device shown in FIG. 5 is characterized in that the first n-type source diffusion layer 2 and the first n-type drain diffusion layer 3 are formed so as to reach the regions just under both end portions of the gate electrode 5. Therefore, the second n-type source/drain diffusion layers 8 are totally overlapped by the gate electrode. As a result, a parasitic resistance is not caused in the second n-type source/drain diffusion layers 8.

In addition, the impurity concentration of the second n-type source/drain diffusion layers 8 is set to be $1.0\times10^{19}$ cm$^{-3}$ or more and the thickness (junction depth D2) of the second n-type source/drain diffusion layers 8 is set to be smaller (or shallower) than the thickness (junction depth D1) of the first n-type source diffusion layer 2 and the first n-type drain diffusion layer 3. Therefore, the extension of the potential curve from the source/drain diffusion layers in the channel direction can be effectively suppressed and the degradation in the threshold potential in the initial stage, which is adversely caused in a region having a size on the order of a quarter micron or less, can be suppressed. Furthermore, since the second n-type source/drain diffusion layers 8 have an impurity concentration of $1.0\times10^{19}$ cm$^{-3}$ or more, a semiconductor device which has high drivability and is highly resistant to the short-channel effect can be obtained without causing a degradation in the drivability by the parasitic resistance. In addition, the p-type impurity diffusion layer 6 has a nonuniform impurity concentration profile along the channel length direction so that the impurity concentration on the source side is higher than the impurity concentration on the drain side. Therefore, the semiconductor device of this example is highly reliable just like the semiconductor device of the first example. Furthermore, the impurity concentration of the semiconductor substrate 1 under the source diffusion layer 2 is set to be lower than the impurity concentration on the source side of the p-type impurity diffusion layer 6. Therefore, high-speed operation of the device of this example is realized with low power consumption.

EXAMPLE 6

Figure 6:
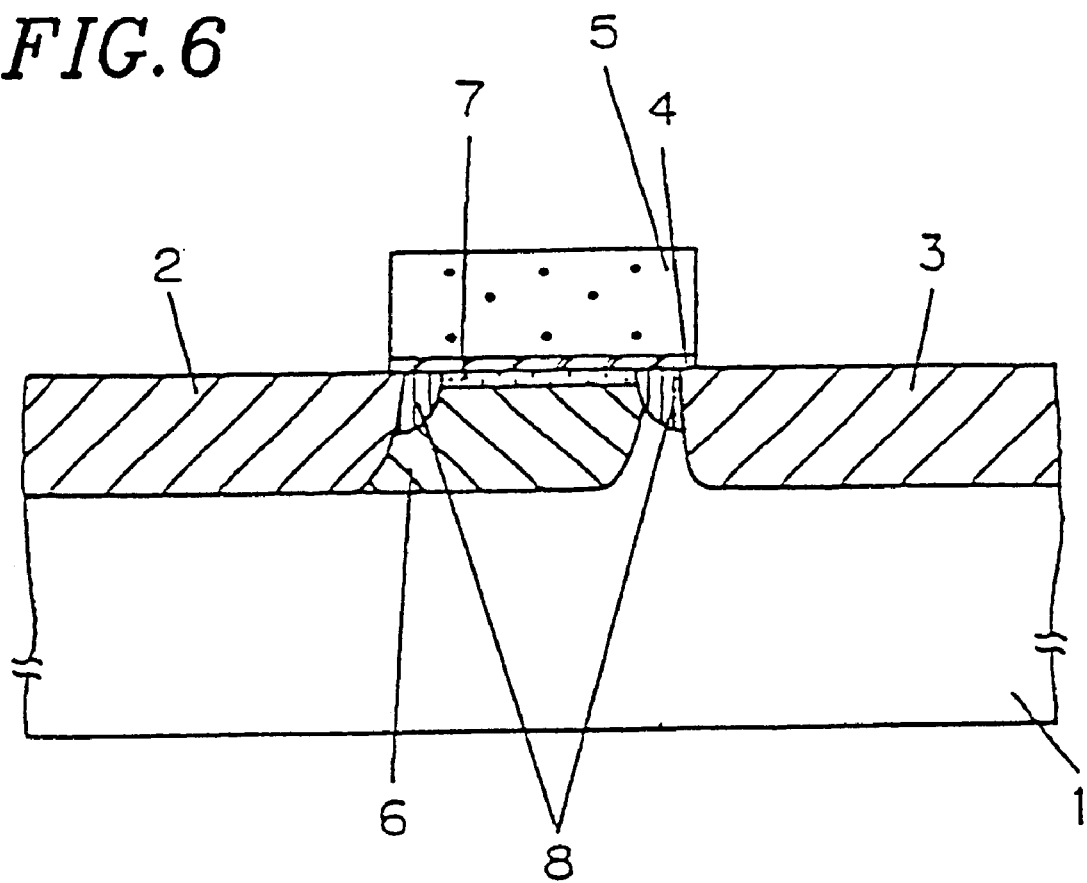
FIG. 6 is a cross-sectional view showing a semiconductor device according to a sixth example of the present invention.

FIG. 6 is a cross-sectional view showing a MOS type semiconductor device according to a sixth example of the present invention. In FIG. 6, the reference numerals denote as follows: 1 is a p-type (a first conductivity type) semiconductor substrate; 2 is a first n-type source diffusion layer; 3 is a first n-type drain diffusion layer; 4 is a gate oxide film; 5 is a gate electrode; 6 is a p-type impurity diffusion layer; 7 is a p-type low-concentration impurity diffusion layer; and 8 is second n-type source/drain diffusion layers.

As shown in FIG. 6, the p-type impurity diffusion layer 6 has a nonuniform impurity concentration profile along the channel length direction so that the impurity concentration on the source side is higher than the impurity concentration on the drain side. In addition, the impurity concentration of the second n-type source/drain diffusion layers 8 is set to be $1.0\times10^{19}$ cm$^{-3}$ or more and the thickness (junction depth D2) of these diffusion layers 8 is set to be smaller (or shallower) than the thickness (junction depth D1) of the first n-type source diffusion layer 2 and the first n-type drain diffusion layer 3.

The semiconductor device shown in FIG. 6 is characterized in that the first n-type source diffusion layer 2 and the first n-type drain diffusion layer 3 are formed so as to extend to the regions just under both end portions of the gate electrode 5. Therefore, the second n-type source/drain diffusion layers 8 are totally overlapped by the gate electrode. As a result, a parasitic resistance is not caused in the second n-type source/drain diffusion layers 8. The semiconductor device shown in FIG. 6 is also characterized in that a p-type low-concentration impurity diffusion layer 7 having a nonuniform impurity profile is formed in the channel region in the vicinity of the surface of the substrate. In a conventional LDC structure, the impurity concentration on the source side of the p-type impurity diffusion layer for controlling the threshold voltage is set at a high value, i.e., $1.0 \times 10^{15}$ cm$^{-3}$ or more for suppressing the short-channel effect. Therefore, the mobility of the carriers is considerably decreased on the source side because of the scattering of the impurity. Since the current value of a MOS type semiconductor device is determined by the behavior of the carriers on the source side, the current value is decreased in a conventional structure, and therefore a high-speed semiconductor device having high drivability cannot be obtained. However, according to the present invention, the impurity concentration in the region in the vicinity of the surface of the substrate is set to be lower, so that the mobility of the carriers is not decreased and therefore a high-speed semiconductor device having high drivability can be obtained. In addition, the thickness (junction depth D2) of the second n-type source/drain diffusion layers 8 is set to be smaller than the thickness (junction depth D1) of the first n-type source diffusion layer 2 and the first n-type drain diffusion layer 3. Therefore, the extension of the potential curve from the source/drain diffusion layers in the channel direction can be effectively suppressed and the degradation in the threshold potential in the initial stage, which is adversely caused in a region having a size on the order of a quarter micron or less, can be suppressed. Furthermore, since the second n-type source/drain diffusion layers 8 have an impurity concentration of $1.0 \times 10^{19}$ cm$^{-3}$ or more, a semiconductor device which has high drivability and is highly resistant to the short-channel effect can be obtained without causing a degradation in the drivability by the parasitic resistance. In addition, the p-type impurity diffusion layer 6 has a nonuniform impurity concentration profile along the channel length direction so that the impurity concentration on the source side is higher than the impurity concentration on the drain side. Therefore, the semiconductor device of this example is highly reliable just like the semiconductor device of the first example.

EXAMPLE 7

Figure 7:
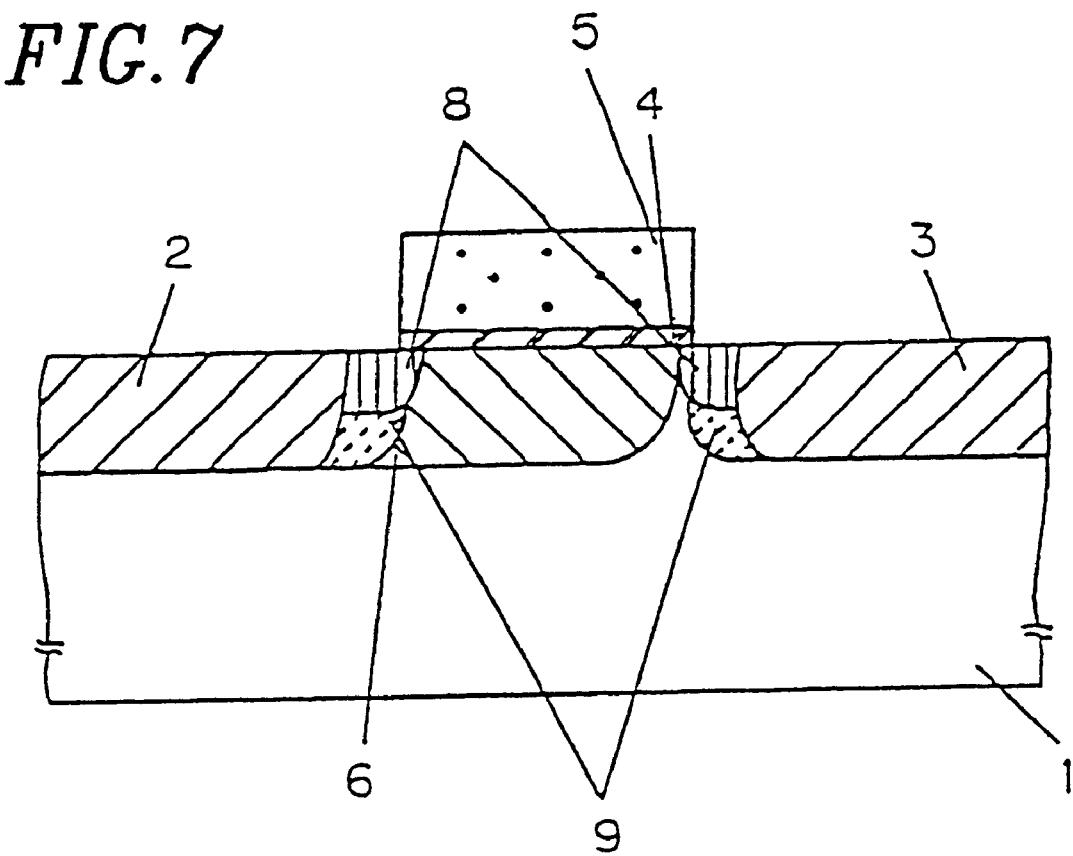
FIG. 7 is a cross-sectional view showing a semiconductor device according to a seventh example of the present invention.

FIG. 7 is a cross-sectional view showing a MOS type semiconductor device according to a seventh example of the present invention. In FIG. 7, the reference numerals denote as follows: 1 is a p-type (a first conductivity type) semiconductor substrate; 2 is a first n-type source diffusion layer; 3 is a first n-type drain diffusion layer; 4 is a gate oxide film; 5 is a gate electrode; 6 is a p-type impurity diffusion layer; 8 is second n-type source/drain diffusion layers; and 9 is second p-type high-concentration impurity diffusion layers.

As shown in FIG. 7, the p-type impurity diffusion layer 6 has a nonuniform impurity concentration profile along the channel length direction so that the impurity concentration on the source side is higher than the impurity concentration on the drain side. In addition, the impurity concentration of the second n-type source/drain diffusion layers 8 is set to be $1 \times 10^{19}$ cm$^{-3}$ or more and the thickness (junction depth D2) of these diffusion layers 8 is set to be smaller than the thickness (junction depth D1) of the first n-type source diffusion layer 2 and the first n-type drain diffusion layer 3. Furthermore, the impurity concentration of the semiconductor substrate 1 under the source diffusion layer 2 is set to be lower than the impurity concentration on the source side of the p-type impurity diffusion layer 6.

The semiconductor device shown in FIG. 7 is characterized in that second p-type high-concentration impurity diffusion layers 9 are formed under the second source/drain diffusion layers 8 so as to be in contact with the side portion of the first n-type source diffusion layer 2 and that of the first n-type drain diffusion layer 3. Therefore, the extension of the potential curve from the source/drain diffusion layers in the channel direction can be effectively suppressed and the degradation in the threshold potential in the initial stage, which is adversely caused in a region having a size on the order of a quarter micron or less, can be suppressed. Furthermore, since the second n-type source/drain diffusion layers 8 have an impurity concentration of $1.0 \times 10^{19}$ cm$^{-3}$ or more, a semiconductor device which has high drivability and is highly resistant to the short-channel effect can be obtained without causing a degradation in the drivability by the parasitic resistance. In addition, the p-type impurity diffusion layer 6 has a nonuniform impurity concentration profile along the channel length direction so that the impurity concentration on the source side is higher than the impurity concentration on the drain side. Therefore, the semiconductor device of this example is highly reliable just like the semiconductor device of the first example. Furthermore, the impurity concentration of the semiconductor substrate 1 under the source diffusion layer 2 is set to be lower than the impurity concentration on the source side of the p-type impurity diffusion layer 6. Therefore, high-speed operation of the device of this example is realized with low power consumption.

EXAMPLE 8

Figure 8:
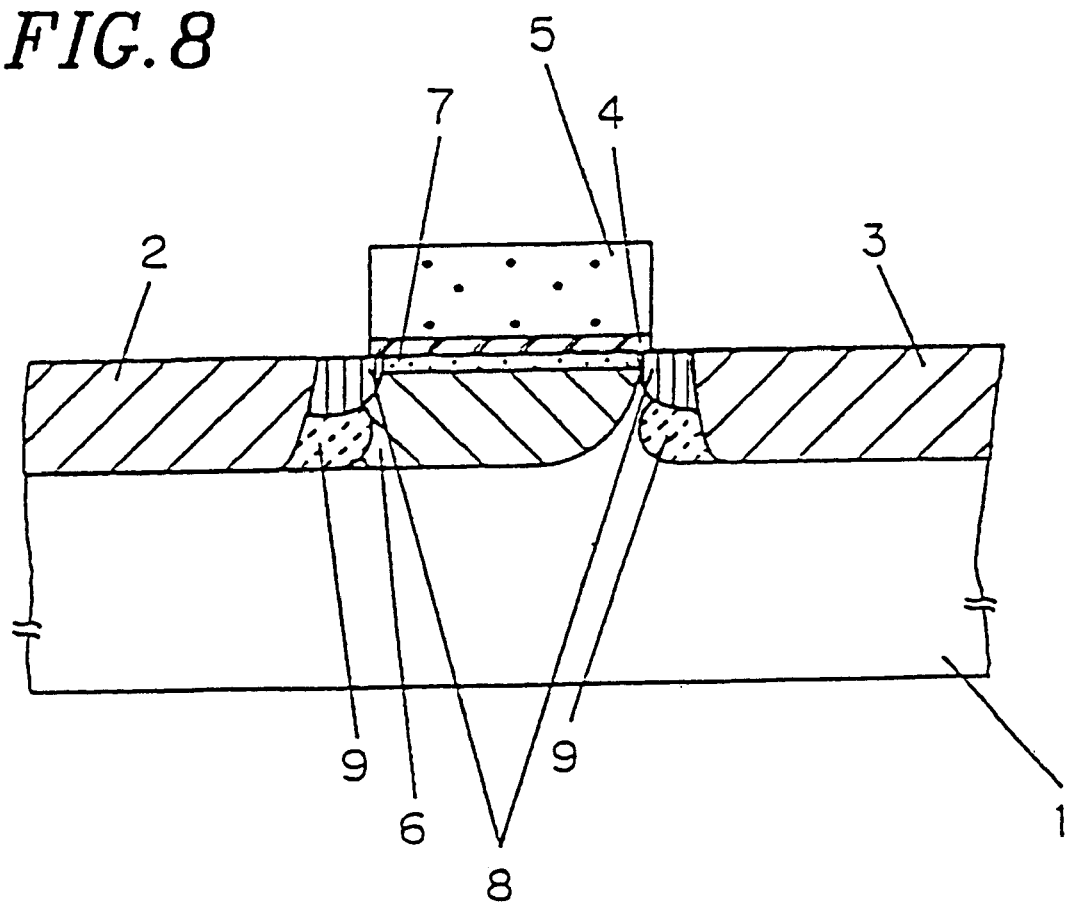
FIG. 8 is a cross-sectional view showing a semiconductor device according to an eighth example of the present invention.

FIG. 8 is a cross-sectional view showing a MOS type semiconductor device according to an eighth example of the present invention. In FIG. 8, the reference numerals denote as follows: 1 is a p-type (a first conductivity type) semiconductor substrate; 2 is a first n-type source diffusion layer; 3 is a first n-type drain diffusion layer; 4 is a gate oxide film; 5 is a gate electrode; 6 is a p-type impurity diffusion layer; 7 is a p-type low-concentration impurity diffusion layer; 8 is second n-type source/drain diffusion layers; and 9 is p-type high-concentration impurity diffusion layers.

As shown in FIG. 8, the p-type impurity diffusion layer 6 has a nonuniform impurity concentration profile along the channel length direction so that the impurity concentration on the source side is higher than the impurity concentration on the drain side. In addition, the impurity concentration of the second n-type source/drain diffusion layers 8 is set to be $1.0 \times 10^{19}$ cm$^{-3}$ or more and the thickness (junction depth D2) of these diffusion layers 8 is set to be smaller than the thickness (junction depth D1) of the first n-type source diffusion layer 2 and the first n-type drain diffusion layer 3.

The semiconductor device shown in FIG. 8 is characterized in that second p-type high-concentration impurity diffusion layers 9 are formed under the second source/drain diffusion layers 8 so as to be in contact with the side portion of the first n-type source diffusion layer 2 and that of the first n-type drain diffusion layer 3. Therefore, the extension of the potential curve from the source/drain diffusion layers in the channel direction can be effectively suppressed and the degradation in the threshold potential in the initial stage, which is adversely caused in a region having a size on the order of a quarter micron or less, can be suppressed.

The semiconductor device shown in FIG. 8 is also characterized in that a p-type low-concentration impurity diffusion layer 7 having a uniform impurity profile is formed in the channel region in the vicinity of the surface of the substrate. In a conventional LDC structure, the impurity concentration on the source side of the p-type impurity diffusion layer for controlling the threshold voltage is set at a high value, i.e., $1.0 \times 10^{18}$ cm$^{-3}$ or more, in the vicinity of the surface of the substrate for suppressing the short-channel effect. Therefore, the mobility of the carriers is considerably decreased on the source side because of the scattering of the impurity. Since the current value of a MOS type semiconductor device is determined by the behavior of the carriers on the source side, the current value is decreased in a conventional structure, and therefore a high-speed semiconductor device having high drivability cannot be obtained. However, according to the present invention, the impurity concentration in the region in the vicinity of the surface of the substrate is set to be lower, so that the mobility of the carriers is not decreased and therefore a high-speed semiconductor device having high drivability can be obtained. In addition, the thickness (junction depth D2) of the second n-type source/drain diffusion layers 8 is set to be smaller than the thickness (junction depth D1) of the first n-type source diffusion layer 2 and the first n-type drain diffusion layer 3. Therefore, the extension of the potential curve from the source/drain diffusion layers in the channel direction can be effectively suppressed and the degradation in the threshold potential in the initial stage, which is adversely caused in a region having a size on the order of a quarter micron or less, can be suppressed. Furthermore, since the second n-type source/drain diffusion layers 8 have an impurity concentration of $1.0 \times 10^{19}$ cm$^{-3}$ or more, a semiconductor device which has high drivability and is highly resistant to the short-channel effect can be obtained without causing a degradation in the drivability by the parasitic resistance. In addition, the p-type impurity diffusion layer 6 has a nonuniform impurity concentration profile along the channel length direction so that the impurity concentration on the source side is higher than the impurity concentration on the drain side. Therefore, the semiconductor device of this example is highly reliable just like the semiconductor device of the first example.

EXAMPLE 9

Figure 9A:
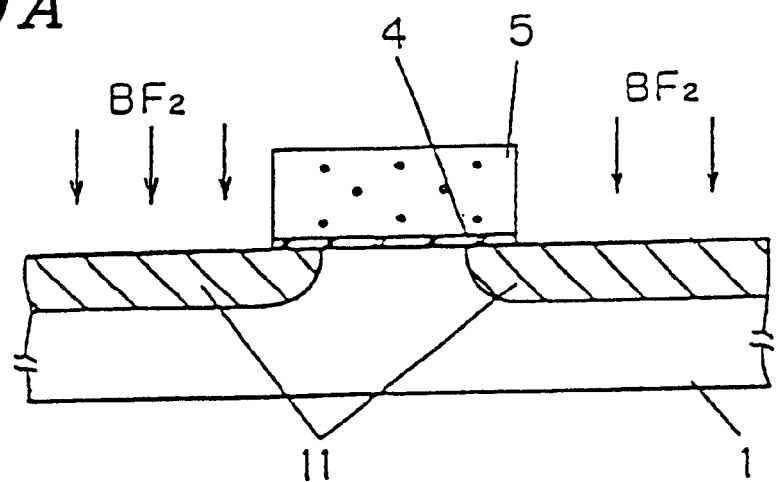
FIGS. 9A to 9C are cross-sectional views showing respective process steps for fabricating a semiconductor device according to a ninth example of the present invention.
Figure 9B:
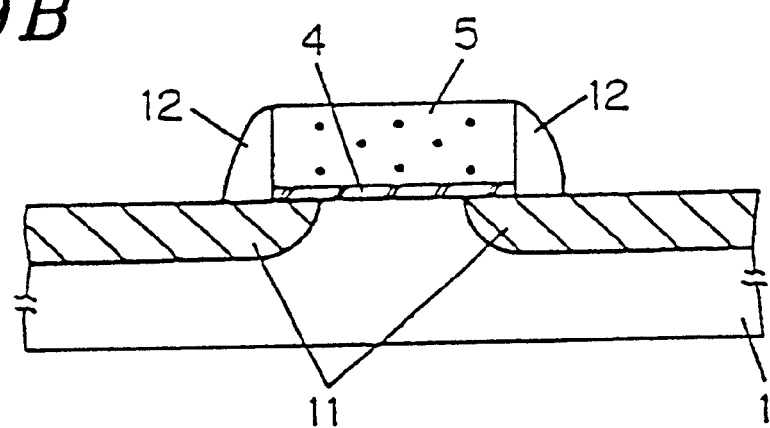
Figure 9C:
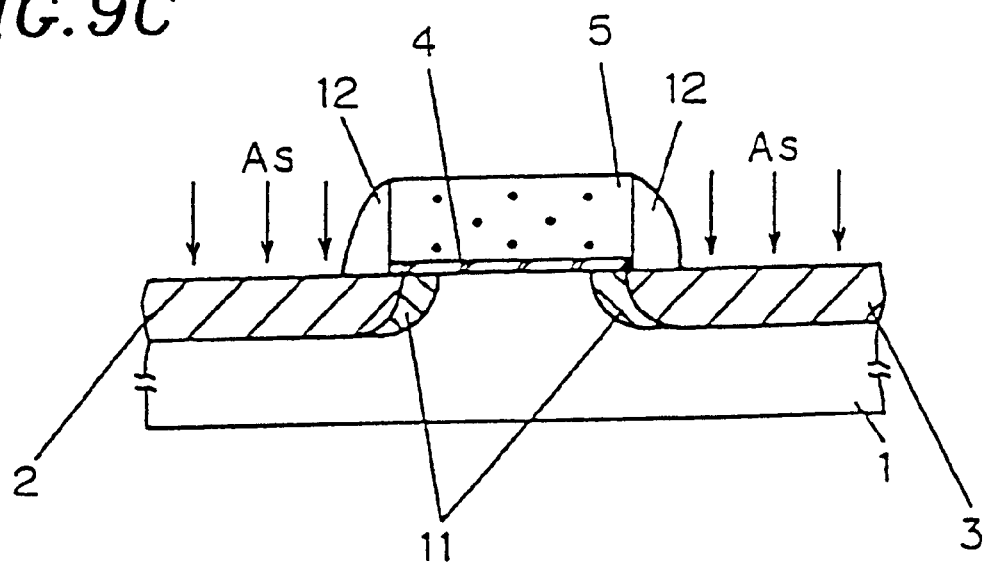

FIGS. 9A to 9C are cross-sectional views showing the respective process steps for fabricating a semiconductor device according to a ninth example of the present invention.

First, as shown in FIG. 9A, a gate oxide film 4 is formed on a principal surface of a (p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5 (gate length: 0.25 $\mu$m). Thereafter, impurity ions of a first conductivity type (p-type), e.g., BF$_2$ ions, are implanted while using the gate electrode 5 as a mask, applying an implantation energy of 80 KeV, and setting the implant dose at approximately $1.5 \times 10^{13}$ cm$^{-2}$, thereby forming p-type impurity diffusion layers 11 for controlling the threshold potential. In this case, the junction depth of the p-type impurity diffusion layers 11 finally becomes about 100 nm, and the impurity concentration of the p-type impurity diffusion layers 11 is in an approximate range of $3 \times 10^{17}$ to $1 \times 10^{18}$ cm$^{-3}$ (the impurity concentration is preferably in an approximate range of $1 \times 10^{17}$ to $3 \times 10^{18}$ cm$^{-3}$).

Next, as shown in FIG. 9B, after an oxide film is deposited so as to be about 80 nm thick, the oxide film is partially removed by anisotropic dry etching so that the oxide film is left only on the sides of the gate electrode 5, thereby forming gate side walls (or side wall spacers) 12. By adjusting the thickness of the oxide film to be deposited, the thickness of the side wall spacers 12 can be controlled.

Then, as shown in FIG. 9C, impurity ions of a second conductivity type (n-type), e.g., arsenic ions, are implanted while using the gate electrode 5 and the side wall spacers 12 as a mask, applying an implantation energy of 40 KeV, and setting the implant dose at approximately $6 \times 10^{15}$ cm$^{-2}$, thereby forming a source diffusion layer 2 and a drain diffusion layer 3. In this case, the junction depth of the source diffusion layer 2 and the drain diffusion layer 3 finally becomes about 150 nm, and the impurity concentration of the source diffusion layer 2 and the drain diffusion layer 3 is in an approximate range of $1 \times 10^{20}$ to $3 \times 10^{20}$ cm$^{-3}$ (the concentration is preferably in an approximate range of $1 \times 10^{20}$ to $5 \times 10^{20}$ cm$^{-3}$). However, the impurity concentration and the junction depth of the source diffusion layer 2 and the drain diffusion layer 3 can be appropriately selected depending upon the application and the size of the semiconductor device to be formed.

The fabrication method of this example is characterized in that the p-type impurity diffusion layers 11 for controlling the threshold potential are formed by implanting ion seeds of a first conductivity type (p-type) using the gate electrode 5 as a mask. As a result, diffusion layers having a nonuniform impurity concentration profile can be easily formed in the channel. In addition, since the ion implantation for forming the p-type impurity diffusion layers 11 is performed after forming the gate electrode, the impurity ions for forming the p-type impurity diffusion layers 11 are not implanted into the center portion of the channel, so that the impurity concentration in the center portion of the channel becomes lower than that on the source side. Therefore, a capacitance between the gate and the substrate is reduced as compared with a conventional semiconductor device having a diffusion layer in which the impurity is uniformly distributed, and therefore, a semiconductor device having high drivability can be easily fabricated.

In this specification, the distance from the end of the source diffusion layer 2 to the end of the p-type impurity diffusion layer 11 (or the length measured in the vicinity of the surface of the substrate along the channel length direction) will be referred to as a "length of the p-type impurity diffusion layer 11". In this example, the length of the respective p-type impurity diffusion layers 11 is about 100 nm. The length of the respective p-type impurity diffusion layers 11 can be controlled to a certain degree by adjusting the thickness of the side wall spacers, but is variable depending upon the diffusion distance in the lateral direction of the p-type and n-type impurity ions. The length of the respective p-type impurity diffusion layers 11 preferably occupies about 5 to 10% of the gate length so as not to decrease the field-effect mobility.

EXAMPLE 10

Figure 10A:
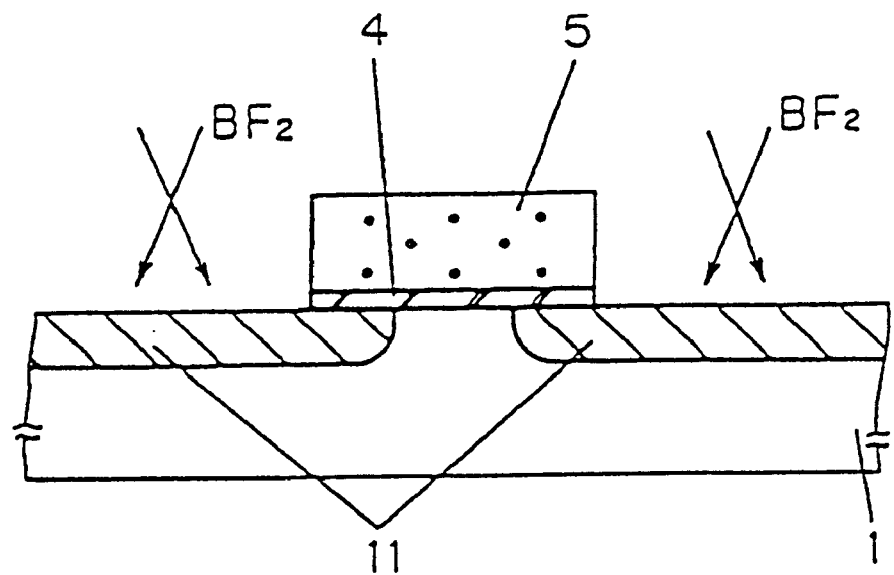
FIGS. 10A and 10B are cross-sectional views showing respective process steps for fabricating a semiconductor device according to a tenth example of the present invention.
Figure 10B:
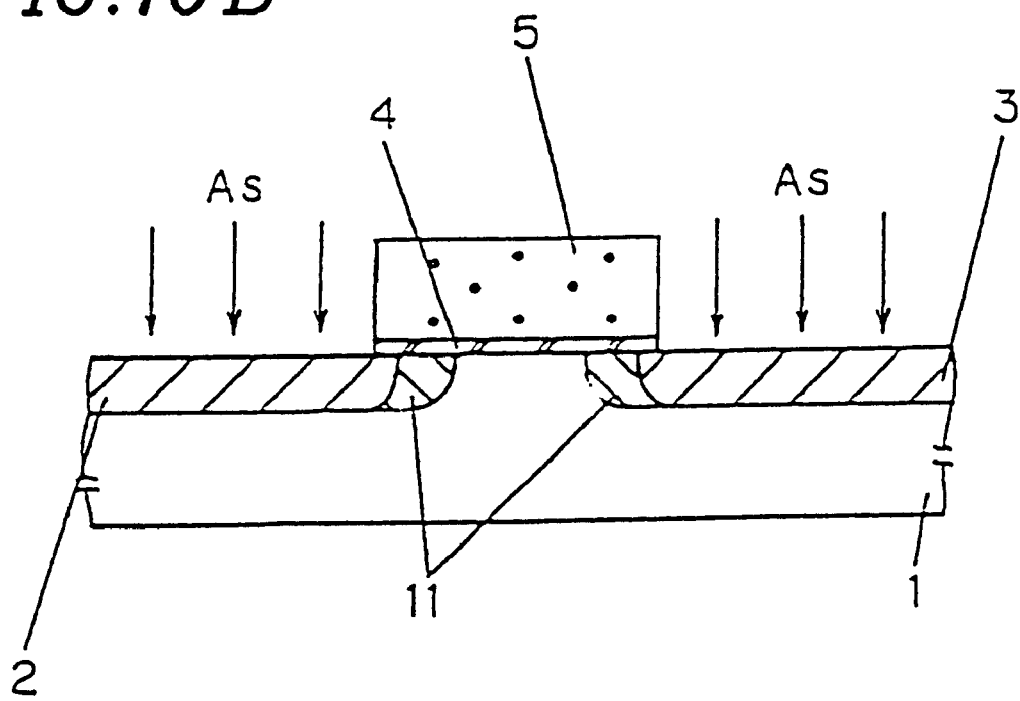

FIGS. 10A and 10B are cross-sectional views showing the respective process steps for fabricating a semiconductor device according to a tenth example of the present invention.

First, as shown in FIG. 10A, a gate oxide film 4 is formed on a principal surface of a (p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5 (gate length: 0.20 μm). Thereafter, impurity ions of a first conductivity type (p-type), e.g., $BF_2$ ions, are implanted while using the gate electrode 5 as a mask, applying an implantation energy of 80 KeV, and setting the implant dose at approximately $1.5 \times 10^{11}$ cm$^{-2}$ and the implantation angle at 7 degrees or more, e.g., 7 degrees, thereby forming p-type impurity diffusion layers 11. In this case, the junction depth and the impurity concentration of the p-type impurity diffusion layers 11 preferably fall within the ranges described in the ninth example. In this specification, an "implantation angle" refers to the angle formed between a line vertical to the principal surface of the semiconductor substrate 1 and the direction of the ions beams.

Then, as shown in FIG. 10B, impurity ions of a second conductivity type (n-type), e.g., arsenic ions, are implanted while applying an implantation energy of 40 KeV and setting the implant dose at approximately $6 \times 10^{15}$ cm$^{-2}$, thereby forming a source diffusion layer 2 and a drain diffusion layer 3. In this case, the junction depth of the source diffusion layer 2 and the drain diffusion layer 3 finally becomes about 150 nm, and the impurity concentration of the source diffusion layer 2 and the drain diffusion layer 3 is in an approximate range of $1 \times 10^{20}$ to $3 \times 10^{20}$ cm$^{-3}$.

The method for fabricating a semiconductor device of this example is characterized in that the p-type impurity diffusion layers 11 are formed by implanting impurity ions of a first conductivity type (p-type) while using the gate electrode 5 as a mask and setting the implantation angle at 7 degrees or more. By implanting the impurity ions at an angle of seven degrees or more, diffusion layers having a nonuniform impurity concentration profile can be formed in further inner regions of the channel region, and it is no longer necessary to form the side wall spacers before implanting the arsenic ions. In addition, since the ion implantation for forming the p-type impurity diffusion layers 11 is performed after forming the gate electrode, the impurity ions for forming the p-type impurity diffusion layers 11 are not implanted into the center portion of the channel, so that the impurity concentration in the center portion of the channel becomes lower than that on the source side. Therefore, a capacitance between the gate and the substrate is reduced as compared with a conventional semiconductor device having diffusion layers in which the impurity is uniformly distributed, and therefore, a semiconductor device having high drivability can be easily fabricated.

EXAMPLE 11

Figure 11A:
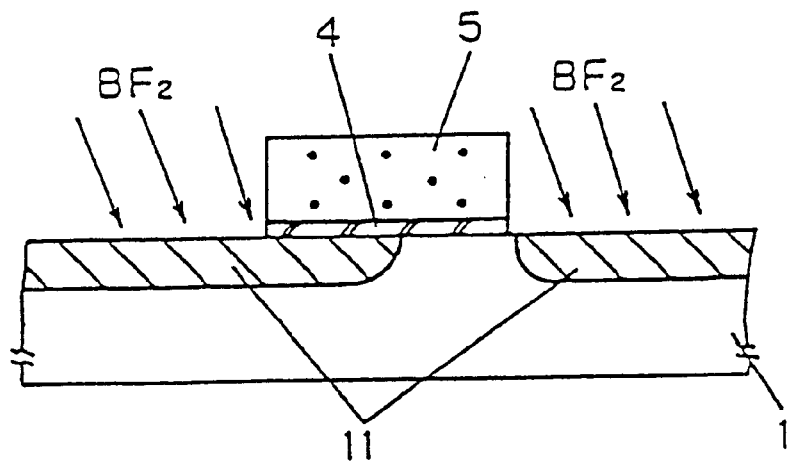
FIGS. 11A to 11C are cross-sectional views showing respective process steps for fabricating a semiconductor device according to an eleventh example of the present invention.
Figure 11B:
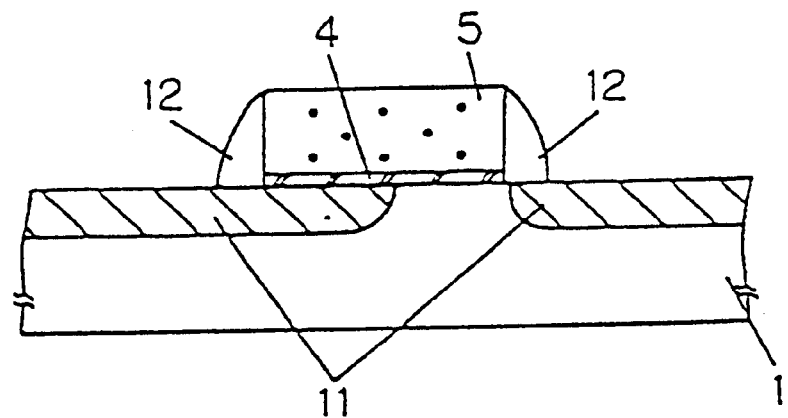
Figure 11C:
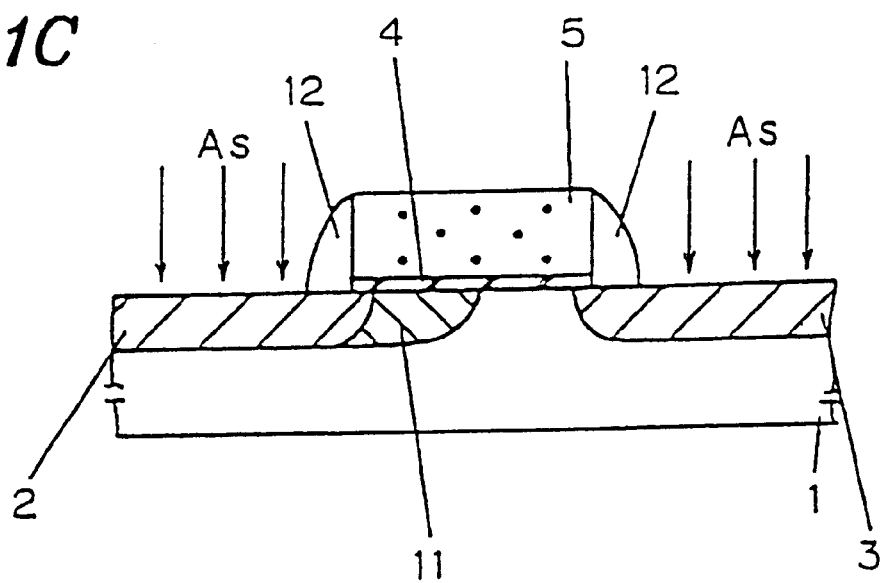

FIGS. 11A to 11C are cross-sectional views showing the respective process steps for fabricating a semiconductor device according to an eleventh example of the present invention.

First, as shown in FIG. 11A, a gate oxide film 4 is formed on a principal surface of a (p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5 (gate length: 0.15 μm).

Thereafter, impurity ions of a first conductivity type (p-type), e.g., $BF_2$ ions, are implanted from the source side while using the gate electrode 5 as a mask, applying an implantation energy of 80 KeV, and setting the implant dose at approximately $1.5 \times 10^{13}$ cm$^{-2}$ and the implantation angle at seven degrees or more, e.g., 7 degrees, thereby forming a p-type impurity diffusion layer 11 on the source side only. In this example, the junction depth of the p-type impurity diffusion layer 11 is about 100 nm and the impurity concentration thereof is about $1 \times 10^{18}$ cm$^{-3}$.

Next, as shown in FIG. 11B, after an oxide film is deposited so as to be about 80 nm thick, the oxide film is partially removed by anisotropic dry etching so that the oxide film is left only on the sides of the gate electrode 5, thereby forming gate side walls (or side wall spacers) 12.

Then, as shown in FIG. 11C, impurity ions of a second conductivity type (n-type), e.g., arsenic ions, are implanted while applying an implantation energy of 40 KeV and setting the implant dose at approximately $4 \times 10^{15}$ cm$^{-2}$, thereby forming a source diffusion layer 2 and a drain diffusion layer 3. In this case, the junction depth of the source diffusion layer 2 and the drain diffusion layer 3 finally becomes about 120 nm, and the impurity concentration of the source diffusion layer 2 and the drain diffusion layer 3 is in an approximate range of $1 \times 10^{20}$ to $3 \times 10^{20}$ cm$^{-3}$.

The method for fabricating a semiconductor device of this example is characterized in that the p-type impurity diffusion layer 11 is formed on the source side only by implanting the ion seeds of a first conductivity type (p-type) from the source side while using the gate electrode 5 as a mask and setting the implantation angle at 7 degrees or more. As a result, an asymmetric diffusion layer having a nonuniform impurity concentration profile in the channel so that the impurity concentration on the source side is higher than the impurity concentration on the drain side can be easily formed without performing an additional masking process step.

Furthermore, by implanting the ion seeds of the first conductivity type at an angle of seven degrees or more, the thickness (junction depth) of the diffusion layer 11 can be set to be smaller than the thickness (junction depth) of the source diffusion layer 2. As a result, the impurity concentration in the region of the semiconductor substrate 1 just under the source diffusion layer 2 can be set to be lower than the impurity concentration on the source side of the diffusion layer 11 having an asymmetric concentration profile. In this example, the impurity concentration in the region of the semiconductor substrate 1 just under the source diffusion layer 2 is in an approximate range of $1 \times 10^{17}$ to $2 \times 10^{17}$ cm$^3$.

According to this fabrication method, the semiconductor device shown in FIG. 1 can be easily formed.

EXAMPLE 12

Figure 12A:
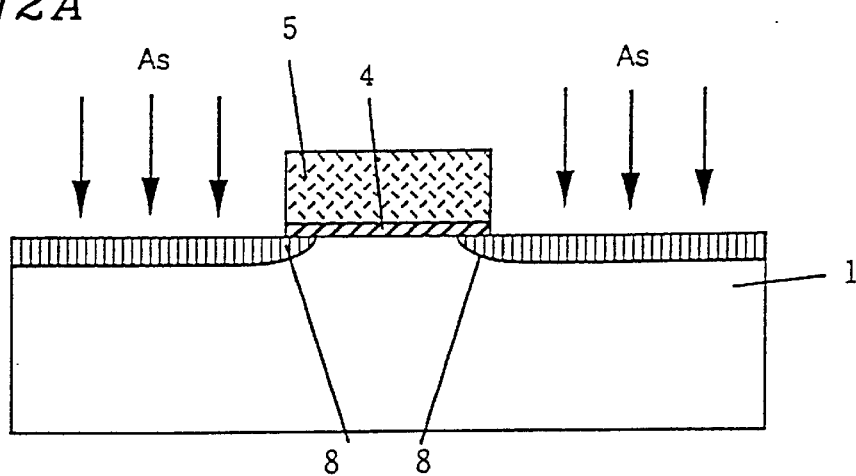
FIGS. 12A to 12C are cross-sectional views showing respective process steps for fabricating, a semiconductor device according to a twelfth example of the present invention.
Figure 12B:
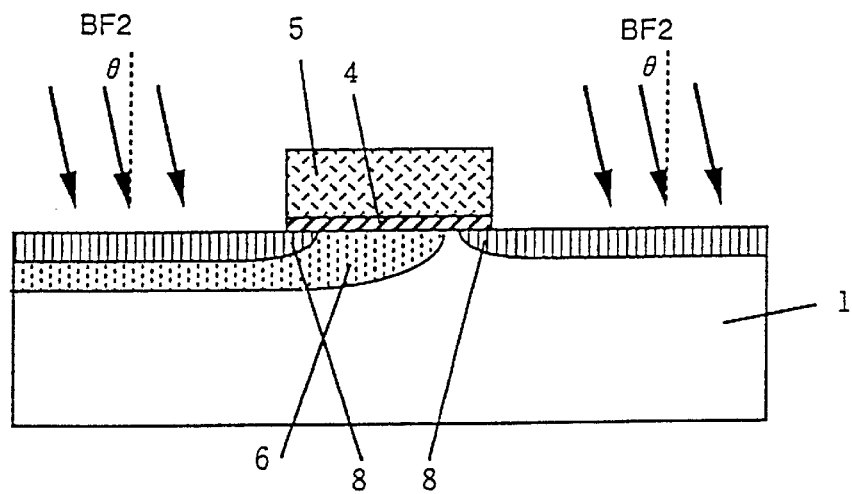
Figure 12C:
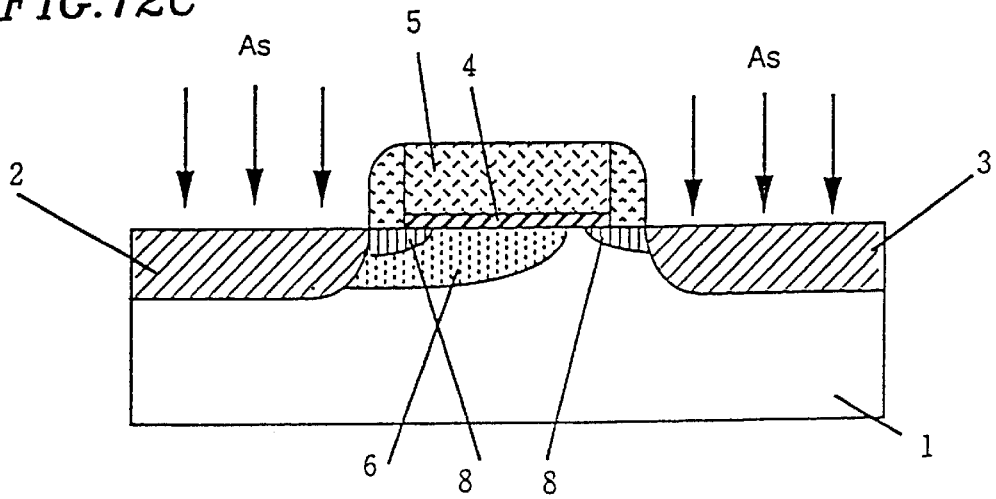

FIGS. 12A to 12C are cross-sectional views showing the respective process steps for fabricating a semiconductor device according to a twelfth example of the present invention.

First, as shown in FIG. 12A, a gate oxide film 4 is formed on a principal surface of a (p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5 (gate length: 0.15 μm). In this example, the thickness of the gate oxide film 4 is 4 nm and the conductive film to be used as a gate electrode 5 is made of polycrystalline silicon.

Thereafter, impurity ions of a second conductivity type (n-type), e.g., arsenic ions, are implanted while using the gate electrode 5 as a mask, applying an implantation energy of 10 KeV, and setting the implant dose at approximately $1 \times 10^{14}$ cm$^{-2}$, thereby forming second source/drain diffusion layers 8 of a second conductivity type (n-type).

Then, as shown in FIG. 12B, impurity ions of a first conductivity type (p-type), e.g., BF$_2$ ions, are implanted from the source side while using the gate electrode 5 as a mask, applying an implantation energy, of 80 KeV, and setting the implant dose at approximately $1 \times 10^{13}$ cm$^{-2}$ and the implantation angle at seven degrees or more, e.g., 7 degrees, thereby forming a p-type impurity diffusion layer 6 on the source side only.

Next, as shown in FIG. 12C, after an oxide film is deposited so as to be about 80 nm thick, the oxide film is partially removed by anisotropic dry etching so that the oxide film is left only on the sides of the gate electrode 5, thereby forming gate side walls (or side wall spacers) 12.

Then, impurity ions of a second conductivity type (n-type), e.g., arsenic ions, are implanted while applying an implantation energy of 40 KeV and setting the implant dose at approximately $6 \times 10^{15}$ cm$^{-2}$, thereby forming a source diffusion layer 2 and a drain diffusion layer 3.

The method for fabricating a semiconductor device of this example is characterized by including a process step of forming the second source/drain diffusion layers 8 of the second conductivity type (n-type) by implanting ion seeds of a second conductivity type (n-type), e.g., arsenic ions, while using the gate electrode as a mask, applying an implantation energy of 10 KeV and setting the implant dose at approximately $1 \times 10^{14}$ cm$^{-2}$, and a process step of forming the p-type impurity diffusion layer 6 by implanting the impurity ions of a first conductivity type (p-type), e.g., BF$_2$ ions, from the source side while using the gate electrode 5 as a mask, applying an implantation energy of 80 KeV, and setting the implant dose at approximately $1 \times 10^{13}$ cm$^{-2}$ and the implantation angle at 7 degrees or more.

FIG. 15 is a two-dimensional cross-sectional view showing the process simulation results obtained by analyzing the impurity concentration profile during the process steps for fabricating the semiconductor device of this example in which the simulation is performed.

As is apparent from the results, first, if the second n-type source/drain diffusion layers 8 are formed by implanting arsenic ions while using the gate electrode 5 as a mask, applying an implantation energy of 10 KeV and setting the implant dose at approximately $1 \times 10^{14}$ cm$^{-2}$, then the junction depth of the diffusion layers 8 becomes about 40 nm.

Since the junction depth of the first n-type source/drain diffusion layers 2 and 3 is about 100 nm, it is possible to sufficiently suppress the extension of the electrostatic potential curve from the second n-type source/drain diffusion layers 8 in the channel direction as compared with a conventional device, so that a MOS type semiconductor device highly resistant to the decrease in the threshold potential caused by the short-channel effect can be fabricated.

In addition, the impurity concentration of the second n-type source/drain diffusion layers 8 becomes $1 \times 10^{19}$ cm$^{-3}$ or more. When the impurity concentration is at such a value, second n-type source/drain diffusion layers 8 having a sufficiently low resistance can be formed without causing the decrease in the parasitic resistance.

Figure 16:
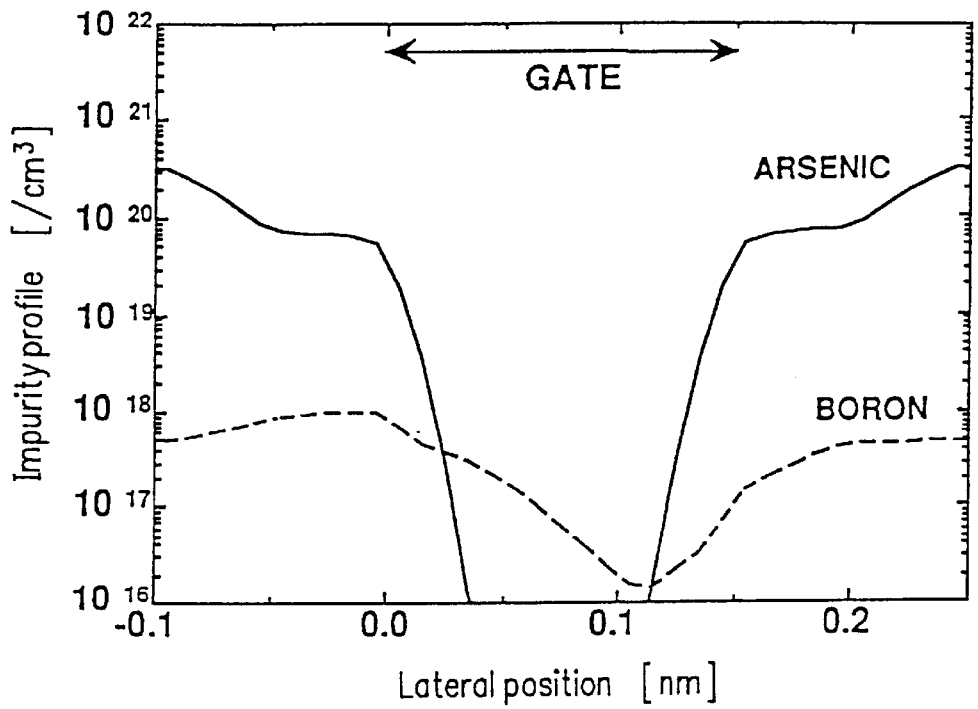
FIG. 16 is a graph showing one-dimensionally the simulation results of the impurity profile according to the third example of the present invention.

As is also apparent from FIG. 15, if the p-type impurity diffusion layer 6 for controlling the threshold potential is formed by implanting the p-type impurity ions, e.g., BF$_2$ ions, from the source side while using the gate electrode 5 as a mask, applying an implantation energy of 80 KeV, and setting the implant dose at approximately $1 \times 10^{13}$ cm$^{-2}$ and the implantation angle at 7 degrees or more, then the p-type impurity diffusion layer 6 comes to have a nonuniform impurity concentration profile along the channel length direction so that the impurity concentration on the source side is higher than the impurity concentration on the drain side. In order to show the result more clearly, FIG. 16 shows one-dimensionally the simulation results of the impurity profile in the surface region of the channel. As shown in FIG. 16, the concentration of boron ions of the first conductivity type (p-type) gradually decreases from the source side to the drain side in the surface region of the channel. More specifically, the impurity concentration on the source side is about $4 \times 10^{17}$ cm$^{-2}$, whereas the impurity concentration in the end portion of the drain is as low as about $1 \times 10^{16}$ cm$^{-3}$. As described in the third example, such a p-type impurity diffusion layer, having an asymmetric concentration profile, for controlling the threshold potential increases the electric field on the source side and accelerates the speed of the electrons. In such a region having a size on the order of a quarter micron or less as the region formed in this example, in particular, an overshoot is generated in the speed of the electrons, thereby drastically increasing the drain current value and the trans-conductance.

In addition, by performing the ion implantation process step of implanting the p-type impurity ions, e.g., BF$_2$ ions, from the source side while using the gate electrode 5 as a mask, applying an implantation energy of 80 KeV, and setting the implant dose at approximately $1 \times 10^{13}$ cm$^{-2}$ and the implantation angle at 7 degrees or more, not only the p-type impurity diffusion layer 6 for controlling the threshold potential can be formed, but also a pair of p-type high-concentration diffusion layers can be formed under the second n-type source/drain diffusion layers 8. The impurity concentration of the p-type high-concentration diffusion layers is $1 \times 10^{18}$ cm$^{-3}$ or more on the source side and $3 \times 10^{17}$ cm$^{-3}$ or more on the drain side. By forming these p-type high-concentration diffusion layers, the extension of the electrostatic potential curve from the first n-type source/drain diffusion layers 2 and 3 in the channel direction can be effectively suppressed, and a semiconductor device highly resistant to the short-channel effect in a region having a size of a quarter micron or less is realized.

Furthermore, the concentration of the p-type impurity ions under the first n-type source/drain diffusion layers 2 and 3 is approximately $1 \times 10^{17}$ cm$^{-3}$ so that the parasitic junction capacitance between the source and the substrate is not increased.

According to the fabrication method of this example, it is no longer necessary to perform an additional masking process step which is required in the method for fabricating a conventional LDC structure. If an additional masking process step is necessary for a currently available method for fabricating a semiconductor device, then the fabrication period of a VLSI is adversely prolonged and the fabrication cost is disadvantageously increased. However, according to the fabrication method of the invention, a semiconductor device recited in claim 3 can be easily fabricated during a short period of time and at a lower cost.

In this example, after the second n-type source/drain diffusion layers 8 are formed by implanting n-type impurity ions using the gate electrode 5 as a mask, the p-type impurity diffusion layer 6 is formed by implanting the p-type impurity ions. However, the present invention is not limited thereto. Alternatively, after the p-type impurity diffusion layer 6 is formed by implanting p-type impurity ions using the gate electrode 5 as a mask, the second n-type source/drain diffusion layers 8 may be formed by implanting the n-type impurity ions.

EXAMPLE 13

Figure 13A:
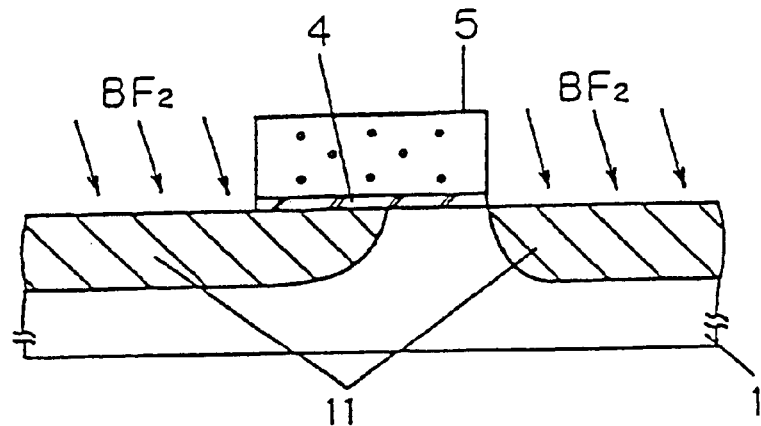
FIGS. 13A to 13C are cross-sectional views showing respective process steps for fabricating a semiconductor device according to a thirteenth example of the present invention.
Figure 13B:
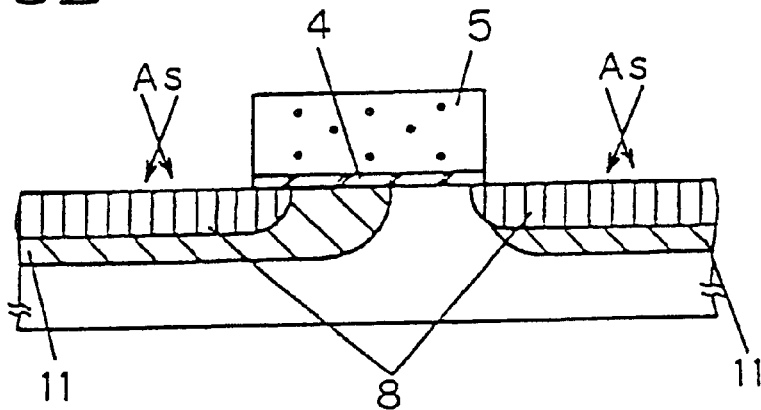
Figure 13C:
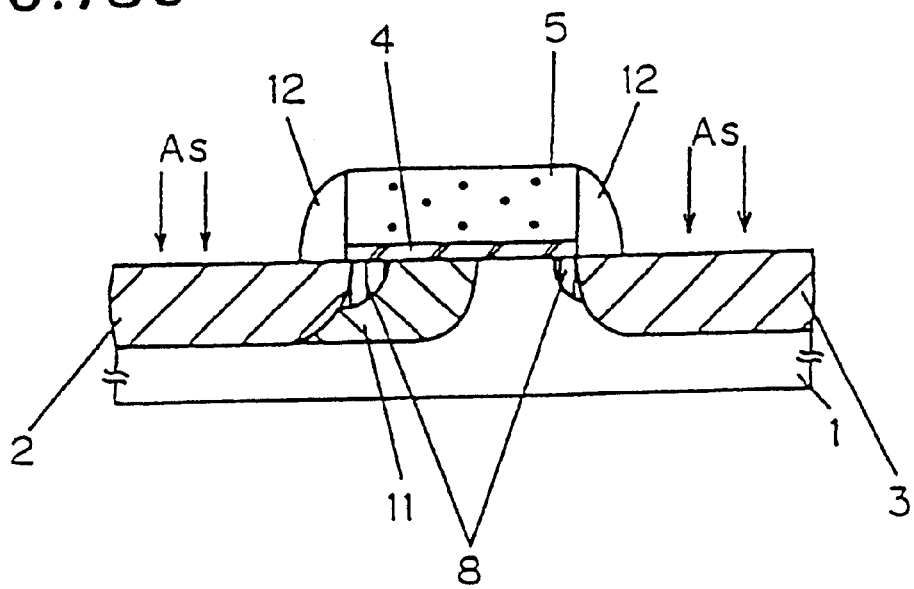
Figure 14:
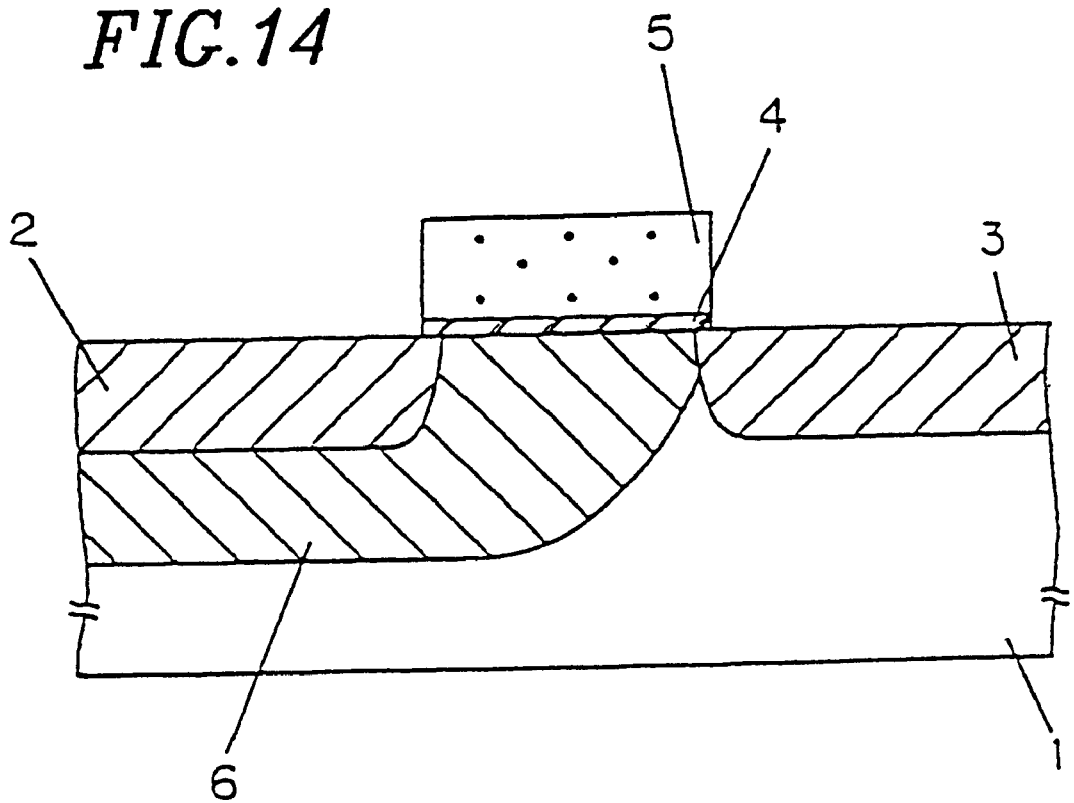
FIG. 14 is a cross-sectional view showing a conventional semiconductor device.

FIGS. 13A to 13C are cross-sectional views showing the respective process steps for fabricating a semiconductor device according to a thirteenth example of the present invention.

First, as shown in FIG. 13A, a gate oxide film 4 is formed on a principal surface of a (p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5. Thereafter, impurity ions of a first conductivity type (p-type), e.g., $BF_2$ ions, are implanted from the source side while using the gate electrode 5 as a mask, applying an implantation energy of 80 KeV, and setting the implant dose at approximately $1\times10^{13}$ cm$^{-2}$ and the implantation angle at 7 degrees or more, e.g., 7 degrees, thereby forming p-type impurity diffusion layers 11.

Next, as shown in FIG. 13B, impurity ions of a second conductivity type (n-type), e.g., arsenic ions, are implanted from the source side while applying an implantation energy of 10 KeV and setting the implant dose at approximately $1\times10^{14}$ cm$^{-2}$ and the implantation angle at 7 degrees or more, e.g., 7 degrees. Thereafter, impurity ions of a second conductivity type (n-type), e.g., arsenic ions, are implanted from the drain side while applying an implantation energy of 10 KeV and setting the implant dose at approximately $2\times10^{13}$ cm$^{-2}$ and the implantation angle at 7 degrees or more, e.g., 7 degrees. By performing these ion implantation process steps, the second source/drain diffusion layers 8 of the second conductivity type (n-type) are formed.

Next, as shown in FIG. 13C, after an oxide film is deposited so as to be about 80 nm thick, the oxide film is partially removed by anisotropic dry etching so that the oxide film is left only on the sides of the gate electrode 5, thereby forming gate side walls 12. Then, impurity ions of a second conductivity type (n-type), e.g., arsenic ions, are implanted while applying an implantation energy of 40 KeV and setting the implant dose at approximately $6\times10^{15}$ cm$^{-2}$, thereby forming the source/drain diffusion layers 2 and 3.

The fabrication method of this example is characterized in that, in forming the second source/drain diffusion layers 8 of the second conductivity type by implanting the ion seeds of a second conductivity type while using the gate electrode 5 as a mask and setting the implantation angle at 7 degrees or more, the implant dose of the impurity ions from the source side is set to be larger than the implant dose of the impurity ions from the drain side. Therefore, the carrier density in the second source diffusion layer 8 of a second conductivity type is not offset by the impurity concentration of the asymmetric diffusion layer 11 of the first conductivity type and a source diffusion layer 8 having an effectively high concentration can be formed. Therefore, the parasitic resistance is not decreased even in the second source diffusion layer having a shallow junction depth.

EXAMPLE 14

Figure 23:
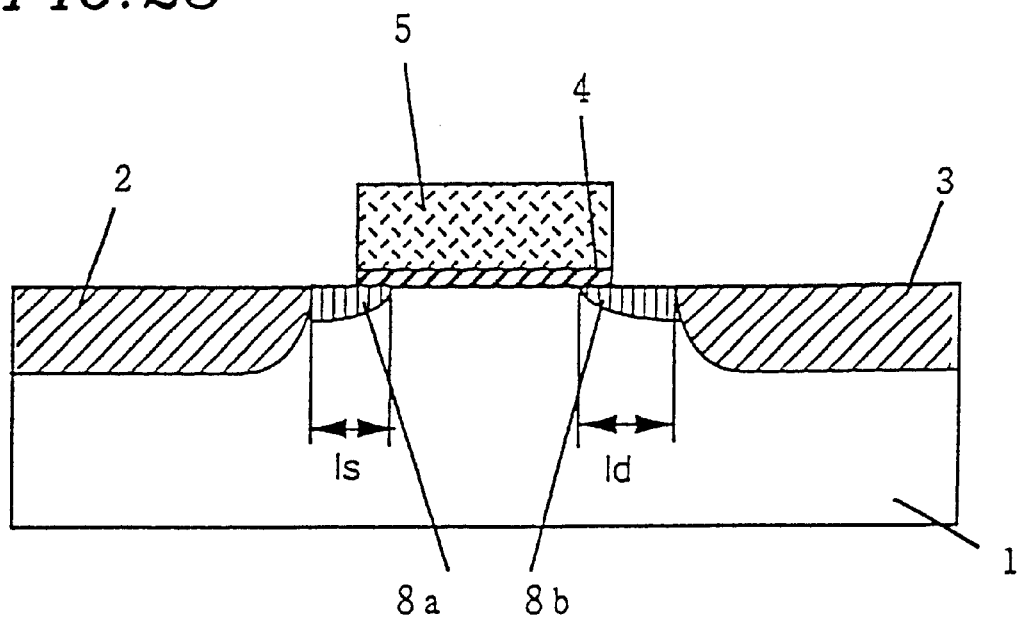
FIG. 23 is a cross-sectional view showing a semiconductor device according to a fourteenth example of the present invention.

FIG. 23 is a cross-sectional view showing a MOS type semiconductor device according to a fourteenth example of the present invention. In FIG. 23, the reference numerals denote as follows: 1 is a p-type (a first conductivity type) semiconductor substrate; 2 is a first n-type (second conductivity type) high-concentration source diffusion layer; 3 is a first n-type high-concentration drain diffusion layer; 4 is a gate oxide film; 5 is a gate electrode; 8a is a second n-type high-concentration source diffusion layer; and 8b is a second n-type high-concentration drain diffusion layer.

The semiconductor device of this example is characterized in that the junction depth (in an approximate range of 40 to 50 nm) of the second n-type source diffusion layer 8a and the second n-type drain diffusion layer 8b is shallower than the junction depth (in an approximate range of 120 to 150 nm) of the first n-type source/drain diffusion layers 2 and 3, and that the length 1s of the second n-type source diffusion layer 8a along the channel length direction is shorter than the length of the length 1d of the second n-type drain diffusion layer 8b along the channel length direction. In this example, the length 1s is about 0.03 $\mu$m and the length 1d is about 0.05 $\mu$m.

Since the junction depth of the second n-type source diffusion layer Sa and the second n-type drain diffusion layer 8b is shallower than the junction depth of the first n-type source/drain diffusion layers 2 and 3, the extension of the potential curve from the source/drain diffusion layers in the channel direction can be effectively suppressed when a voltage is applied to the source/drain diffusion layers. Therefore, the decrease in the threshold potential, which is adversely caused in a region having dimensions on the order of a quarter micron or less in a conventional LDC or LDD structure, can be suppressed.

On the other hand, in a MOS type semiconductor device in general, if the channel length is set to be shorter, then the transconductance of the channel decreases in inverse proportion to the channel length. However, the parasitic resistance of the source/drain diffusion layers is not scaled down or reduced. Therefore, in order to improve the electric characteristics and the drivability of a MOS type semiconductor device having a fine size on the order of a quarter micron or less, it is indispensable to reduce the parasitic resistance in the source/drain diffusion layers.

The parameters for determining the parasitic resistance in the source/drain diffusion layers include: the impurity concentrations in the source/drain diffusion layers; the junction depths of the source/drain diffusion layers; the lengths of the source/drain diffusion layers; and the widths of the source/drain diffusion layers. In the embodiments of the present invention, the shorter the lengths of the source/drain diffusion layers become, the smaller the parasitic resistance of the source/drain diffusion layers becomes.

On the other hand, the sum of the length of the source diffusion layer and that of the drain diffusion layer is also a factor for suppressing the short-channel effect. That is to say, in order to suppress the short-channel effect in a region having a size on the order of a quarter micron or less, the sum of the length 1s of the source diffusion layer and the length 1d of the drain diffusion layer is required to be equal to or larger than a certain distance.

$$1s+1d>2\cdot1min$$

In the saturated region determining the characteristics of a circuit, the drain conductance is smaller than the transconductance in a conventional device. Therefore, the saturated current value and the transconductance are affected only by the parasitic resistance of the source diffusion layer. Therefore, by setting the length of the source diffusion layer to be zero and the length of the drain diffusion layer to be 2·1 min, an optimal solution can be obtained.

However, in a device formed in a region having a size on the order of a quarter micron or less, the drain conductance is not negligible as compared with the transconductance. Therefore, the parasitic resistance of the drain diffusion layer slightly affects the drivability of the semiconductor device. Accordingly, if the length 1s of the source diffusion layer is reduced as much as possible while maintaining the sum of the length 1s of the source diffusion layer and the length 1d of the drain diffusion layer to be constant in a MOS type semiconductor device having a fine size on the order of a quarter micron or less, the drivability of the device can be effectively improved while suppressing the short-channel effect.

In this example, the length 1s of the second n-type source diffusion layer 8a is shorter than the length 1d of the second n-type drain diffusion layer 8b, so that the parasitic resistance of the second n-type source diffusion layer 8a is at a lower level than the level of the parasitic resistance of the second n-type drain diffusion layer 8b. Therefore, a MOS type semiconductor device highly resistant to the decrease in the threshold potential caused by the short-channel effect can be formed in a region having a size on the order of a quarter micron or less without decreasing the drivability thereof.

EXAMPLE 15

Figure 24:
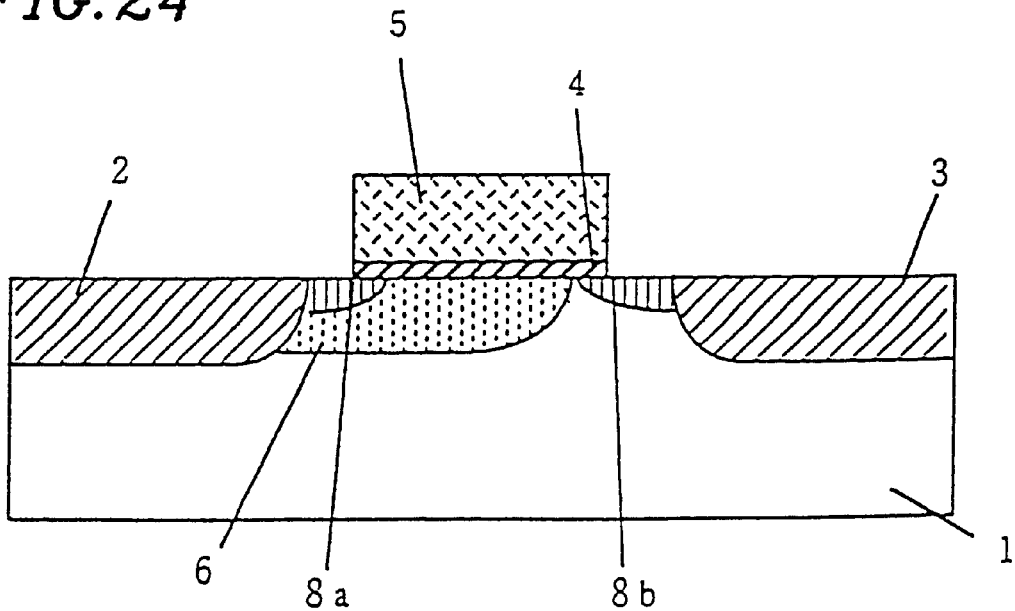
FIG. 24 is a cross-sectional view showing a semiconductor device according to a fifteenth example of the present invention.

FIG. 24 is a cross-sectional view showing a MOS type semiconductor device according to a fifteenth example of the present invention. In FIG. 24, the reference numerals denote as follows: 1 is a p-type (a first conductivity type) semiconductor substrate; 2 is a first n-type (second conductivity type) high-concentration source diffusion layer; 3 is a first n-type high-concentration drain diffusion layer; 4 is a gate oxide film; 5 is a gate electrode; 6 is a p-type impurity diffusion layer; 8a is a second n-type high-concentration source diffusion layer; and 8b is a second n-type high-concentration drain diffusion layer.

The semiconductor device of this example is different from the semiconductor device shown in FIG. 23 (of the fourteenth example) in that the p-type impurity diffusion layer 6 has a nonuniform concentration profile along the channel length direction so that the impurity concentration on the source side is higher than the impurity concentration on the drain side. The p-type impurity diffusion layer 6 shown in FIG. 24 has the same function as that of the p-type impurity diffusion layer 6 of the semiconductor device shown in FIG. 1. Therefore, the semiconductor device of this example can exhibit a higher drivability than that of the semiconductor device shown in FIG. 23, and can be operated at a higher speed with higher reliability.

EXAMPLE 16

Figure 25:
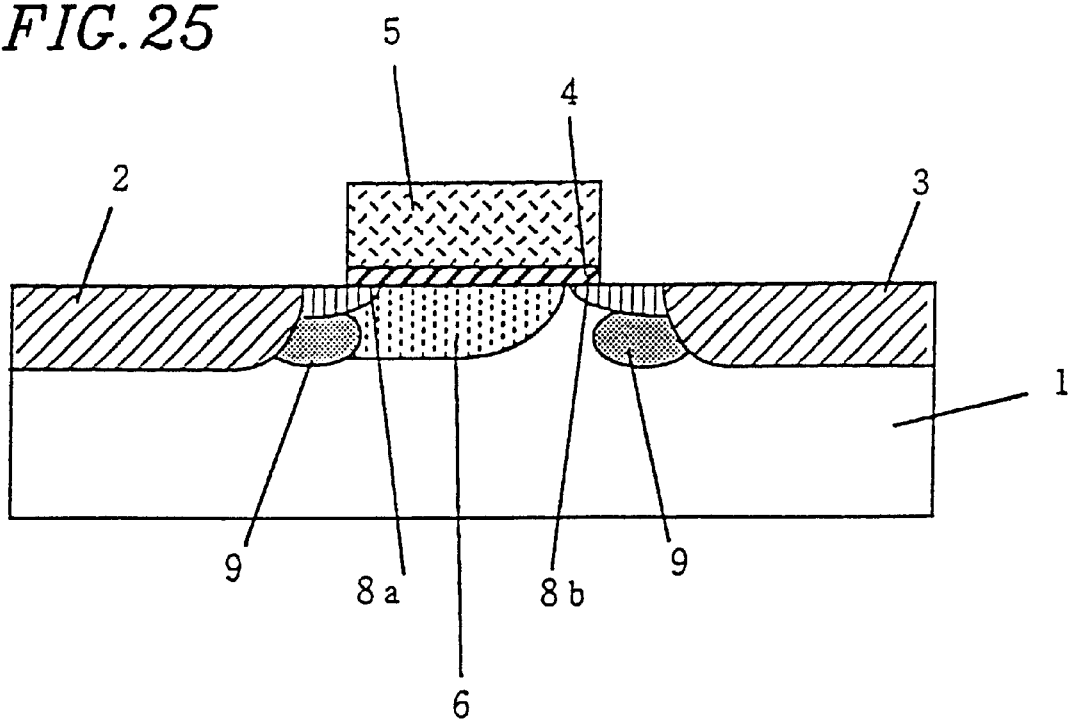
FIG. 25 is a cross-sectional view showing a semiconductor device according to a sixteenth example of the present invention.

FIG. 25 is a cross-sectional view showing a MOS type semiconductor device according to a sixteenth example of the present invention. In FIG. 25, the reference numerals denote as follows: 1 is a p-type (a first conductivity type) semiconductor substrate; 2 is a first n-type (second conductivity type) high-concentration source diffusion layer; 3 is a first n-type high-concentration drain diffusion layer; 4 is a gate oxide film; 5 is a gate electrode; 6 is a p-type impurity diffusion layer; 8a is a second n-type high-concentration source diffusion layer; 8b is a second n-type high-concentration drain diffusion layer; and 9 is p-type high-concentration diffusion layers.

The semiconductor device of this example is different from the semiconductor device shown in FIG. 24 in that the p-type high-concentration diffusion layers 9 are formed under the second n-type high-concentration source/drain diffusion layers 8a and 8b. Therefore, as described in the seventh example, it is possible to effectively suppress the extension of the potential curve from the source/drain diffusion layers in the channel direction and further suppress the decrease in the threshold potential which is adversely caused in a region having dimensions on the order of a quarter micron or less.

EXAMPLE 17

Figure 26A:
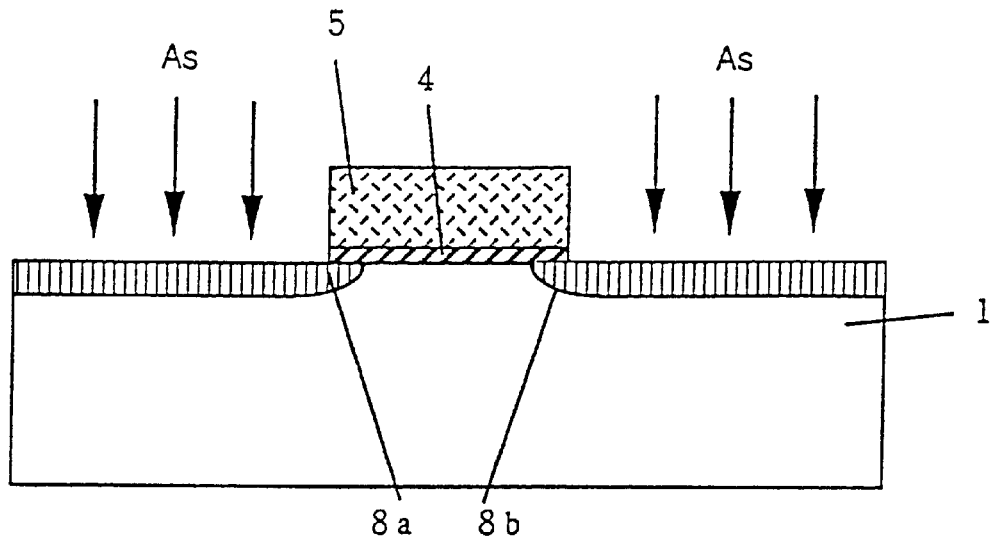
FIGS. 26A and 26B are cross-sectional views showing respective process steps for fabricating a semiconductor device according to a seventeenth example of the present invention.
Figure 26B:
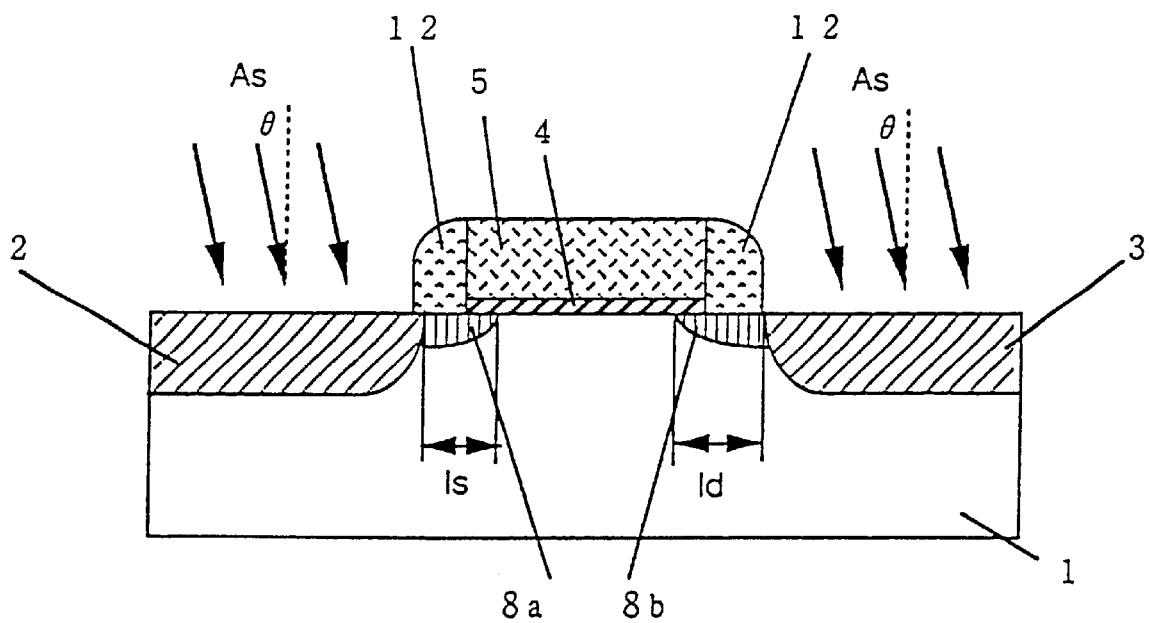

FIGS. 26A and 26B are cross-sectional views showing the respective process steps for fabricating a semiconductor device according to a seventeenth example of the present invention.

First, as shown in FIG. 26A, a gate oxide film 4 is formed on a principal surface of a .(p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5. Thereafter, impurity ions of a second conductivity type (n-type), e.g., arsenic ions, are implanted while using the gate electrode 5 as a mask, applying an implantation energy of 10 KeV, and setting the implant dose at approximately $1 \times 10^{14}$ cm$^{-2}$, thereby forming second n-type source/drain diffusion layers 8a and 8b.

Next, as shown in FIG. 26B, after an oxide film is deposited so as to be about 80 nm thick, the oxide film is partially removed by anisotropic dry etching so that the oxide film is left only on the sides of the gate electrode 5, thereby forming gate side walls 12. Then, impurity ions of a second conductivity type, e.g., arsenic ions, are implanted from the source side while using the gate electrode 5 and the gate side walls 12 as a mask, applying an implantation energy of 40 KeV and setting the implant dose at approximately $6 \times 10^{15}$ cm$^{-2}$ and the implantation angle θ at seven degrees or more, thereby forming the first n-type source/drain diffusion layers 2 and 3.

The fabrication method of this example is characterized in that the first n-type source/drain diffusion layers 2 and 3 are formed by implanting impurity ions of the second conductivity type, e.g., arsenic ions, from the source side while using the gate electrode 5 and the gate side walls 12 as a mask, applying an implantation energy of 40 KeV and setting the implant dose at approximately $6 \times 10^{15}$ cm$^{-2}$ and the implantation angle at seven degrees or more. By implanting the impurity ions from the source side at an angle of seven degrees or more during this process step, not only the first n-type source/drain diffusion layers 2 and 3 but also the second n-type source/drain diffusion layers 8a and 8b are formed so that the length 1s of the second n-type source diffusion layer 8a as shown in FIG. 26B is shorter than the length 1d of the second n-type drain diffusion layer 8b. In this case, the length 1s of the second n-type source diffusion layer 8a is controlled by the film thickness Ls of the gate side wall 12, while the length 1d of the second n-type drain diffusion layer 8b is controlled by the film thickness Ls of the gate side wall 12, the height of the gate electrode 5 and the implantation angle. In this example, the length 1s of the second n-type source diffusion layer 8a is substantially equal to the film Thickness Ls of the gate side wall 12, i.e., about 80 nm, and the length 1d of the second n-type drain diffusion layer 8b is equal to the sum of the film thickness Ls of the gate side wall 12 and tan (7°) of the height (250 nm) of the gate electrode 5, i.e., 80+30=110 nm.

That is to say, by performing this process step, the lengths 1s and 1d can be independently controlled by the height Ls and the implantation angle. Therefore, these lengths can be set at optimal values so that the semiconductor device can exhibit higher resistance to the short-channel effect and higher drivability.

EXAMPLE 18

Figure 27A:
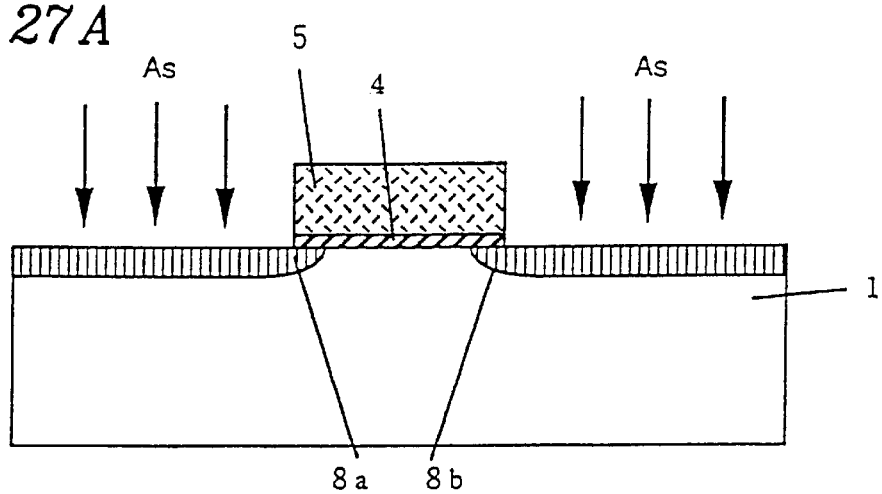
FIGS. 27A to 27C are cross-sectional views showing respective process steps for fabricating a semiconductor device according to an eighteenth example of the present invention.
Figure 27B:
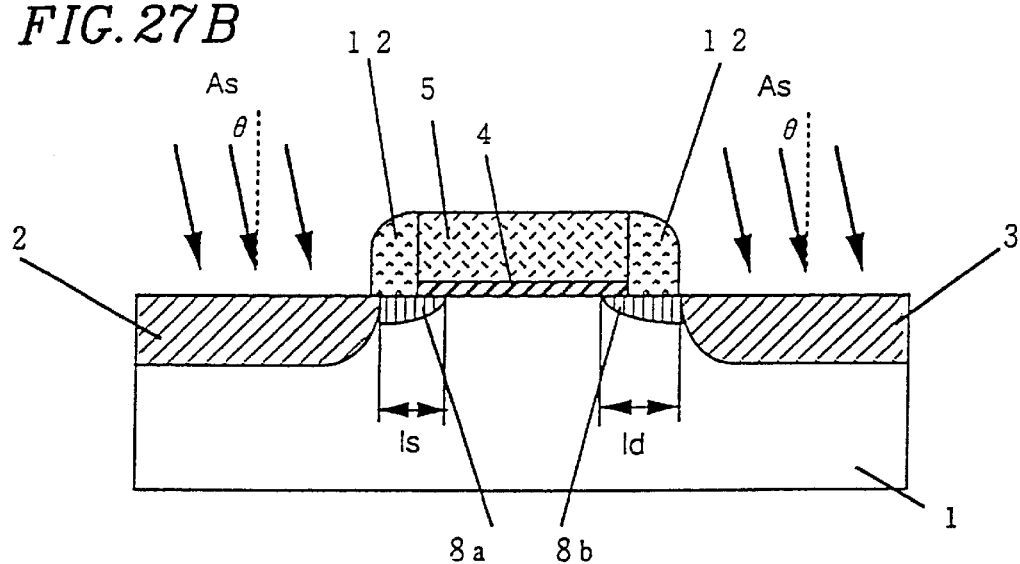
Figure 27C:
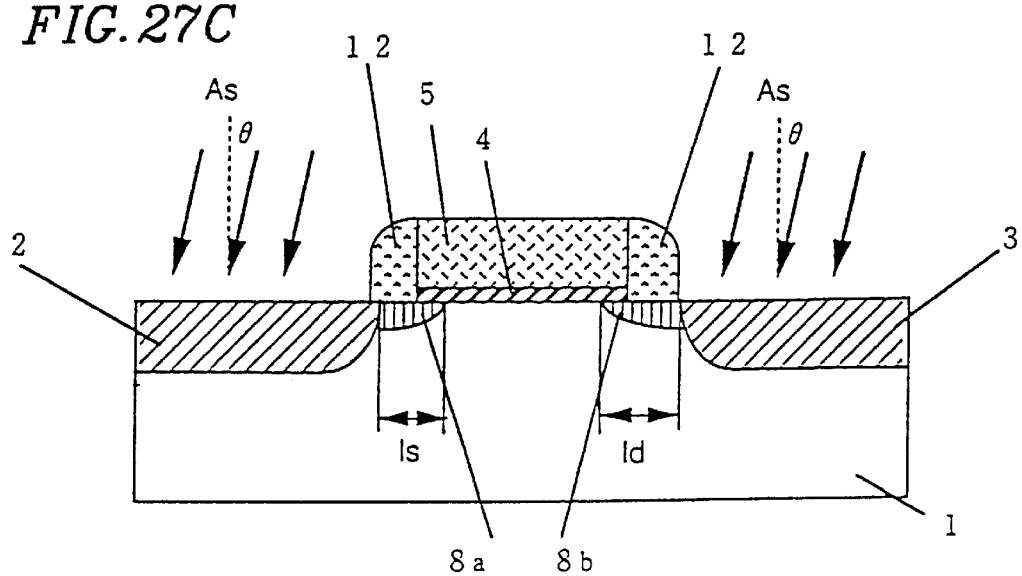

FIGS. 27A to 27C are cross-sectional views showing the respective process steps for fabricating a semiconductor device according to an eighteenth example of the present invention.

First, as shown in FIG. 27A, a gate oxide film 4 is formed on a principal surface of a (p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5. Thereafter, impurity ions of a second conductivity type (n-type), e.g., arsenic ions, are implanted while using the gate electrode 5 as a mask, applying an implantation energy of 10 KeV, and setting the implant dose at approximately $1 \times 10^{14}$ cm$^{-2}$, thereby forming second n-type source/drain diffusion layers 8a and 8b. Next, as shown in FIG. 27B, after side wall oxide films are deposited so as to be about 80 nm thick, the oxide films are partially removed by anisotropic dry etching so that the oxide films are left only on the sides of the gate electrode 5, thereby forming gate side walls 12. Then, impurity ions of a second conductivity type, e.g., arsenic ions, are implanted from the source side while using the gate electrode 5 and the gate side walls 12 as a mask, applying an implantation energy of 40 KeV and setting the implant dose at approximately $4 \times 10^{15}$ cm$^{-2}$ and the implantation angle at seven degrees or more. Subsequently, as shown in FIG. 27C, impurity ions of a second conductivity type, e.g., arsenic ions, are implanted from the drain side while using the gate electrode 5 and the gate side walls 12 as a mask, applying an implantation energy of 40 KeV and setting the implant dose at approximately $2 \times 10^{15}$ cm$^{-2}$ and the implantation angle θ at seven degrees or more. By performing these ion implantation process steps, the first n-type source/drain diffusion layers 2 and 3 are formed.

The fabrication method of this example is characterized in that the first n-type source/drain diffusion layers 2 and 3 are formed by implanting the impurity ions of a second conductivity type, e.g., arsenic ions from the source side while using the gate electrode 5 and the gate side walls 12 as a mask, applying an implantation energy of 40 KeV and setting the implant dose at approximately $4 \times 10^{15}$ cm$^{-2}$ and the implantation angle at seven degrees or more, and subsequently implanting the impurity ions of a second conductivity type, e.g., arsenic ions from the drain side while using the gate electrode 5 and the gate side walls 12 as a mask, applying an implantation energy of 40 KeV and setting the implant dose to be lower than the implant dose from the source side, i.e., approximately $2 \times 10^{15}$ cm$^{-2}$ and the implantation angle at seven degrees or more. Since the implant dose from the source side is larger than the implant dose from the drain side, the overlapping length between the first n-type source diffusion layer 2 and the gate side wall 12 is longer than the overlapping length between the first n-type drain diffusion layer 3 and the gate side wall 12. As a result, the length 1s of the second n-type source diffusion layer 8a becomes shorter than the length 1d of the second n-type drain diffusion layer 8b. In this case, the lengths 1s and 1d can be independently controlled by setting the implant dose from the source side and the implant dose from the drain side at different values. According to currently available semiconductor fabrication technologies, it is easy to set the implant doses at different values during ion implantation processes. Therefore, even if the implant doses are set at different values, the fabrication process is not complicated and fabrication costs and time are not increased.

It is noted that the ion implantation process steps for forming the first n-type source/drain diffusion layers 2 and 3 can be performed in the reverse order. That is to say, ion implantation from the source side can be performed after ion implantation from the drain side.

Also, different implantation angles can be used so long as the length 1s of the second n-type source diffusion layer 8a becomes shorter than the length 1d of the second n-type drain diffusion layer 8b.

EXAMPLE 19

Figure 28A:
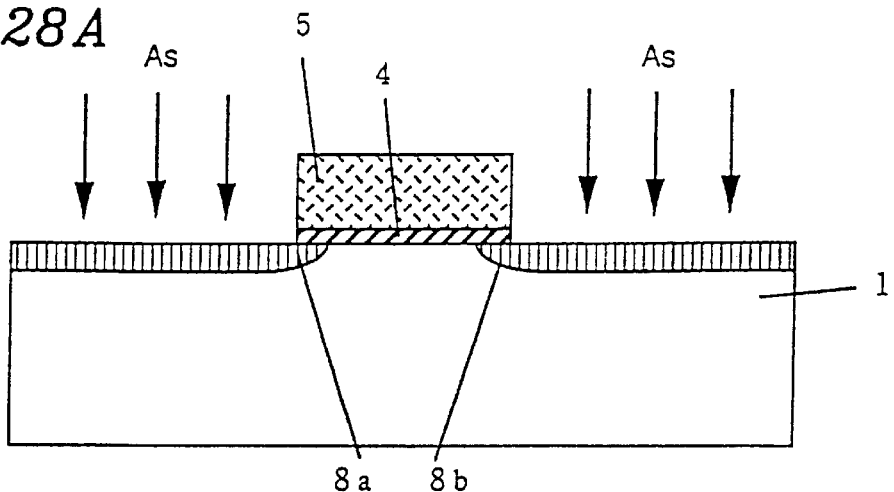
FIGS. 28A to 28C are cross-sectional views showing respective process steps for fabricating a semiconductor device according to a nineteenth example of the present invention.
Figure 28B:
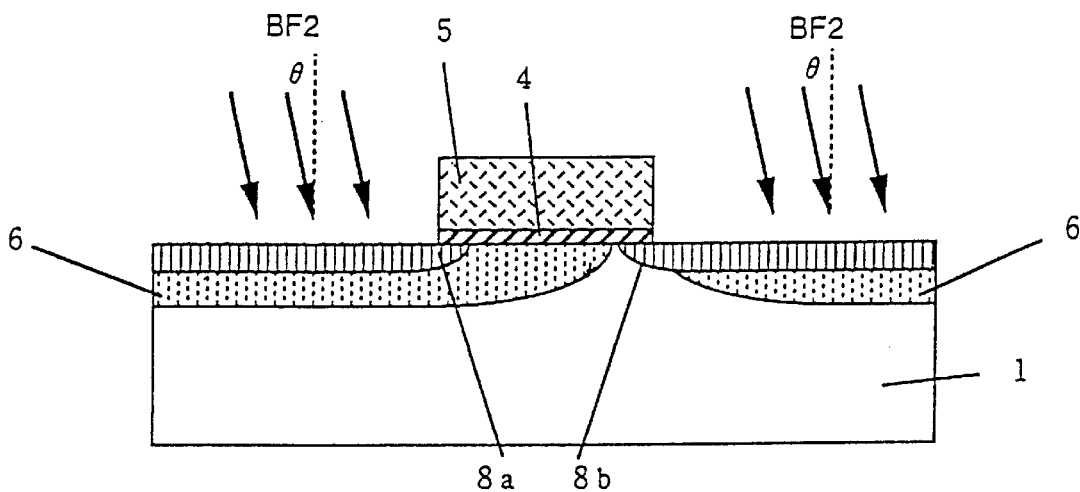
Figure 28C:
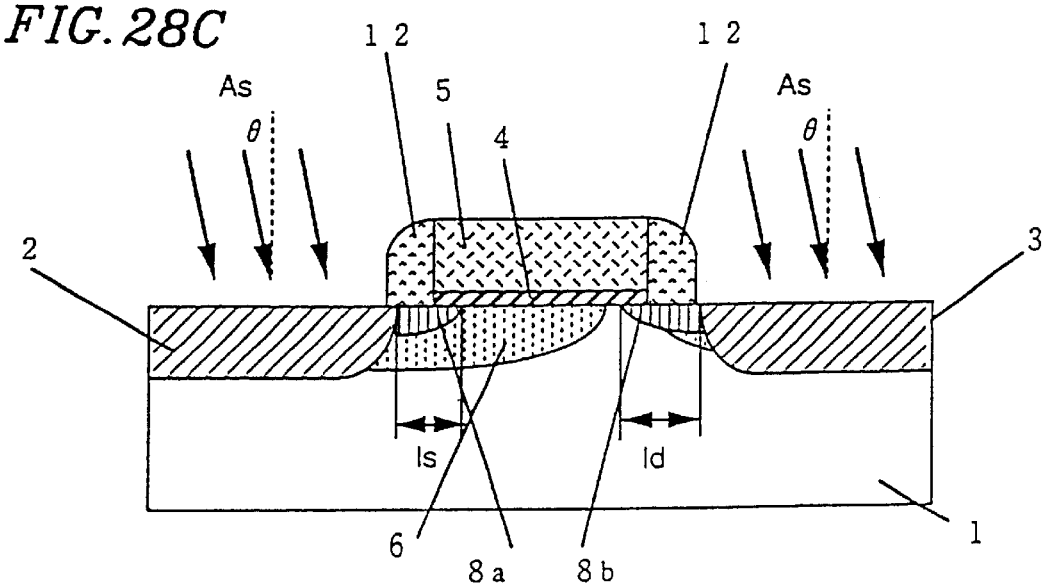

FIGS. 28A to 28C are cross-sectional views showing the respective process steps for fabricating a semiconductor device according to a nineteenth example of the present invention.

First, as shown in FIG. 28A, a gate oxide film 4 is formed on a principal surface of a (p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5. In this example, the thickness of the gate oxide film 4 is 4 nm and the gate length of the gate electrode 5 is 0.15 μm. Thereafter, impurity ions of a second conductivity type (n-type), e.g., arsenic ions, are implanted while using the gate electrode 5 as a mask, applying an implantation energy of 10 KeV, and setting the implant dose at approximately $1 \times 10^{14}$ cm$^{-2}$, thereby forming second n-type source/drain diffusion layers 8a and 8b. Next, as shown in FIG. 28B, impurity ions of a first conductivity type (p-type), e.g., $BF_2$ ions, are implanted from the source side while using the gate electrode 5 as a mask, applying an implantation energy of 80 KeV, and setting the implant dose at approximately $1 \times 10^{13}$ cm$^{-2}$ and the implantation angle θ at seven degrees or more, thereby forming p-type impurity diffusion layers 6. Then, as shown in FIG. 28C, after side wall oxide films are deposited so as to be about 80 nm thick, the oxide films are partially removed by anisotropic dry etching so that the oxide films are left only on the sides of the gate electrode 5, thereby forming gate side walls 12. Then, impurity ions of a second conductivity type, e.g., arsenic ions, are implanted from the source side while using the gate electrode 5 and the gate side walls 12 as a mask, applying an implantation energy of 40 KeV and setting the implant dose at approximately $6 \times 10^{15}$ cm$^{-2}$ and the implantation angle θ at seven degrees or more. By performing this ion implantation process step, the first n-type source/drain diffusion layers 2 and 3 are formed.

The fabrication method of this example is characterized in that the p-type impurity diffusion layers 6 are formed by implanting the impurity ions of a first conductivity type (p-type), e.g., $BF_2$ ions, from the source side while using the gate electrode 5 as a mask, applying an implantation energy of 80 KeV, and setting the implant dose at approximately $1 \times 10^{13}$ cm$^{-2}$ and the implantation angle at seven degrees or more, after the gate electrode 5 is formed. By implanting the impurity ions from the source side at an angle of seven degrees or more while using the gate electrode 5 as a mask, the impurity concentration profile of the p-type impurity diffusion layers 6 in the channel becomes nonuniform along the channel length direction so that the concentration is higher on the source side and lower on the drain side. Under the fabrication conditions of this example, the impurity concentration profile of the p-type impurity diffusion layers 6 in the channel is substantially equal to the concentration profile shown in FIG. 16. Specifically, the concentration on the source side is approximately $3\times10^{17}$ cm$^{-3}$ and the concentration on the drain side is approximately $1\times10^{16}$ cm$^{-3}$. As described in the third example, in a MOS type semiconductor device having such an impurity profile, the electrostatic potential on the source side becomes higher, so that the electric field and the speed of the electrons are increased. In a MOS type semiconductor device formed in a region having a size on the order of a quarter micron or less, in particular, the speed of the electrons exceeds $1\times10^7$ cm/s and a speed overshoot is caused. As a result, as compared with a conventional MOS type semiconductor device, the current value and drivability thereof are considerably improved.

The fabrication method of this example is also characterized in that the first n-type source/drain diffusion layers 2 and 3 are formed by implanting the impurity ions of a second conductivity type, e.g., arsenic ions from the source side while using the gate electrode 5 and the gate side walls 12 as a mask, applying an implantation energy of 40 KeV and setting the implant dose at approximately $6\times10^{15}$ cm$^{-2}$ and the implantation angle at seven degrees or more. By performing this process step, not only the first n-type source/drain diffusion layers 2 and 3 but also the second n-type source/drain diffusion layers 8a and 8b are formed so that the length 1s of the second n-type source diffusion layer 8a as shown in FIG. 28C is shorter than the length 1d of the second n-type drain diffusion layer 8b. In this case, the length 1s of the second n-type source diffusion layer 8a is controlled by the film thickness Ls of the gate side wall 12 and the implantation angle, while the length 1d of the second n-type drain diffusion layer 8b is controlled by the film thickness Ls of the gate side wall 12, the height of the gate electrode 5 and the implantation angle. In this example, the length 1s of the second n-type source diffusion layer 8a is shorter than the film thickness Ls of the gate side wall 12, i.e., 50 nm, and the length 2d of the second n-type drain diffusion layer 8b is equal to the sum of the film thickness Ls of the gate side wall 12 and tan (7°) of the height (250 nm) of the gate electrode 5, i.e., 80+30=110 nm. On the other hand, in the case of forming the first n-type source/drain diffusion layers 2 and 3 by vertically implanting the ions, the length 1s of the second n-type source diffusion layer 8a becomes substantially equal to the film thickness Ls of the gate side wall 12, i.e., 80 nm. Therefore, the parasitic resistance of the second n-type source diffusion layer 8a of this example is reduced to ⅝ of the parasitic resistance of the second n-type source diffusion layer formed by vertical ion implantation. In a MOS type semiconductor device formed in a region having a size on the order of a quarter micron or less, the parasitic resistance in the source diffusion layer causes the -decrease in the current value and drivability. In the case where p-type high-concentration impurity diffusion layers 6 are formed on the source side as in this example, in particular, the parasitic resistance in the source diffusion layer is increased. Therefore, since the parasitic resistance is reduced in the second n-type source diffusion layer 8a in this example, the current value and drivability of a MOS type semiconductor device formed in a region having a size of a quarter micron or less can be considerably improved.

It is noted that the ion implantation process step of forming the second n-type source/drain diffusion layers 8a and 8b and the ion implantation process step of forming the p-type impurity diffusion layers 6 can be performed in the reverse order.

EXAMPLE 20

Figure 29A:
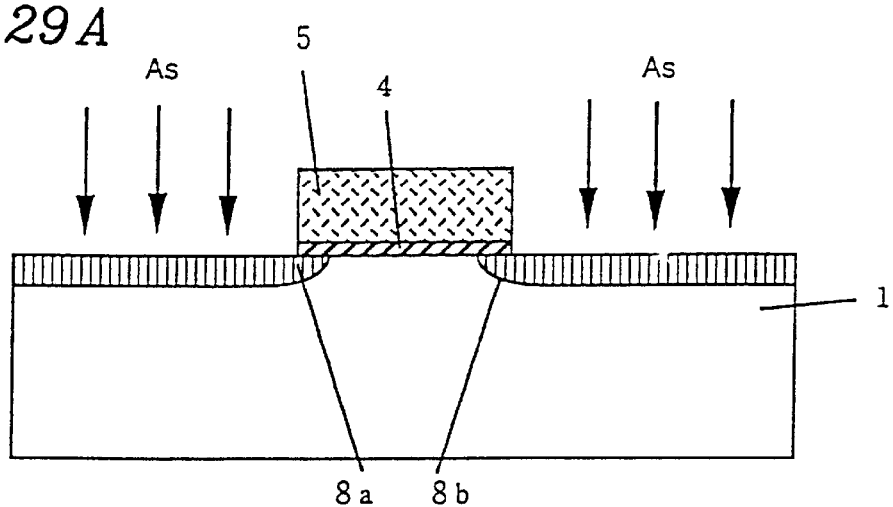
FIGS. 29A to 29C are cross-sectional views showing respective process steps for fabricating a semiconductor device according to a twentieth example of the present invention.
Figure 29B:
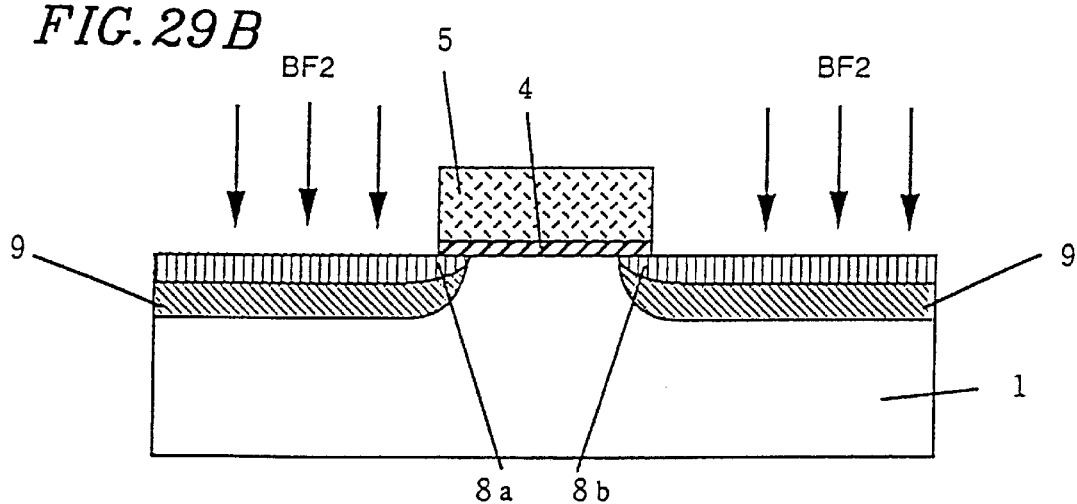
Figure 29C:
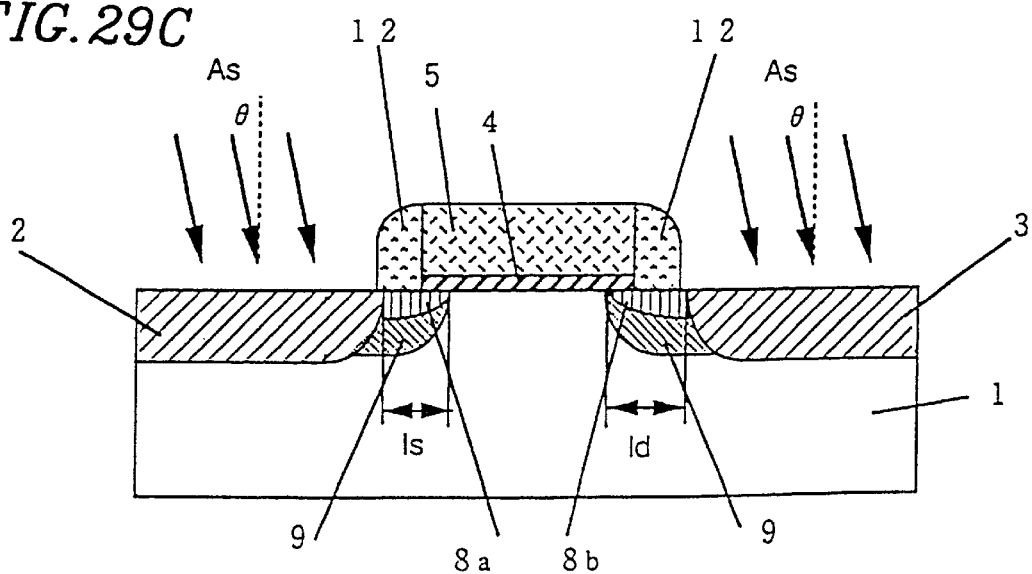

FIGS. 29A to 29C are cross-sectional views showing the respective process steps for fabricating a semiconductor device according to a twentieth example of the present invention.

First, as shown in FIG. 29A, a gate oxide film 4 is formed on a principal surface of a (p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5. In this example, the thickness of the gate oxide film 4 is 4 nm and the gate length of the gate electrode 5 is 0.15 μm. Thereafter, impurity ions of a second conductivity type (n-type), e.g., arsenic ions, are implanted while using the gate electrode 5 as a mask, applying an implantation energy of 10 KeV, and setting the implant dose at approximately $1\times10^{14}$ cm$^{-2}$, thereby forming second n-type source/drain diffusion layers 8a and 8b.

Next, as shown in FIG. 29B, impurity ions of a first conductivity type (p-type), e.g., BF$_2$ ions, are implanted while using the gate electrode 5 as a mask, applying an implantation energy of 80 KeV, and setting the implant dose at approximately $1\times10^{14}$ cm$^{-2}$ thereby forming p-type high-concentration diffusion layers 9 under the second n-type source/drain diffusion layers 8a and 8b.

Then, as shown in FIG. 29C, after oxide films are deposited so as to be about 80 nm thick, the oxide films are partially removed by anisotropic dry etching so that the oxide films are left only on the sides of the gate electrode 5, thereby forming gate side walls 12. Then, impurity ions of a second conductivity type, e.g., arsenic ions, are implanted from the source side while using the gate electrode 5 and the gate side walls 12 as a mask, applying an Implantation energy of 40 KeV and setting the implant dose at approximately $6\times10^{15}$ cm$^{-2}$ and the implantation angle θ at seven degrees or more. By performing this ion implantation process step, the first n-type source/drain diffusion layers 2 and 3 are formed.

The fabrication method of this example is characterized in that the p-type high-concentration diffusion layers 9 are formed under the second n-type source/drain diffusion layers 8a and 8b by implanting the impurity ions of a first conductivity type (p-type), e.g., BF$_2$ ions, while using the gate electrode 5 as a mask, applying an implantation energy of 80 KeV, and setting the implant dose at approximately $1\times10^{13}$ cm$^{-2}$, after the gate electrode 5 is formed. In the case of forming the p-type high-concentration diffusion layers 9 under the process conditions of this example, the peak concentration of the p-type high-concentration diffusion layers 9 becomes $1\times10^{18}$ cm$^{-3}$ or more. In a MOS type semiconductor device formed in a region having a size of a quarter micron or less, the decrease in the threshold potential caused by the short-channel effect is a serious problem. However, in this example, since the p-type high-concentration diffusion layers 9 having a concentration of $1\times10^{15}$ cm$^{-3}$ or more are formed under the second n-type source/drain diffusion layers 8a and 8b, the extension of the electrostatic potential curve from the source/drain diffusion layers 2 and 3 in the channel direction can be suppressed and the decrease in the threshold potential caused by the short-channel effect can be effectively suppressed. In addition, since the p-type ions are not diffused into the channel region between the second n-type source/drain diffusion layers 8a and 8b, the drivability of the semiconductor device is not decreased.

The fabrication method of this example is also characterized in that the first n-type source/drain diffusion layers 2 and 3 are formed by implanting the impurity ions of a second conductivity type, e.g., arsenic ions from the source side while using the gate electrode 5 and the gate side walls 12 as a mask, applying an implantation energy of 40 KeV and setting the implant dose at approximately $6 \times 10^{15}$ cm$^{-2}$ and the implantation angle at seven degrees or more. By performing this process step, not only the first n-type source/drain diffusion layers 2 and 3 but also the second n-type source/drain diffusion layers 8a and 8b are formed so that the length 1s of the second n-type source diffusion layer 8a as shown in FIG. 29C is shorter than the length 1d of the second n-type drain diffusion layer 8b. In this case, the length 1s of the second n-type source diffusion layer 8a is controlled by the film thickness Ls of the gate side wall 12 and the implantation angle, while the length 1d of the second n-type drain diffusion layer 8b is controlled by the film thickness Ls of the gate side wall 12, the height of the gate electrode 5 and the implantation angle. In this example, the length 1s of the second n-type source diffusion layer 8a is shorter than the film thickness Ls of the gate side wall 12, i.e., 50 nm, and the length 1d of the second n-type drain diffusion layer 8b is equal to the sum of the film thickness Ls of the gate side wall 12 and tan (7°) of the height (250 nm) of the gate electrode 5, i.e., 80+30=110 nm. On the other hand, in the case of forming the first n-type source/drain diffusion layers 2 and 3 by vertically implanting the ions, the length 1s of the second n-type source diffusion layer 8a becomes substantially equal to the film thickness Ls of the gate side wall 12, i.e., 80 nm. Therefore, the parasitic resistance of the second n-type source diffusion layer 8a of this example is reduced to ⅝ of the parasitic resistance of the second n-type source diffusion layer formed by vertical ion implantation. In a MOS type semiconductor device formed in a region having a size on the order of a quarter micron or less, the parasitic resistance in the source diffusion layer causes the decrease in the current value and drivability. In the case where p-type high-concentration diffusion layers 9 are formed under the second n-type source/drain diffusion layers 8a and 8b as in this example, in particular, the parasitic resistance in the source/drain diffusion layers is increased. Therefore, since the parasitic resistance is reduced in the second n-type source diffusion layer 8a in this example, the current value and the drivability of a MOS type semiconductor device formed in a region having a size of a quarter micron or less can be considerably improved.

It is noted that the ion implantation process step of forming the second n-type source/drain diffusion layers 8a and 8b and the ion implantation process step of forming the p-type high-concentration diffusion layers 9 can be performed in the reverse order.

EXAMPLE 21

Figure 30A:
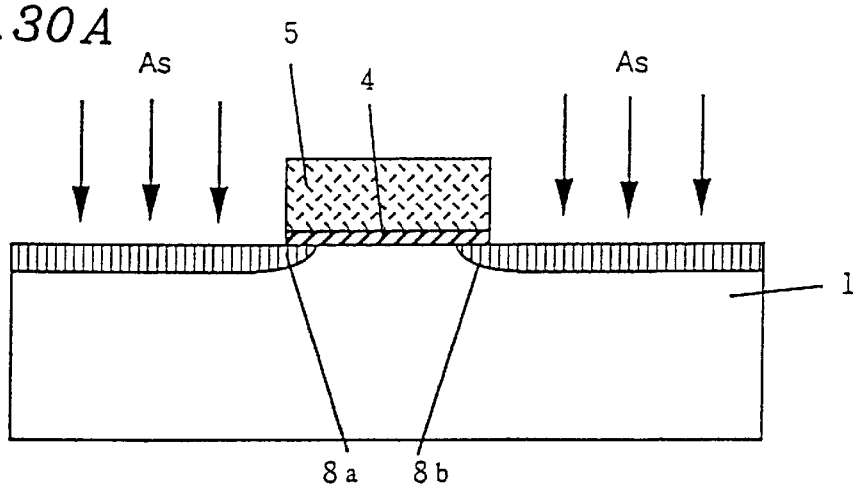
FIGS. 30A to 30C are cross-sectional views showing respective process steps for fabricating a semiconductor device according to a twenty-first example of the present invention.
Figure 30B:
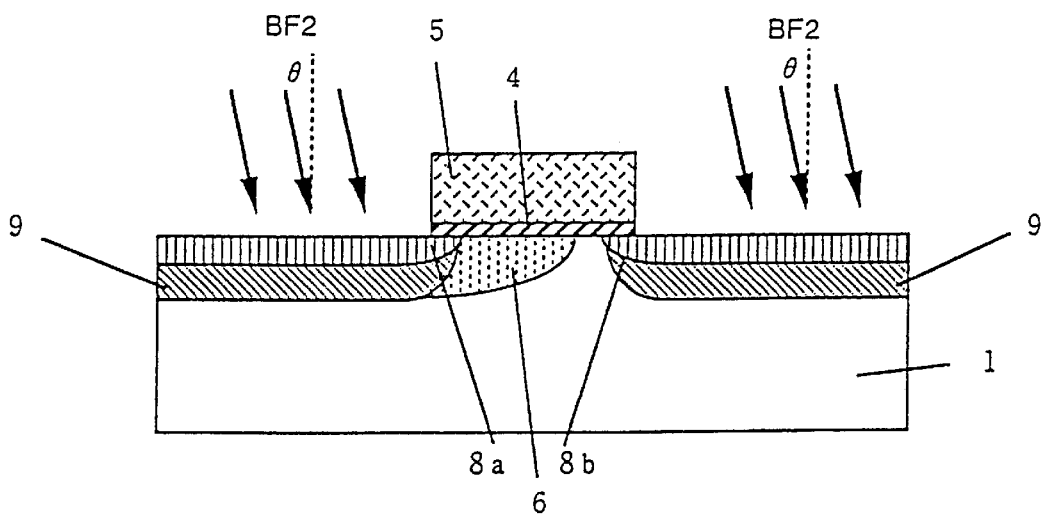
Figure 30C:
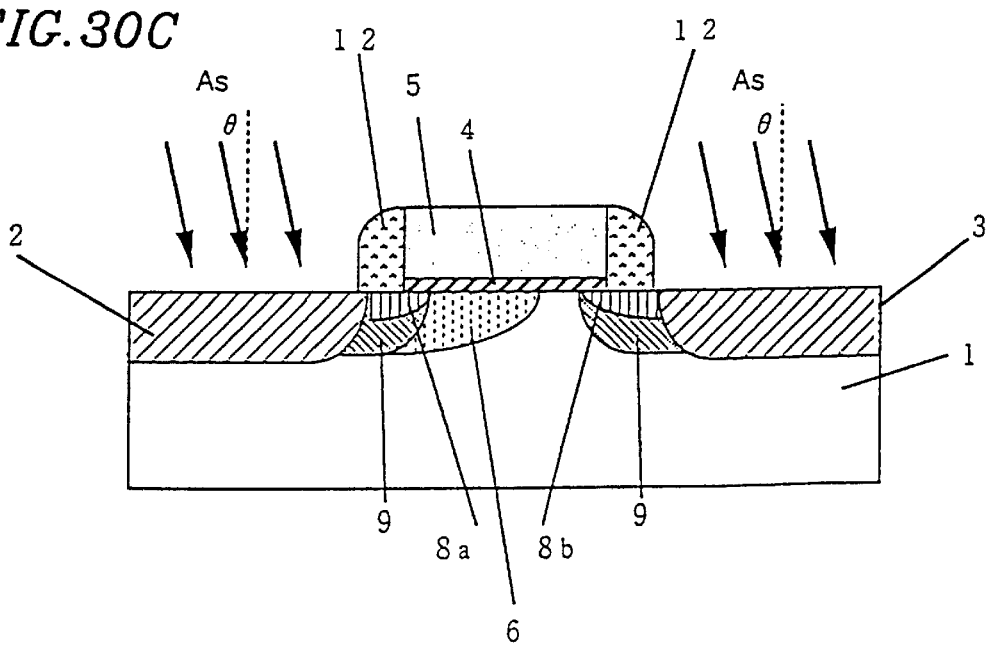

FIGS. 30A to 30C are cross-sectional views showing the respective process steps for fabricating a semiconductor device according to a twenty-first example of the present invention.

First, as shown in FIG. 30A, a gate oxide film 4 is formed on a principal surface of a (p-type) semiconductor substrate 1 and a conductive film to be used as a gate electrode 5 is deposited thereon, thereby forming a multi-layered film. Then, a predetermined portion of the multi-layered film is selectively etched by photolithography and anisotropic etching until the gate oxide film 4 is exposed, thereby forming a gate electrode 5. In this example, the thickness of the gate oxide film 4 is 4 nm, the conductive film to be used as the gate electrode 5 is made of polycrystalline silicon, and the gate length of the gate electrode 5 is 0.15 µm. Thereafter, impurity ions of a second conductivity type (n-type), e.g., arsenic ions, are implanted while using the gate electrode 5 as a mask, applying an implantation energy of 10 KeV, and setting the implant dose at approximately $1 \times 10^{14}$ cm$^{-2}$, thereby forming second n-type source/drain diffusion layers 8a and 8b. Next, as shown in FIG. 30B, impurity ions of a first conductivity type (p-type), e.g., BF$_2$ ions, are implanted from the source side while using the gate electrode 5 as a mask, applying an implantation energy of 80 KeV, and setting the implant dose at approximately $1 \times 10^{13}$ cm$^{-2}$ and the implantation angle θ at seven degrees or more, thereby forming p-type impurity diffusion layers 6 and p-type high-concentration diffusion layers 9 under the second n-type source/drain diffusion layers 8a and 8b. Then, as shown in FIG. 30C, after side wall oxide films are deposited so as to be about 80 nm thick, the oxide films are partially removed by anisotropic dry etching so that the oxide films are left only on the sides of the gate electrode 5, thereby forming gate side walls 12. Then, impurity ions of a second conductivity type, e.g., arsenic ions, are implanted from the source side while using the gate electrode 5 and the gate side walls 12 as a mask, applying an implantation energy of 40 KeV and setting the implant dose at approximately $6 \times 10^{15}$ cm$^{-2}$ and the implantation angle at seven degrees or more. By performing this ion implantation process step, the first n-type source/drain diffusion layers 2 and 3 are formed.

The fabrication method of this example is characterized in that the p-type impurity diffusion layers 6 are formed by implanting the impurity ions of a first conductivity type (p-type), e.g., BF$_2$ ions, from the source side while using the gate electrode 5 as a mask, applying an implantation energy of 80 KeV, and setting the implant dose at approximately $1 \times 10^{13}$ cm$^{-2}$ and the implantation angle at seven degrees or more, after the gate electrode 5 is formed. By implanting the impurity ions from the source side at an angle of seven degrees or more while using the gate electrode 5 as a mask, the impurity concentration profile of the p-type impurity diffusion layers 6 in the channel becomes nonuniform along the channel length direction so that the concentration is higher on the source side and lower on the drain side. Under the fabrication conditions of this example, the impurity concentration profile of the p-type impurity diffusion layer 6 in the channel is substantially equal to the concentration profile shown in FIG. 16. Specifically, the concentration on the source side is approximately $3 \times 10^{17}$ cm$^{-3}$ and the concentration on the drain side is approximately $1 \times 10^{16}$ cm$^{-3}$. As described in the third example, in a MOS type semiconductor device having such an impurity profile, the electrostatic potential on the source side becomes higher, so that the electric field and the speed of the electrons are increased. In a MOS type semiconductor device formed in a region having a size on the order of a quarter micron or less, in particular, the speed of the electrons exceeds $1 \times 10^7$ cm/s and a speed overshoot is caused. As a result, as compared with a conventional MOS type semiconductor device, the current value and drivability thereof are considerably improved.

In addition, by performing the ion implantation process step, not only the p-type impurity diffusion layers 6 but also the p-type high-concentration diffusion layers 9 are formed under the second n-type source/drain diffusion layers 8a and 8b. As shown in the two-dimensional cross-sectional view showing the impurity concentration profile in FIG. 15, in the case of forming the p-type high-concentration diffusion layers 9 under the process conditions of this example, the peak concentration of the p-type high-concentration diffusion layers 9 becomes $1\times10^{16}$ cm$^{-3}$ or more. In a MOS type semiconductor device formed in a region having a size of a quarter micron or less, the decrease in the threshold potential caused by the short-channel effect is a serious problem. However, in this example, since the p-type high-concentration diffusion layers 9 having a concentration of $1\times10^{16}$ cm$^{-3}$ or more are formed under the second n-type source/drain diffusion layers 8a and 8b, the extension of the electrostatic potential curve from the source/drain diffusion layers 2 and 3 in the channel direction can be suppressed and the decrease in the threshold potential caused by the short-channel effect can be effectively prevented.

The fabrication method of this example is also characterized in that the first n-type source/drain diffusion layers 2 and 3 are formed by implanting the impurity ions of a second conductivity type, e.g., arsenic ions, from the source side while using the gate electrode 5 and the gate side walls 12 as a mask, applying an implantation energy of 40 KeV and setting the implant dose at approximately $6\times10^{15}$ cm$^{-2}$ and the implantation angle at seven degrees or more. By performing this process step, not only the first n-type source/drain diffusion layers 2 and 3 but also the second n-type source/drain diffusion layers 8a and 8b are formed so that the length 1s of the second n-type source diffusion layer 8a is shorter than the length 1d of the second n-type drain diffusion layer 8b. In this case, the length 1s of the second n-type source diffusion layer 8a is controlled by the film thickness Ls of the gate side wall 12 and the implantation angle, while the length 1d of the second n-type drain diffusion layer 8b is controlled by the film thickness Ls of the gate side wall 12, the height of the gate electrode 5 and the implantation angle. In this example, the length 1s of the second n-type source diffusion layer 8a is shorter than the film thickness Ls of the gate side wall 12, i.e., 50 nm, and the length 1d of the second n-type drain diffusion layer 8b is equal to the sum of the film thickness Ls of the gate side wall 12 and tan (7°) of the height (250 nm) of the gate electrode 5, i.e., 80+30=110 nm. On the other hand, in the case of forming the first n-type source/drain diffusion layers 2 and 3 by vertically implanting the ions, the length Is of the second n-type source diffusion layer 8a becomes substantially equal to the film thickness Ls of the gate side wall 12, i.e., 80 nm. Therefore, the parasitic resistance of the second n-type source diffusion layer 8a of this example is reduced to ⅝ of the parasitic resistance of the second n-type source diffusion layer formed by vertical ion implantation. In a MOS type semiconductor device formed in a region having a size on the order of a quarter micron or less, the parasitic resistance in the source diffusion layer causes the decrease in the current value and drivability. In the case where p-type high-concentration impurity diffusion layers 9 are formed under the second n-type source/drain diffusion layers 8a and 8b as in this example, in particular, the parasitic resistance in the source/drain diffusion layers is increased. Therefore, since the parasitic resistance is reduced in the second n-type source diffusion layer 8a in this example, the current value and the drivability of a MOS type semiconductor device formed in a region having a size of a quarter micron or less can be considerably improved.

It is noted that the ion implantation process step of forming the second n-type source/drain diffusion layers 8a and 8b and the ion implantation process step of forming the p-type high-concentration diffusion layers 9 can be performed in the reverse order.

EXAMPLE 22

Figure 31:
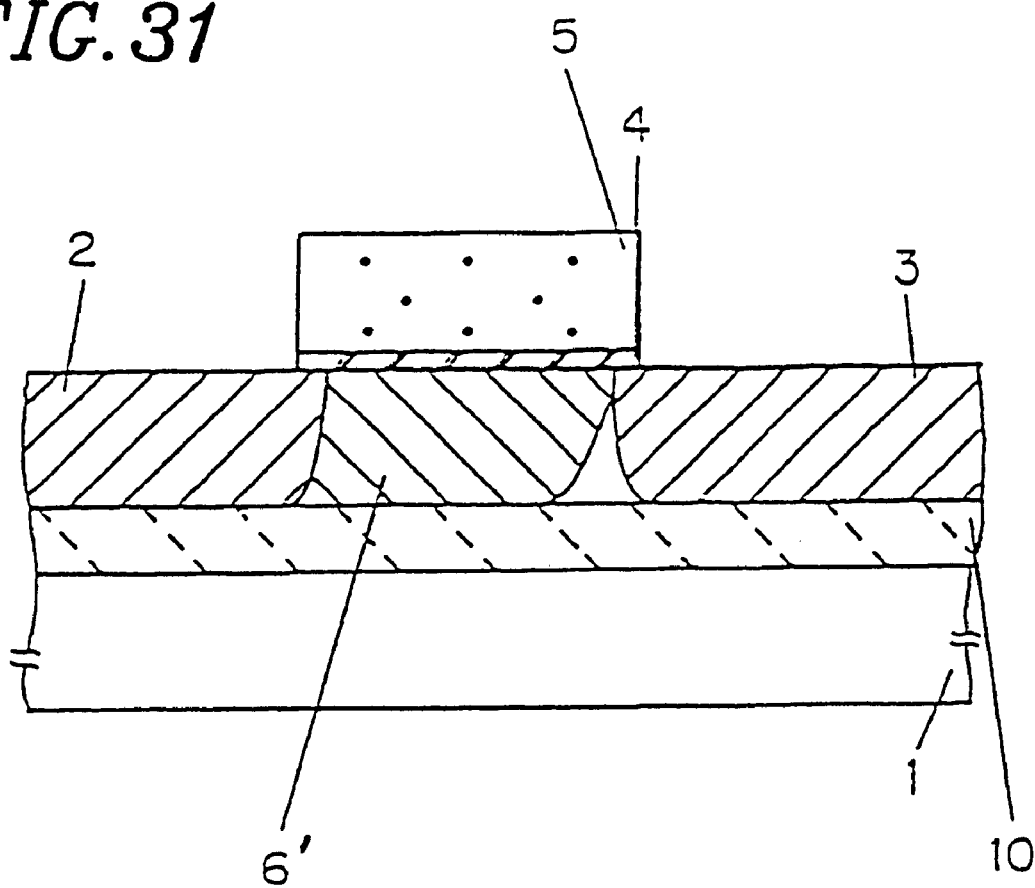
FIG. 31 is a cross-sectional view showing a semiconductor device according to a twenty-second example of the present invention.

FIG. 31 is a cross-sectional view showing a semiconductor device according to a twenty-second example of the present invention. The semiconductor device includes: an insulating film 10 formed on a principal surface of a semiconductor substrate 1 of a first conductivity type; an epitaxial semiconductor layer of the first conductivity type formed on the insulating film 10; a high-concentration source diffusion layer 2 of a second conductivity type formed on a principal surface of the epitaxial semiconductor layer; a high-concentration drain diffusion layer 3 of a second conductivity type formed on a principal surface of the epi-substrate 1 so as to be separated from the source diffusion layer by a predetermined distance; a gate electrode formed on a principal surface between the source diffusion layer 2 and the drain diffusion layer 3 via a gate oxide film; a channel region which is formed in the epitaxial semiconductor layer and is located between the source diffusion layer 2 and the drain diffusion layer 3; and a diffusion layer 6 of a first conductivity type which is formed in the channel region and has a nonuniform concentration profile along the channel length direction so that the impurity concentration on the source side is higher than the impurity concentration on the drain side. The semiconductor device is characterized in that the lower portion of the source diffusion layer 2 and that of the drain diffusion layer 3 reach the insulating film 10. Therefore, the junction capacitance between the source diffusion layer and the substrate and the junction capacitance between the drain diffusion layer and the substrate are small. Accordingly, a high-speed semiconductor device can be obtained.

In the foregoing first to twenty-second examples, the present invention has been described as being applied to an n-channel type MOS semiconductor device. However, the present invention is not limited thereto, but is also applicable to a p-channel type MOS semiconductor device. In addition, the present invention has been described as being applied to a MOS type semiconductor device having a gate oxide film. However, the gate oxide film can be replaced with a gate insulating film. Therefore, a "MOS type" semiconductor device in the description includes not only a metal-oxide-semiconductor transistor but also a metal-insulator-semiconductor transistor.

INDUSTRIAL APPLICABILITY

According to the present invention, a highly reliable high-performance semiconductor device which can be operated at a high speed with low power consumption, can suppress a short-channel effect, and is highly resistant to degradations caused by a hot-carrier effect is provided so as to satisfy various demands in VLSI technologies for forming a device in a region having a size on the order of a quarter micron or less. In addition, a method for fabricating a semiconductor device according to the present invention is a method allowing for an efficient and highly precise fabrication of a semiconductor device of the above-described type, and therefore has high industrial value.

What is claimed is:
1. A MOS type semiconductor device comprising:
    a semiconductor substrate of a first conductivity type;
    a first source diffusion layer of a second conductivity type formed in a principal surface region of the semiconductor substrate;

a first drain diffusion layer of the second conductivity type formed in the principal surface region of the semiconductor substrate so as to be distant from the first source diffusion layer;

a channel region formed in the semiconductor substrate so as to be located between the first source diffusion layer and the first drain diffusion layer;

a gate insulating film provided on the channel region;

a gate electrode provided on the gate insulating film; and a single impurity diffusion layer of the first conductivity type which is formed along substantially the whole channel region, and has a nonuniform impurity concentration profile along a channel length direction, an impurity concentration in a region of the impurity diffusion layer which is adjacent to the first source diffusion layer being higher than an impurity concentration in a region of the impurity diffusion layer which is closer to the first drain diffusion layer;

wherein an impurity concentration of the semiconductor substrate just under the first source diffusion layer is lower than an impurity concentration on a source side of the impurity diffusion layer of the first conductivity type.

2. A MOS type semiconductor device according to claim 1, wherein the impurity diffusion layer of the first conductivity type comprises a surface diffusion layer of the first conductivity type provided in a surface region of the channel region.

3. A MOS type semiconductor device according to claim 1, wherein the single impurity diffusion layer is in contact with the first drain diffusion layer.

4. A MOS type semiconductor device according to claim 2, wherein the single impurity diffusion layer is in contact with the first drain diffusion layer.

5. A MOS type semiconductor device comprising:

a semiconductor layer of a first conductivity type;

a substrate for supporting the semiconductor layer;

a source diffusion layer of a second conductivity type formed in a principal surface region of the semiconductor layer;

a drain diffusion layer of the second conductivity type formed in the principal surface region of the semiconductor layer so as to be distant from the source diffusion layer;

a channel region formed in the semiconductor layer so as to be located between the source diffusion layer and the drain diffusion layer;

a gate insulating film provided on the channel region;

a gate electrode provided on the gate insulating film; and a single impurity diffusion layer of the first conductivity type which is formed along substantially the whole channel region, and has a nonuniform impurity concentration profile along a channel length direction, an impurity concentration in a portion of the impurity diffusion layer which is adjacent to the source diffusion layer being higher than an impurity concentration in a portion of the impurity diffusion layer which is adjacent to the drain diffusion layer;

wherein an impurity concentration of the semiconductor layer just under the source diffusion layer is lower than an impurity concentration on a source side of the impurity diffusion layer of the first conductivity type.

6. A MOS type semiconductor device according to claim 5, wherein the single impurity diffusion layer is in contact with the drain diffusion layer.

* * * * *

UNITED STATES PATENT AND TRADEMARK OFFICE
CERTIFICATE OF CORRECTION

PATENT NO. : 6,355,963 B1
DATED : March 12, 2002
INVENTOR(S) : Hiroki et al.

It is certified that error appears in the above-identified patent and that said Letters Patent is hereby corrected as shown below:

<u>Title page,</u>
Item [63], Related U.S. Application Data should read: -- Continuation of application No. 08/836,903, filed on July 16, 1997 as application No. PCT/JP95/02329 filed on November 15, 1995 --.
Item [56], FOREIGN PATENT DOCUMENTS, please delete references:

"JP   5-90486A    4/1993"
"JP   9-121002A   5/1997"

Item [56], OTHER PUBLICATIONS, please delete "T. Matsuki et al., "Laterally-Doped Channel (LDC) Structure for Sub-Quarter Micron MOSFET"" Symposium on VLSI Technology, pp. 113-144, 1991."

Signed and Sealed this

Fourth Day of February, 2003

JAMES E. ROGAN
*Director of the United States Patent and Trademark Office*